United States Patent
Suematsu et al.

(10) Patent No.: US 10,675,842 B2
(45) Date of Patent: Jun. 9, 2020

(54) TRANSPARENT ELECTRODE AND ORGANIC ELECTRONIC DEVICE INCLUDING THE SAME

(71) Applicant: Konica Minolta, Inc., Tokyo (JP)

(72) Inventors: Takatoshi Suematsu, Tokyo (JP); Kazuaki Nakamura, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 16/076,748

(22) PCT Filed: Sep. 7, 2016

(86) PCT No.: PCT/JP2016/076328
§ 371 (c)(1),
(2) Date: Aug. 9, 2018

(87) PCT Pub. No.: WO2017/145417
PCT Pub. Date: Aug. 31, 2017

(65) Prior Publication Data
US 2019/0047258 A1 Feb. 14, 2019

(30) Foreign Application Priority Data
Feb. 26, 2016 (JP) .................................. 2016-035831

(51) Int. Cl.
*B32B 15/08* (2006.01)
*B32B 27/30* (2006.01)
(Continued)

(52) U.S. Cl.
CPC .............. *B32B 15/08* (2013.01); *B32B 27/20* (2013.01); *B32B 27/30* (2013.01); *C08K 3/22* (2013.01);
(Continued)

(58) Field of Classification Search
None
See application file for complete search history.

(56) References Cited

U.S. PATENT DOCUMENTS

2004/0187917 A1* 9/2004 Pichler .................... G02F 1/155
136/263
2004/0265602 A1* 12/2004 Kobayashi ................ B32B 7/02
428/458

(Continued)

FOREIGN PATENT DOCUMENTS

JP S60203433 A 10/1985
JP 2003-115220 A 4/2003
(Continued)

OTHER PUBLICATIONS

International Search Report dated Nov. 15, 2016 from corresponding International Application No. PCT/JP2016/07628 and English translation.
(Continued)

*Primary Examiner* — Katie L. Hammer
(74) *Attorney, Agent, or Firm* — Lucas & Mercanti, LLP

(57) ABSTRACT

A transparent electrode has excellent adhesion between a substrate and a conductive layer. A transparent electrode includes a substrate, an underlying layer, and a conductive layer sequentially stacked. The underlying layer contains at least one selected from a compound having a thiol group and a poly(meth)acrylate and a poly(meth)acrylamide each having an aminoethyl group.

14 Claims, 1 Drawing Sheet

(51) Int. Cl.
- C08K 3/22 (2006.01)
- C08K 5/37 (2006.01)
- C08L 33/14 (2006.01)
- C08L 33/26 (2006.01)
- H01B 5/14 (2006.01)
- H01L 51/52 (2006.01)
- H05B 33/02 (2006.01)
- H05B 33/28 (2006.01)
- B32B 27/20 (2006.01)
- C09J 133/06 (2006.01)
- H01L 51/44 (2006.01)
- H01L 51/00 (2006.01)

(52) U.S. Cl.
CPC ............ *C08K 5/37* (2013.01); *C08L 33/14* (2013.01); *C08L 33/26* (2013.01); *C09J 133/066* (2013.01); *H01B 5/14* (2013.01); *H01L 51/0021* (2013.01); *H01L 51/442* (2013.01); *H01L 51/5206* (2013.01); *H01L 51/5234* (2013.01); *H05B 33/02* (2013.01); *H05B 33/28* (2013.01); *C08K 2003/2241* (2013.01); *C08K 2003/2244* (2013.01); *H01L 2251/305* (2013.01)

(56) References Cited

U.S. PATENT DOCUMENTS

| 2013/0202884 A1* | 8/2013 | Park | C09J 133/066 428/354 |
| 2015/0009432 A1* | 1/2015 | Katagiri | G06F 3/041 349/12 |

FOREIGN PATENT DOCUMENTS

| JP | 2013-543901 A | 12/2013 |
| JP | 2014-152317 A | 8/2014 |
| WO | 2014/093005 A1 | 6/2014 |

OTHER PUBLICATIONS

Written Opinion of the International Searching Authority dated Nov. 15, 2016 from corresponding International Application No. PCT/JP2016/07628 and English translation.

\* cited by examiner

TRANSPARENT ELECTRODE AND ORGANIC ELECTRONIC DEVICE INCLUDING THE SAME

CROSS REFERENCE TO RELATED APPLICATION

This Application is a 371 of PCT/JP2016/076328 filed on Sep. 7, 2016 which, in turn, claimed the priority of Japanese Patent Application No. 2016-035831 filed on Feb. 26, 2016, both applications are incorporated herein by reference.

TECHNICAL FIELD

The present invention relates to a transparent electrode and an organic electronic device including the same, and more particularly to a transparent electrode having excellent adhesion between a substrate and an electrically conductive (hereinafter referred to simply as "conductive") layer, and to an organic electronic device including such transparent electrode.

BACKGROUND ART

In recent years, there has been a demand for an organic electronic device such as an organic electroluminescence device (hereinafter also referred to as "organic EL device") and an organic solar cell to have a larger scale, a lighter weight, a higher flexibility, etc. In particular, a large-scale organic electronic device is demanded to have a high emission efficiency and/or a high power generation efficiency, and to use a transparent electrode having low electrical resistance.

Conventionally, a transparent electrode that uses an indium-tin composite oxide ($SnO_2$—$In_2O_3$: indium-tin oxide: ITO) film (hereinafter also referred to as "ITO transparent electrode") formed on a transparent substrate using a vacuum deposition or sputtering technique has been widely used because of its beneficial properties, such as high electrical conductivity and high transparency.

However, a structure including an ITO transparent electrode disposed on a transparent resin substrate, such as a flexible polyethylene terephthalate (PET) substrate, has a higher electrical resistance than a structure including an ITO transparent electrode disposed on a glass substrate. This characteristic hinders an ITO transparent electrode from being used in a large-scale organic electronic device.

In an effort to reduce the electrical resistance of transparent electrode, a transparent electrode has been considered in which a patterned metal thin wiring and a planar electrode layer are formed on a substrate using a print or application technique to combine surface current uniformity and high electrical conductivity.

One known method for forming a patterned metal thin wiring is to print a pattern of metal nanoparticle-dispersed liquid containing nanoparticles of a material such as silver, gold, or copper, and then sinter the metal nanoparticles. Such metal nanoparticle-dispersed liquid is often produced using a method that uses no or only a low amount of binder to reduce the electrical resistance of the patterned metal thin wiring during sintering at a low temperature or after sintering. This presents a problem in that the patterned metal thin wiring produced using metal nanoparticle-dispersed liquid has low adhesion to the substrate, and is thus easy to peel off.

Thus, to improve adhesion between the substrate and the patterned metal thin wiring, a method is proposed in which an underlying layer is disposed between the substrate and the patterned metal thin wiring.

For example, Patent Literature 1 discloses a base film for printable electronics including a primer coat layer over at least one surface of a plastic film, and having absorption peaks at near 761 $cm^{-1}$ and at near 1675 $cm^{-1}$ in an ATR-IR spectrum of the surface of that primer coat layer due to a chemical structure of C═C (carbon-carbon double bond) to achieve excellent adhesion to a wiring circuit (patterned conductive structure).

Meanwhile, Patent Literature 2 discloses a curable resin composition for screen printing, containing a compound having an isocyanurate skeleton that has excellent adhesion to a metal surface, for use as an insulation film material for protecting patterned wiring on the printed circuit board.

CITATION LIST

Patent Literature

Patent Literature 1: JP 2014-135364 A
Patent Literature 2: JP 2013-184999 A

SUMMARY OF INVENTION

Technical Problem

The present invention has been made in view of the foregoing problem and situation, and an object to be addressed is to provide a transparent electrode having excellent adhesion between a substrate and a conductive layer, and an organic electronic device including such transparent electrode.

Solution to Problem

In efforts to investigate the cause of the foregoing problem etc. to solve the problem described above, the present inventors have found that an underlying layer containing at least one selected from a compound having a thiol group and a poly(meth)acrylate and a poly(meth)acrylamide each having an aminoethyl group containing a nitrogen atom, which exhibit high affinity for metals and alloys, can provide a transparent electrode having excellent adhesion between a substrate and a conductive layer, and an organic electronic device including such transparent electrode. Thus, the present invention has been made.

That is, the problem described above in regard to the present invention can be solved by the following products.

1. A transparent electrode including, in a sequentially stacked manner: a substrate; an underlying layer; and an electrically conductive layer, wherein the underlying layer contains at least one selected from a compound having a thiol group and a poly(meth)acrylate and a poly(meth) acrylamide each having an aminoethyl group.

2. The transparent electrode according to clause 1, wherein the compound having the thiol group is a condensation product of a compound having a structure represented by general formula (I) with a monovalent or polyvalent alcohol, or with an amine,

[Chemical Formula 1]

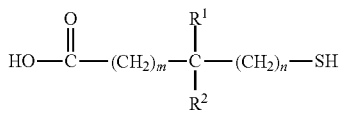

General Formula (I)

wherein, $R^1$ and $R^2$ each independently represent a hydrogen atom or an alkyl group having 1 to 10 carbon atoms, where at least one of $R^1$ and $R^2$ is an alkyl group having 1 to 10 carbon atoms, m is an integer from 0 to 2 inclusive, and n is 0 or 1.

3. The transparent electrode according to clause 1, wherein the poly(meth)acrylate and the poly(meth)acrylamide each having an aminoethyl group each have a partial structure represented by general formula (II),

[Chemical Formula (2)]

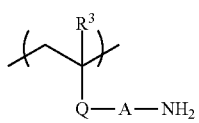

General Formula (II)

wherein, $R^3$ represents a hydrogen atom or a methyl group, Q represents —C(=O)O— or —C(=O)NRa—, where Ra represents a hydrogen atom or an alkyl group, and A represents a substituted or unsubstituted alkylene group, or —(CH$_2$CHRbNH)$_x$—CH$_2$CHRb—, where Rb represents a hydrogen atom or an alkyl group, and x represents an average number of repeating units, being a positive integer.

4. The transparent electrode according to any one of clauses 1 to 3, wherein the electrically conductive layer includes a first electrically conductive layer formed of a metal thin wire having a specific pattern, and a second electrically conductive layer formed of a metal oxide.

5. The transparent electrode according to any one of clauses 1 to 4, wherein the underlying layer contains a particle having a particle size in a range from 5 to 100 nm, the particle being formed of a titanium oxide or a zirconium oxide.

6. The transparent electrode according to any one of clauses 1 to 5, wherein the underlying layer has a thickness in a range from 10 to 100 nm.

7. An organic electronic device including: the transparent electrode according to any one of clauses 1 to 6.

8. The organic electronic device according to clause 7, wherein the organic electronic device is an organic electroluminescent device.

Advantageous Effects of Invention

The products described above of the present invention can provide a transparent electrode having excellent adhesion between a substrate and a conductive layer, and an organic electronic device including such transparent electrode.

The mechanism to achieve, or the mechanism of action of, the advantageous effects of the present invention is not yet clearly understood, but is inferred as follows.

The transparent electrode of the present invention is characterized in including an underlying layer between a substrate and a conductive layer, and the underlying layer containing at least one selected from a compound having a thiol group and a poly(meth)acrylate and a poly(meth)acrylamide each having an aminoethyl group. This feature improves adhesion between the substrate and the conductive layer.

In more detail, it is inferred that a strong interaction between a metallic material contained in the conductive layer (e.g., a silver atom in a silver nanoparticle or the like) and a sulfur atom, which is a constituent atom of the thiol group, or a nitrogen atom, which is a constituent atom of the aminoethyl group, improves adhesion between the substrate and the conductive layer.

DESCRIPTION OF EMBODIMENTS

A transparent electrode of the present invention is characterized in that an underlying layer disposed between a substrate and a conductive layer contains at least one selected from a compound having a thiol group and a poly(meth)acrylate and a poly(meth)acrylamide each having an aminoethyl group. This feature is a technical feature common to the aspects of the present invention as claimed in the attached claims.

In an aspect of the present invention, to improve the adhesion and to improve device performance, the compound having a thiol group is preferably a condensation product of a compound having a structure represented by general formula (I) given above with a monovalent or polyvalent alcohol, or with an amine; or the poly(meth)acrylate and the poly(meth)acrylamide each having an aminoethyl group preferably have a partial structure represented by general formula (II) given above.

To improve both optical transmittance and to reduce electrical resistance, the conductive layer preferably includes a first conductive layer formed of a metal thin wire having a specific pattern, and a second conductive layer formed of a metal oxide.

To improve adhesion to the optical conductive layer, the underlying layer preferably contains a particle having a particle size in a range from 5 to 100 nm, the particle being formed of a titanium oxide or a zirconium oxide.

In view of smoothness and transparency of the underlying layer, the underlying layer preferably has a thickness in a range from 10 to 100 nm.

The transparent electrode of the present invention is applicable to an organic electronic device, in particular, to an organic EL device.

The present invention, components of the present invention, and embodiments and aspects of the present invention will be described in detail below. Note that, as used herein, two values linked by the word "to" represent a numerical range including these two values inclusive as the upper and lower limits.

<<Transparent Electrode>>

A transparent electrode of the present invention is characterized at least in being configured such that an underlying layer and a conductive layer are sequentially stacked on a substrate, and the underlying layer contains at least one selected from a compound having a thiol group and a poly(meth)acrylate and a poly(meth)acrylamide each having an aminoethyl group.

The transparent electrode will be described in detail below with reference to the drawings.

Figure 1:
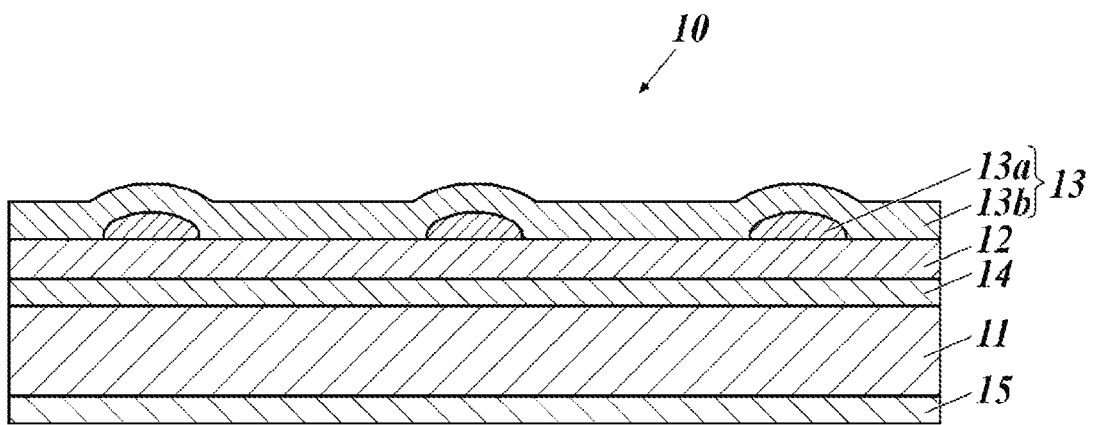
FIG. 1 is a cross-sectional view illustrating an example schematic configuration of a transparent electrode of the present invention.

As illustrated in FIG. 1, a transparent electrode 10 of the present invention includes, on a substrate 11, an underlying layer 12 and a patterned metal thin wiring 13a that serves as a conductive layer 13.

The conductive layer 13 may include the patterned metal thin wiring 13a (first conductive layer 13a), and a second conductive layer 13b formed to cover the patterned metal thin wiring 13a. The second conductive layer 13b is implemented as a metal oxide layer or an organic conductive layer.

The transparent electrode 10 of the present invention may further include other layers as needed.

For example, the transparent electrode 10 may further include a gas barrier layer 14 between the substrate 11 and the underlying layer 12, and may further include a particle-containing layer 15 over a surface opposite the underlying layer across the substrate 11. The particle-containing layer 15 is preferably disposed as an outermost layer.

<Underlying Layer (12)>

The underlying layer according to the present invention serves as a support layer for disposing the patterned metal thin wiring and the metal oxide layer to improve adhesion between the substrate and the conductive layer.

It suffices for the underlying layer to contain at least one selected from a compound having a thiol group and a poly(meth)acrylate and a poly(meth)acrylamide each having an aminoethyl group, but the underlying layer may contain two or more thereof.

In addition to the compounds described above, the underlying layer may further contain inorganic particles. In particular, the underlying layer preferably contains oxide particles among others. Inclusion of oxide particles in the underlying layer improves adhesion to the patterned metal thin wiring and the metal oxide layer.

The underlying layer may also be configured to have a feature other than the improvement in adhesion to the patterned metal thin wiring and the metal oxide layer. An example of preferred feature other than the adhesion is to have a light extraction capability. To configure the underlying layer to have a light extraction capability, the underlying layer preferably contains, in addition to a resin that mainly constitutes the underlying layer, oxide particles having a refractive index higher than the refractive index of the resin. The oxide particles having a refractive index higher than the refractive index of the resin act as light-scattering particles in the underlying layer to scatter light in the underlying layer, thereby providing the underlying layer with a light extraction capability.

The underlying layer preferably has a thickness in a range from 10 to 1000 nm, and more preferably from 10 to 100 nm. A thickness of the underlying layer of 10 nm or more means that the underlying layer itself is a continuous film, and has a smooth surface, and thus has only a small effect on the organic electronic device. Meanwhile, a thickness of the underlying layer of 1000 nm or less enables a decrease in the transparency of the transparent electrode caused by the underlying layer to be reduced, and the amount of adsorbed gas due to the underlying layer to be also reduced, and enables a deterioration in the electrical resistance of the patterned metal thin wiring to be reduced or avoided. A thickness of the underlying layer of 1000 nm or less can also reduce or avoid breakage of the underlying layer upon bending of the transparent electrode.

The transparency of the underlying layer may be at any level depending on the application, but a higher transparency results in higher applicability to the transparent electrode, and is thus preferred in view of a wider scope of application. The underlying layer preferably has a total light transmittance of at least 40% or higher, and preferably 50% or higher. Total light transmittance can be determined by a known method that uses a device such as a spectrophotometer.

(Compound Having Thiol Group)

The compound having a thiol group (also known as mercapto group) (the compound hereinafter also referred to as "thiol group-containing compound") is not particularly limited as long as the advantageous effects of the present invention are not hindered.

The thiol group-containing compound according to the present invention is preferably a polyfunctional thiol group-containing compound having two or more thiol groups. This structure enables the adhesion to the conductive layer containing metallic material to be further improved.

The thiol group-containing compound is preferably a condensation product of a compound having a structure represented by general formula (I) given below with a monovalent or polyvalent alcohol, or with an amine.

[Chemical Formula 3]

General Formula (I)

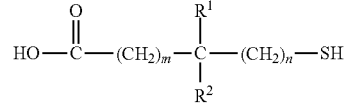

In general formula (I), $R^1$ and $R^2$ each independently represent a hydrogen atom or an alkyl group having 1 to 10 carbon atoms, where at least one of $R^1$ and $R^2$ is an alkyl group having 1 to 10 carbon atoms; m is an integer from 0 to 2 inclusive; and n is 0 or 1.

The alkyl group having 1 to 10 carbon atoms of $R^1$ and $R^2$ may be either linear or branched. Specifically, examples thereof include methyl, ethyl, n-propyl, isopropyl, n-butyl, isobutyl, tert-butyl, n-hexyl, and n-octyl groups. The alkyl group having 1 to 10 carbon atoms is preferably a methyl group or an ethyl group.

The symbol m represents an integer from 0 to 2 inclusive, and is preferably 0 or 1.

The symbol n represents 0 or 1, and is preferably 0.

Examples of the compound having a structure represented by general formula (I) given above include 2-mercaptopropionic acid, 3-mercaptobutyric acid, 2-mercaptoisobutyric acid, and 3-mercaptoisobutyric acid.

Examples of the monovalent alcohol include methanol, ethanol, 1-propanol, isopropyl alcohol, 1-butanol, 2-butanol, t-butyl alcohol, 1-pentanol, 2-pentanol, 3-pentanol, 2-methyl-1-butanol, 3-methyl-1-butanol, 3-methyl-2-butanol, 1-hexanol, 2-hexanol, 3-hexanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 1-heptanol, 2-heptanol, 2-methyl-2-heptanol, and 2-methyl-3-heptanol.

Examples of the polyvalent alcohol include glycols (where the alkylene group preferably has 2 to 10 carbon atoms, and the carbon chain may be branched), such as ethylene glycol, diethylene glycol, 1,2-propylene glycol, 1,3-propylene glycol, 1,2-butanediol, 1,3-butanediol, 1,4- butanediol, 2,3-butanediol, glycerol, trimethylolethane, trimethylolpropane, trimethylolbutane, and dipentaerythritol.

Among these, preference is given to ethylene glycol, 1,2-propylene glycol, 1,2-butanediol, 1,4-butanediol, trimethylolethane, trimethylolpropane, and pentaerythritol.

In view of capable of obtaining a polyfunctional thiol group-containing compound, the alcohol condensed with the compound having a structure represented by general formula (I) given above is preferably a polyvalent alcohol.

The amine is not particularly limited, and may be any of primary, secondary, and tertiary amines. Examples of the amine include methylamine, ethylamine, propylamine, butylamine, hexylamine, octylamine, decylamine, stearylamine, dimethylamine, diethylamine, dipropylamine, dibutylamine, ethylenediamine, 1,3-diamino propane, 1,4-diamino butane, hexamethylenediamine, meta-xylylenediamine, tolylenediamine, para-xylylenediamine, phenylenediamine, and isophoronediamine.

As specific examples of the thiol group-containing compound applicable to the underlying layer according to the present invention, exemplary compounds SH-1 to SH-155, SE-1 to SE-84, and SA-1 to SA-34 will be given below.

[Chemical Formula 4]

SH-1 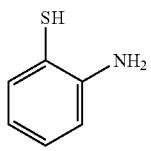

SH-2 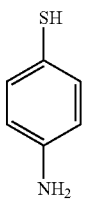

SH-3 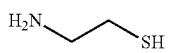

SH-4 

SH-5 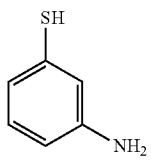

SH-6 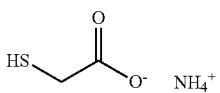

SH-7 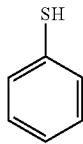

SH-8 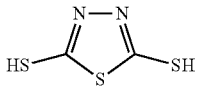

SH-9 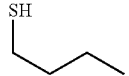

SH-10 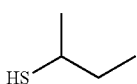

SH-11 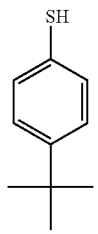

SH-12 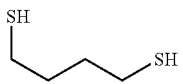

SH-13 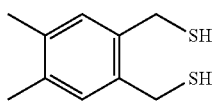

SH-14 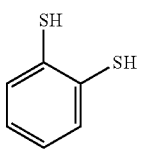

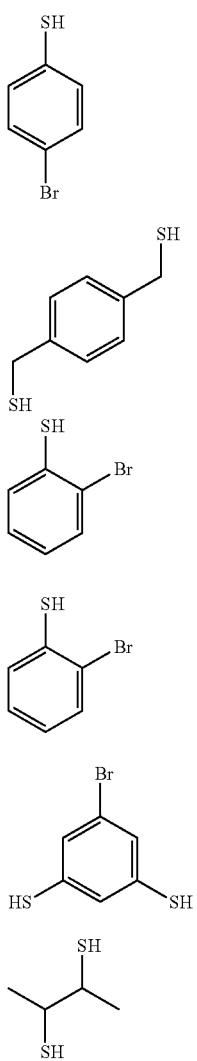
[Chemical Formula 5]
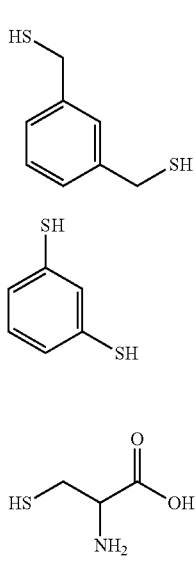

-continued
SH-31  SH-32
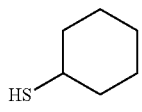
SH-33 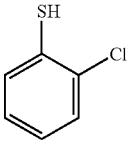 SH-34
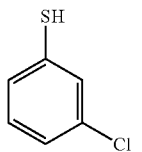
SH-35 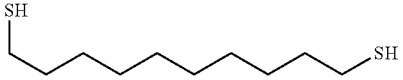 SH-36
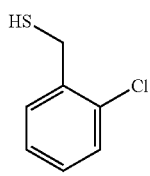
SH-37 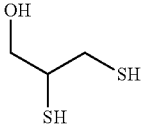 SH-38
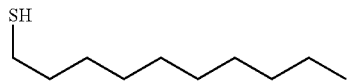
SH-39 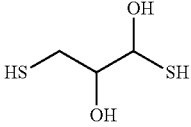 SH-40
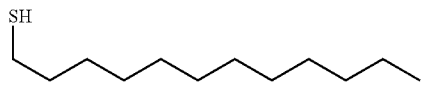
SH-41 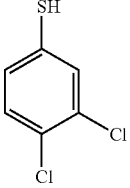 SH-42
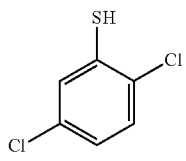
SH-43 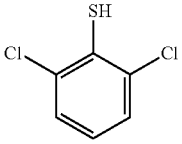 SH-44
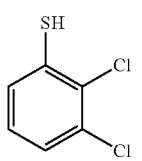
SH-45 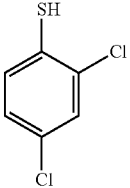 SH-46
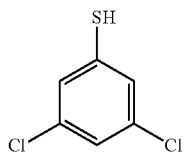
SH-47 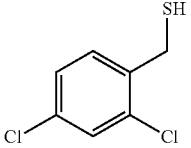 SH-48
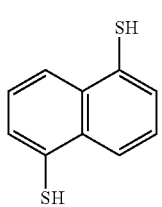

[Chemical Formula 6]
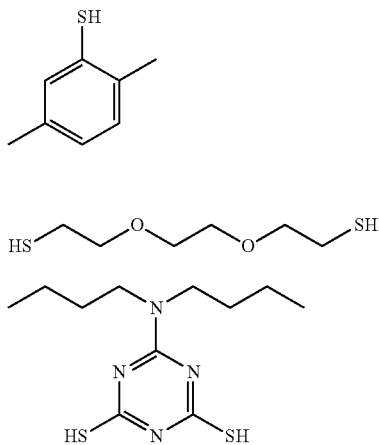
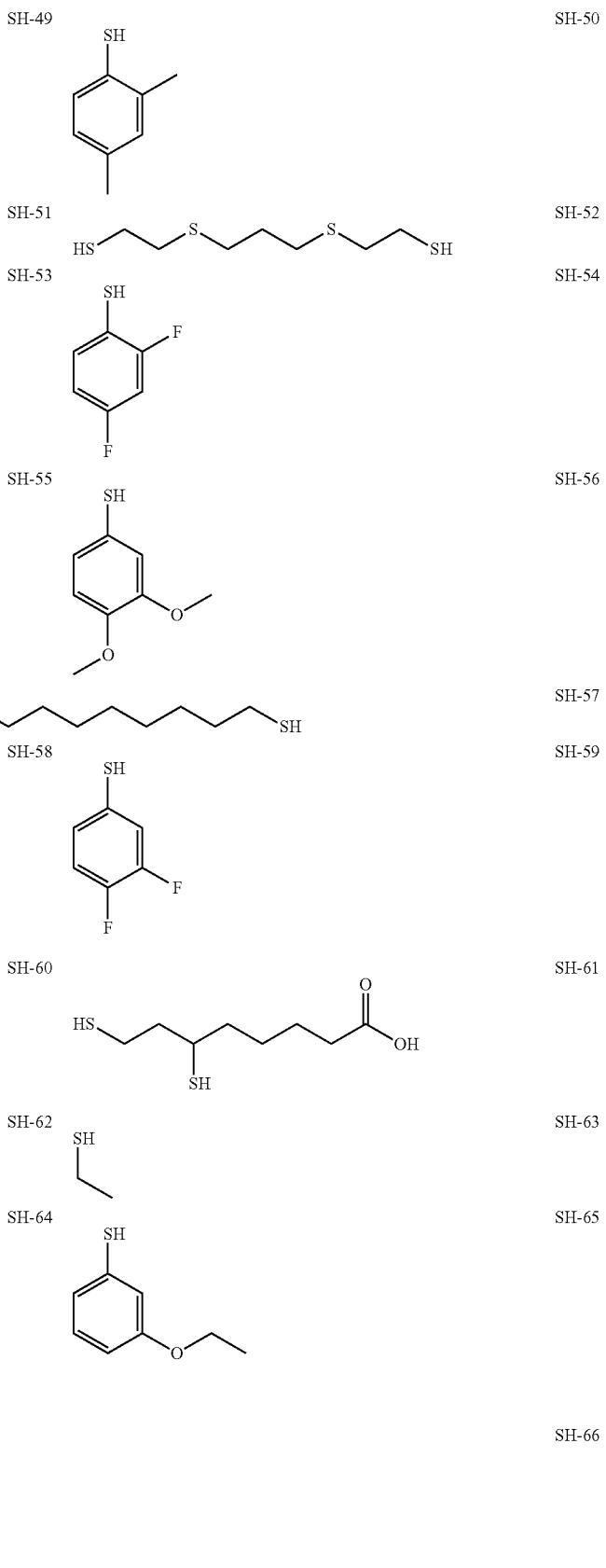

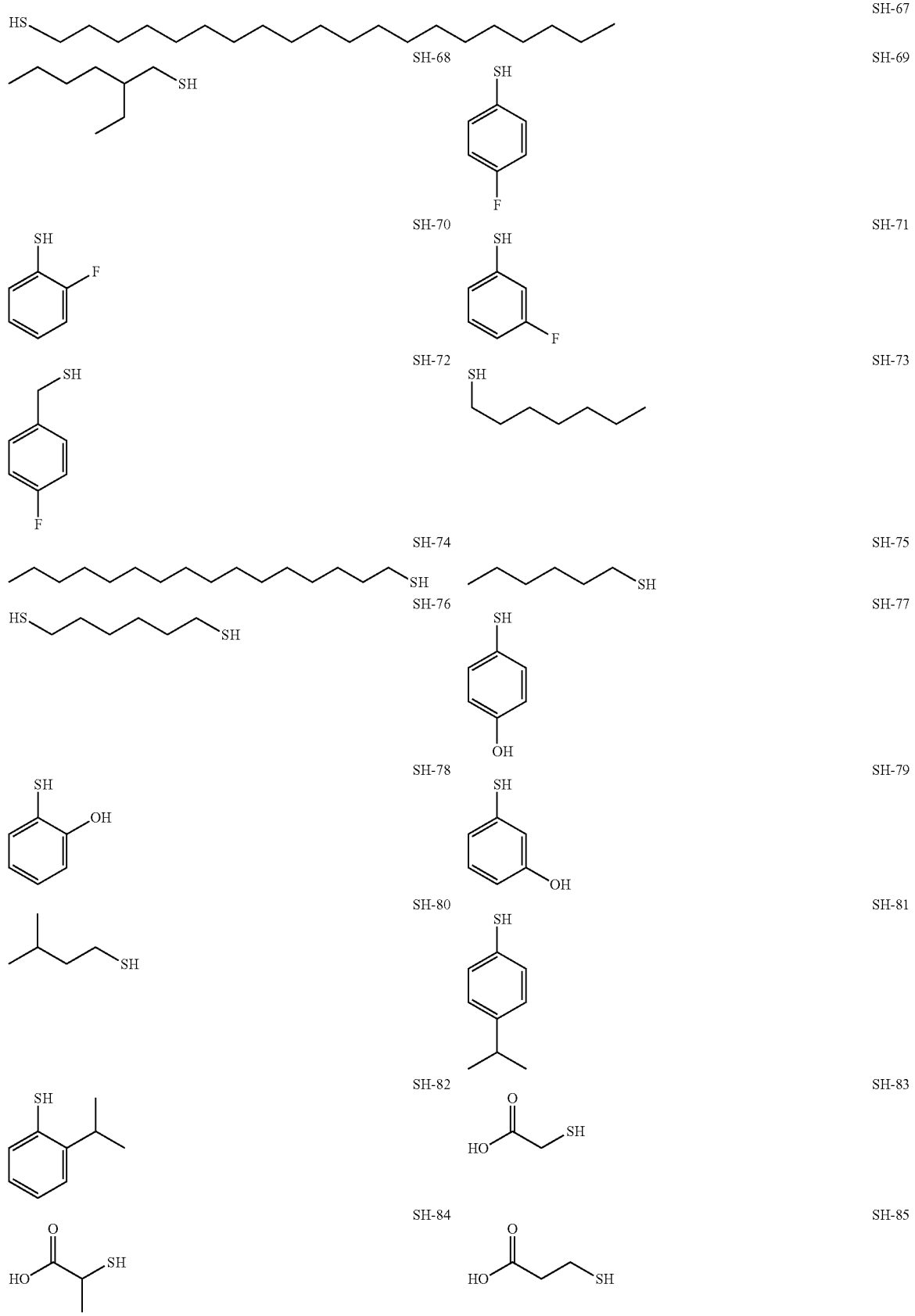

-continued
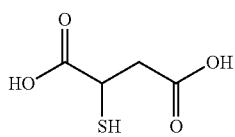
SH-86
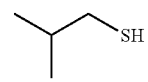
SH-87
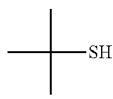
SH-88
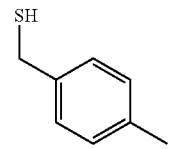
SH-89
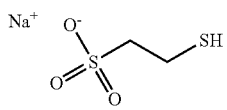
SH-90
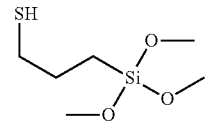
SH-91
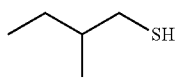
SH-92
[Chemical Formula 8]
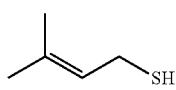
SH-93
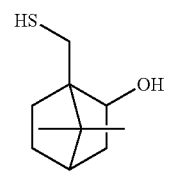
SH-94
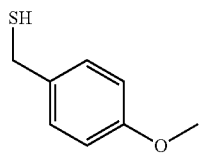
SH-95
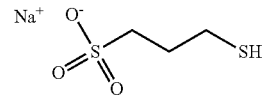
SH-96
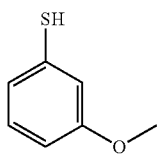
SH-97
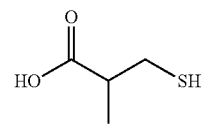
SH-98
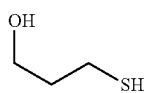
SH-99
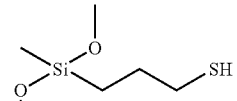
SH-100
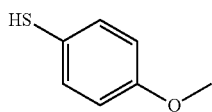
SH-101
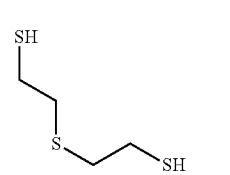
SH-102
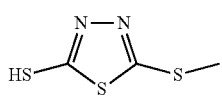
SH-103
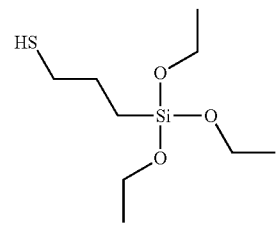
SH-104

SH-105
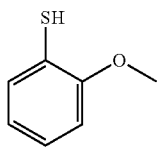
SH-106
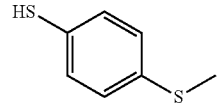
SH-107
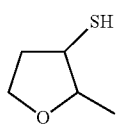
SH-108
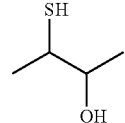
SH-109
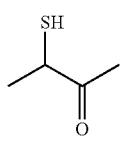
SH-110
SH-111
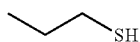
SH-112
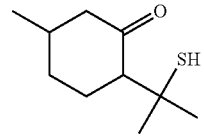
SH-113
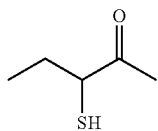
SH-114
SH-115
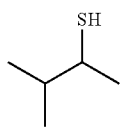
SH-116
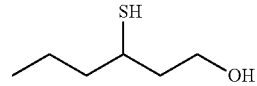
SH-117
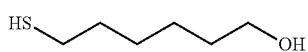
SH-118
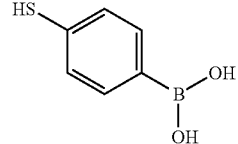
SH-119
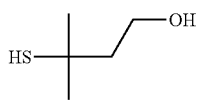
[Chemical Formula 9]
SH-120
SH-121
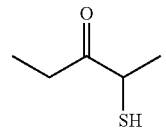
SH-122
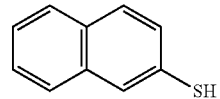
SH-123
SH-124
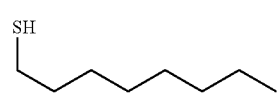
SH-125
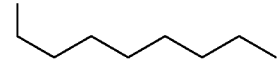

SH-126 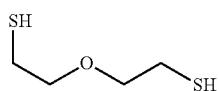 SH-127 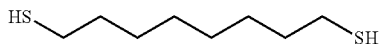
SH-128 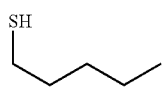 SH-129 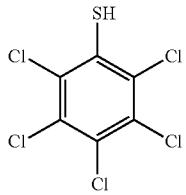
SH-130 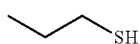 SH-131 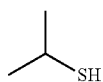
SH-132 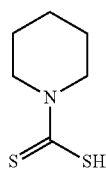 SH-133 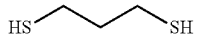
SH-134 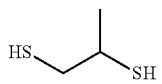 SH-135 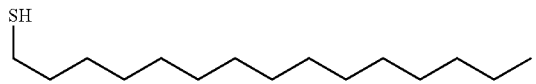
SH-136 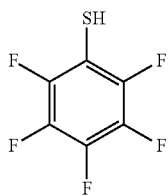 SH-137 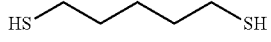
SH-138 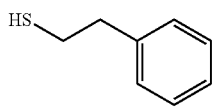 SH-139 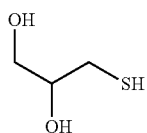
SH-140 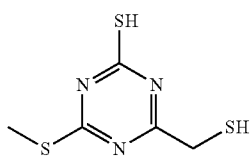 SH-141 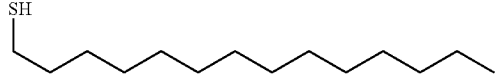
SH-142 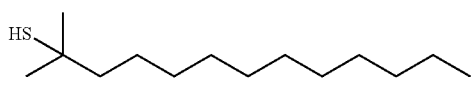
[Chemical Formula 10]
SH-143 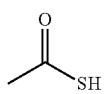 SH-144 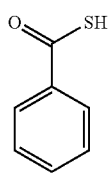

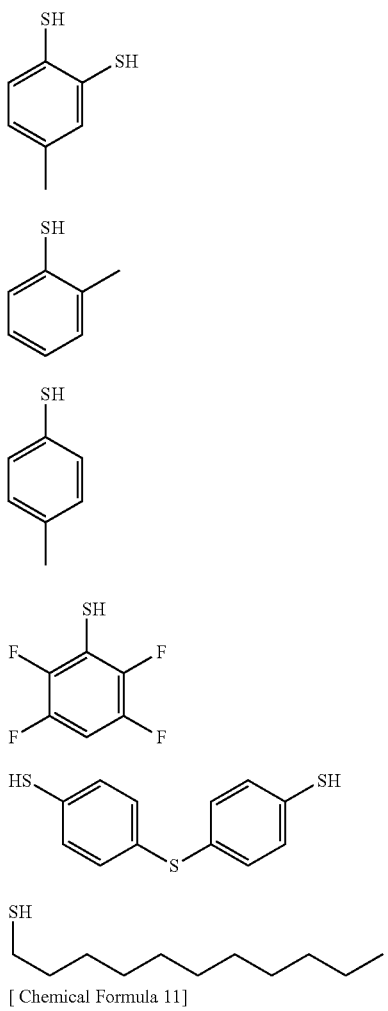
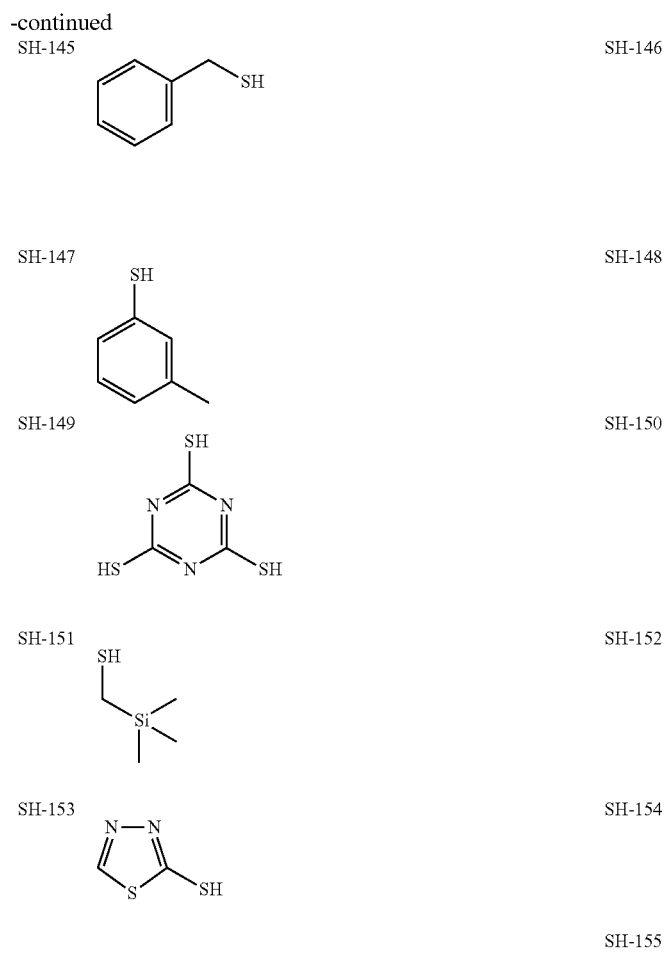
[Chemical Formula 11]
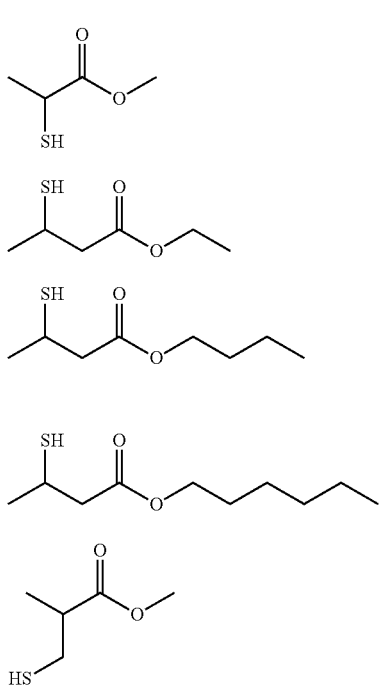

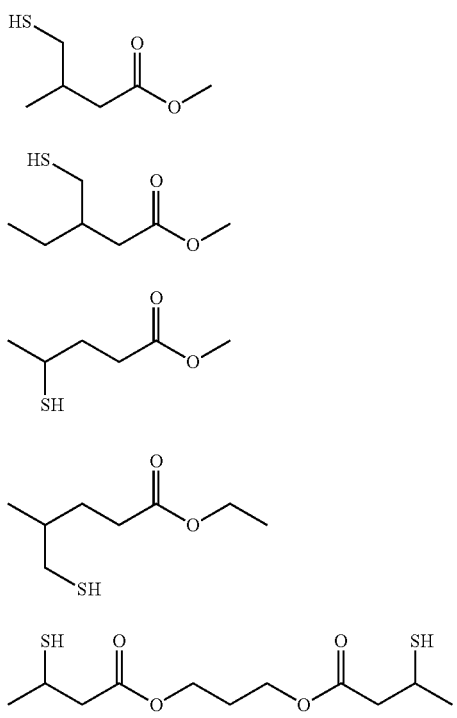
[Chemical Formula 12]
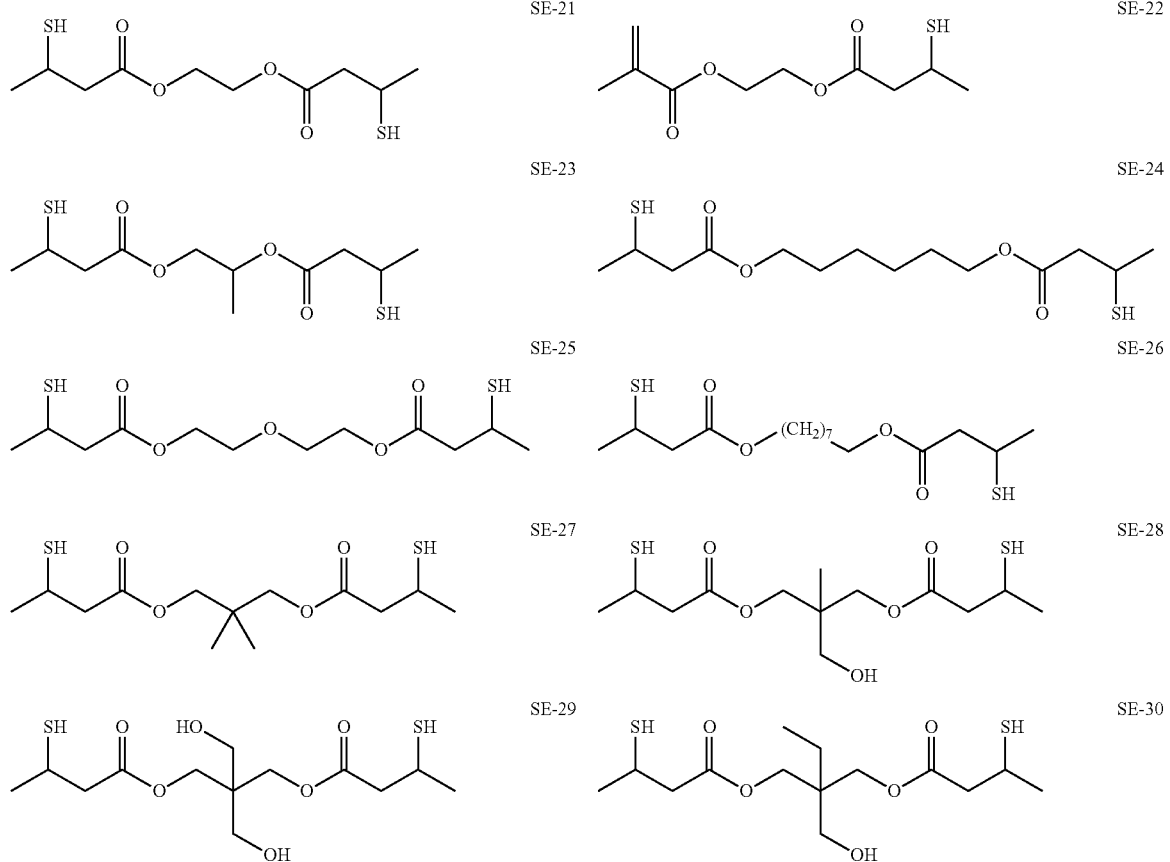

-continued
SE-31 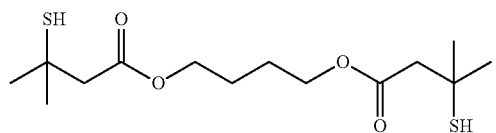
SE-32 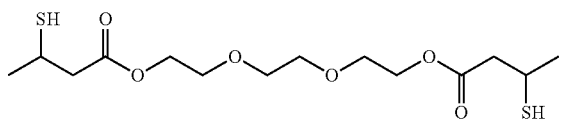
SE-33 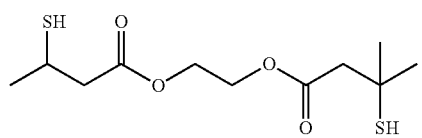
SE-34 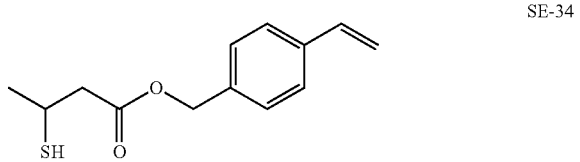
[Chemical Formula 13]
SE-35 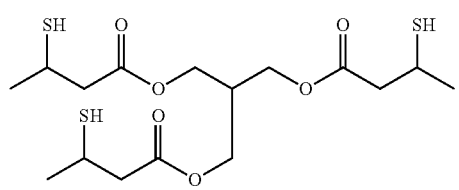
SE-36 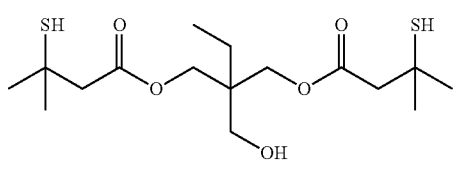
SE-37 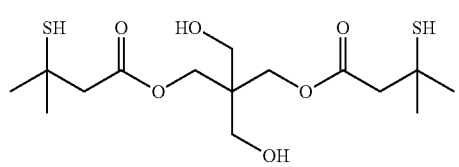
SE-38 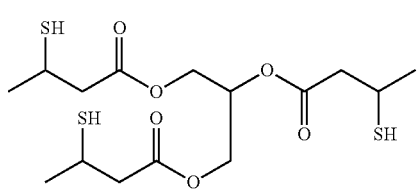
SE-39 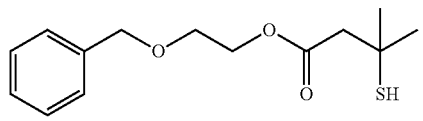
SE-40 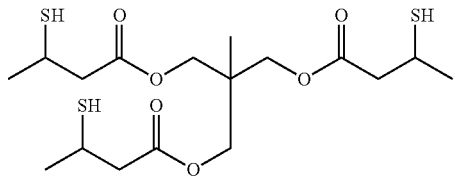
SE-41 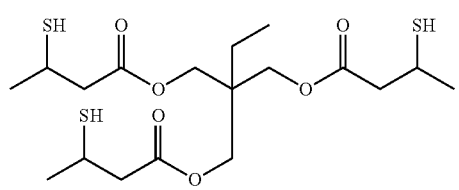
SE-42 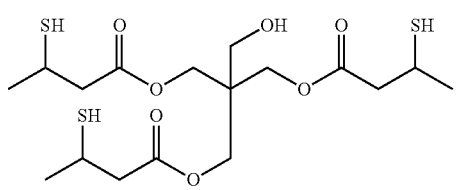
SE-43 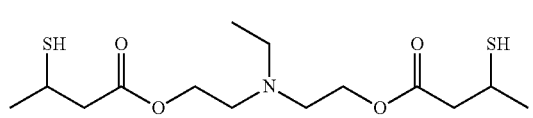
SE-44 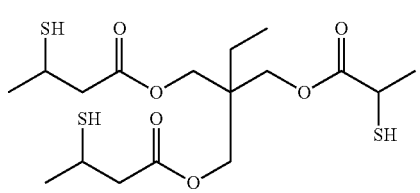
SE-45 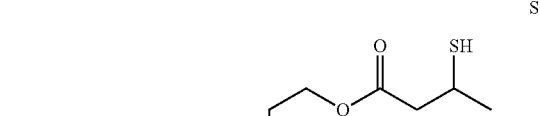
SE-46 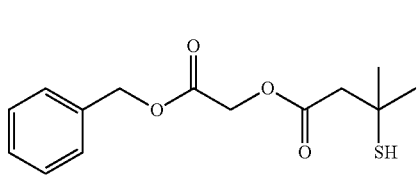

-continued
SE-47
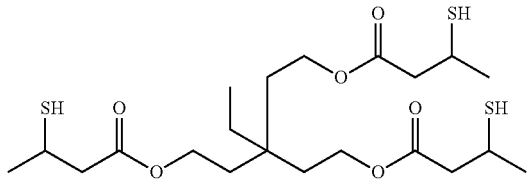
SE-48
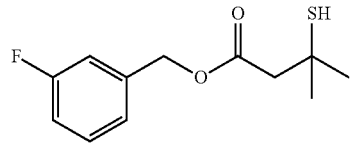
[Chemical Formula 14]
SE-49
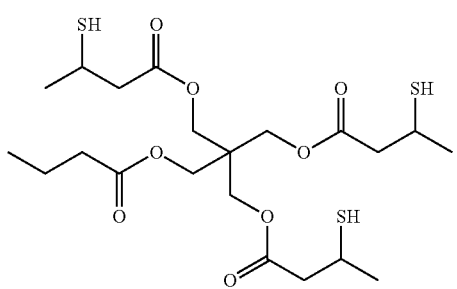
SE-50
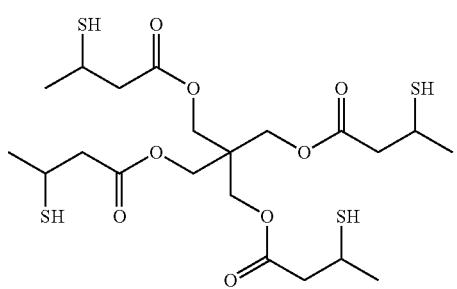
SE-51
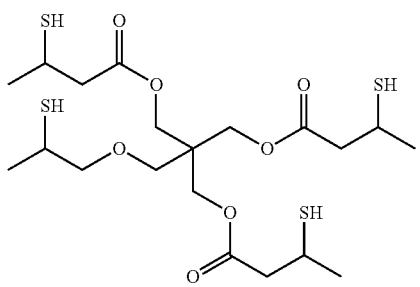
SE-52
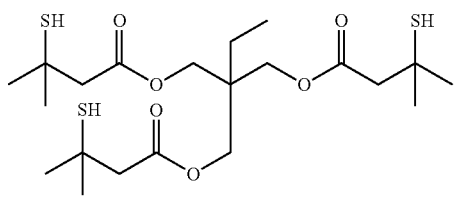
SE-53
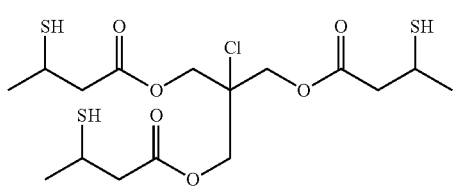
SE-54
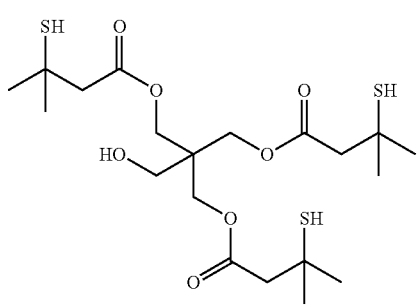
SE-55
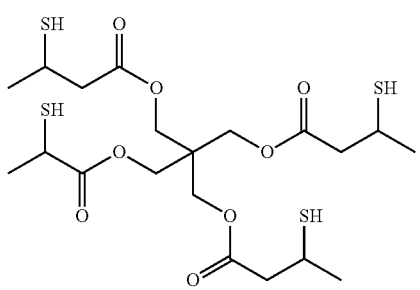
SE-56
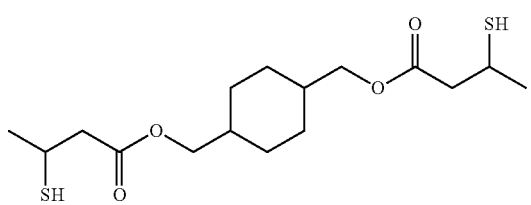
SE-57
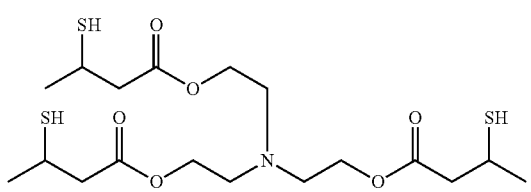
SE-58
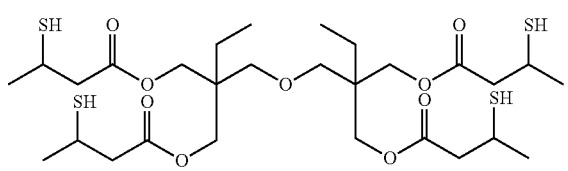

[Chemical Formula 15]
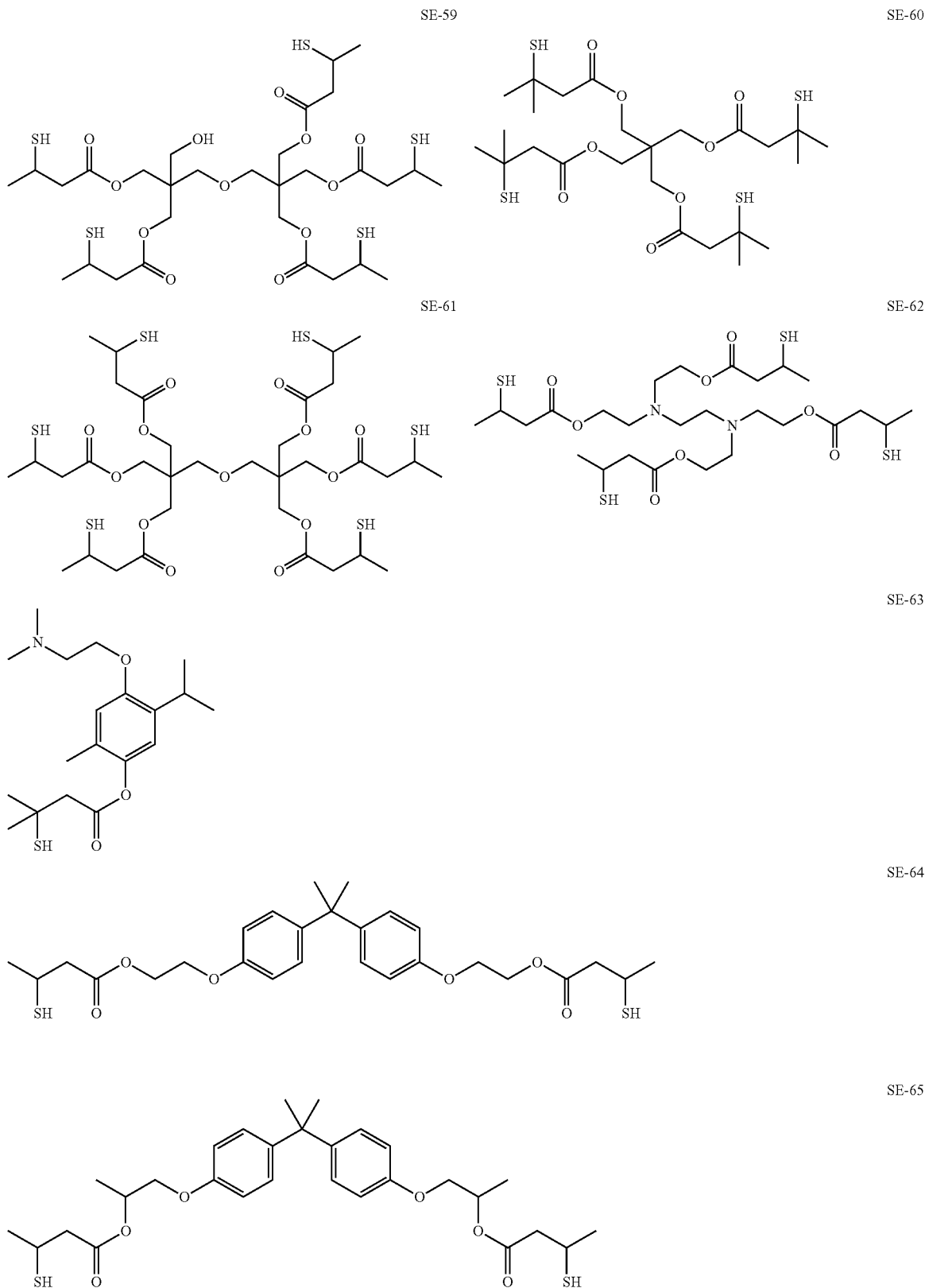

-continued
SE-66
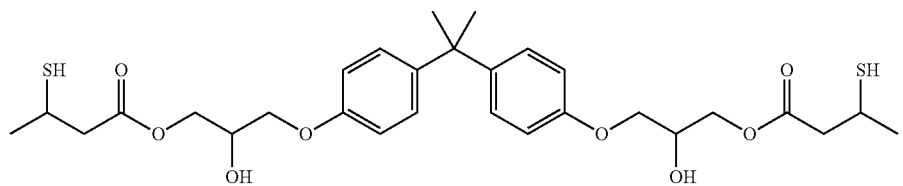
[Chemical Formula 16]
SE-67
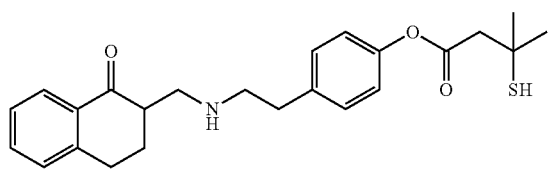
SE-68
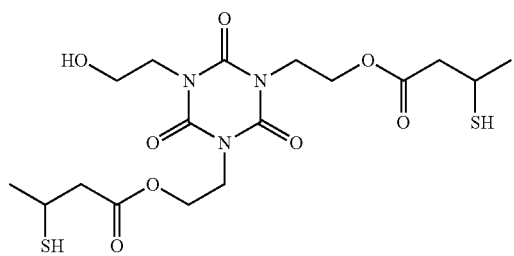
SE-69
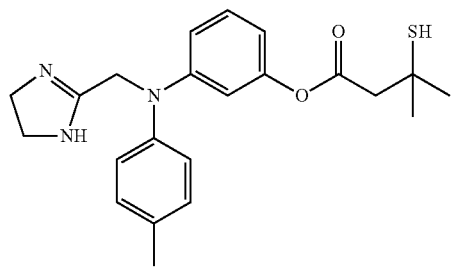
SE-70
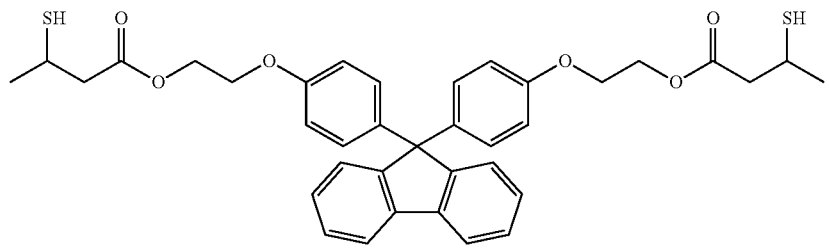
SE-71
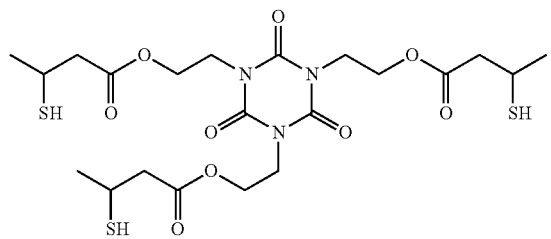
SE-72
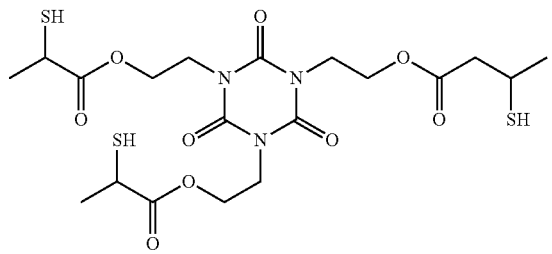
SE-73
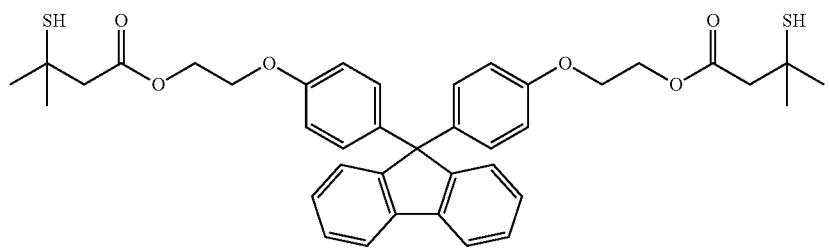

[Chemical Formula 17]
SE-74
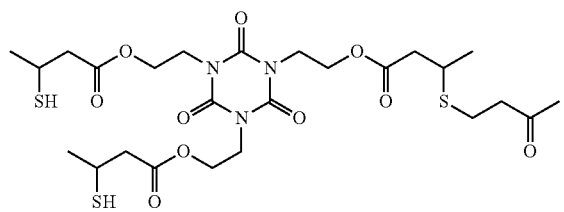
SE-75
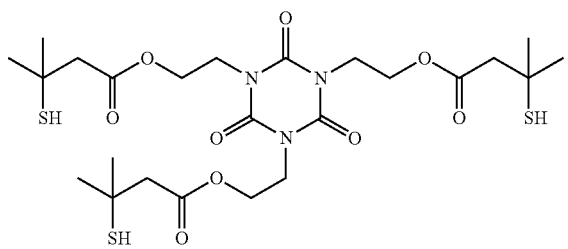
SE-76
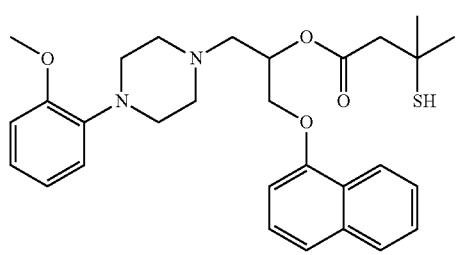
SE-77
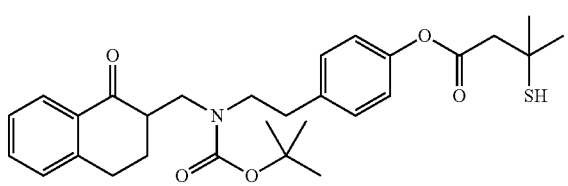
SE-78
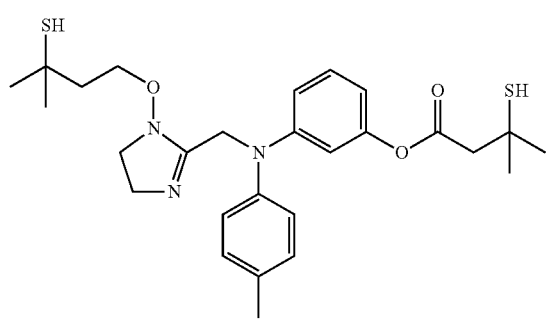
SE-79
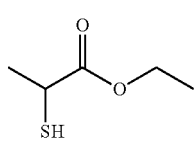
SE-80
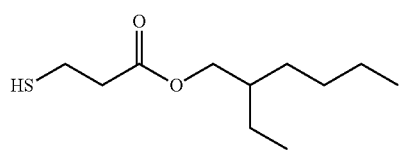
SE-81
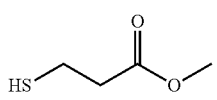
SE-82
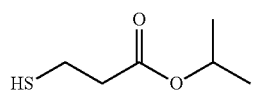
SE-83
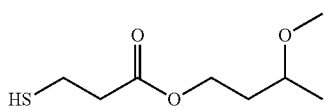
SE-84
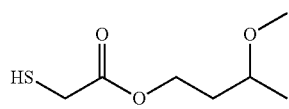
[Chemical Formula 18]
SA-1
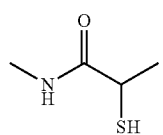
SA-2
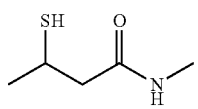
SA-3
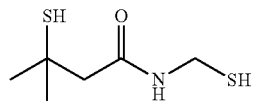
SA-4
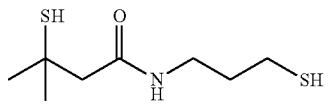

-continued
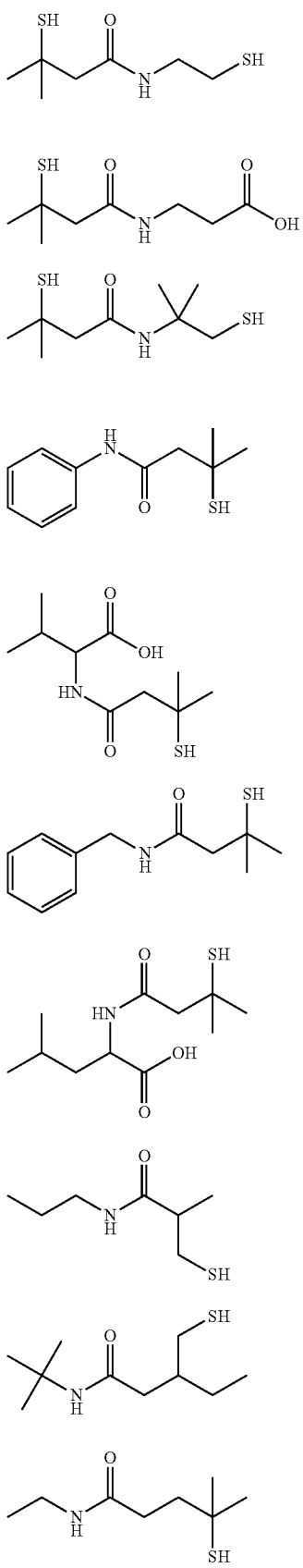
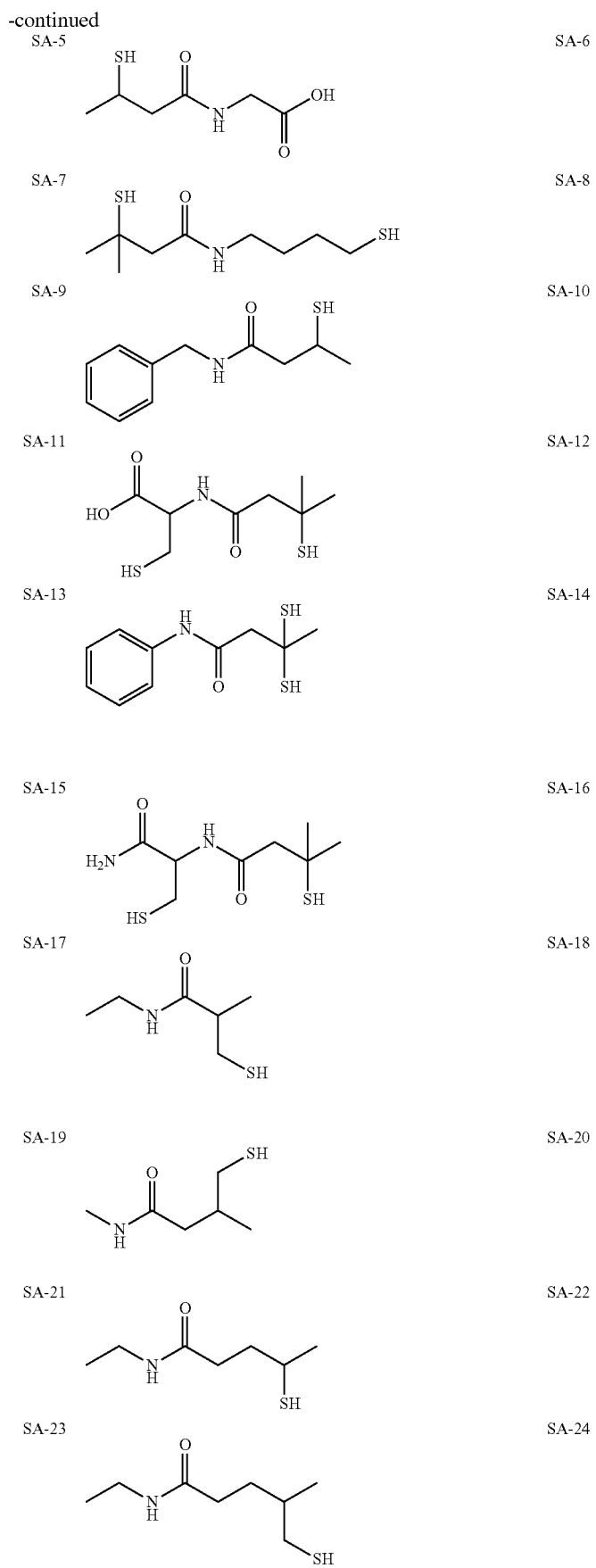

SA-25
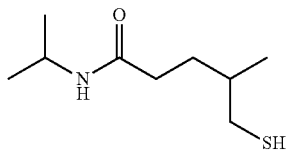
[Chemical Formula 19]
SA-26
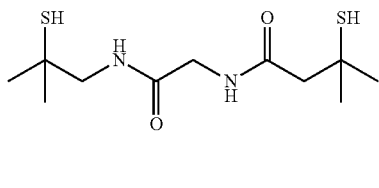
SA-27
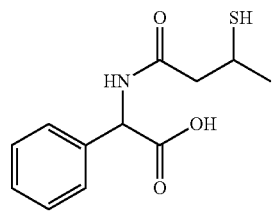
SA-28
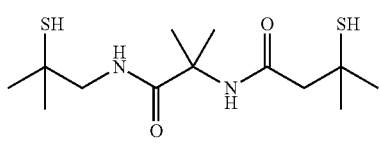
SA-29
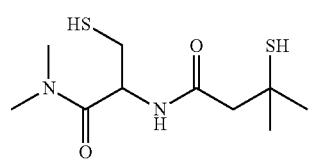
SA-30
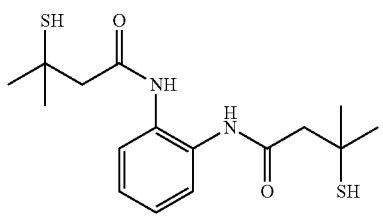
SA-31
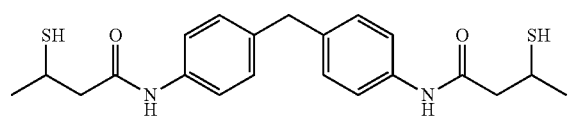
SA-32
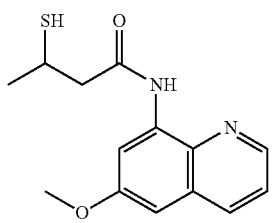
SA-33
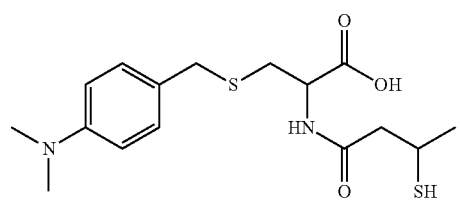
SA-34
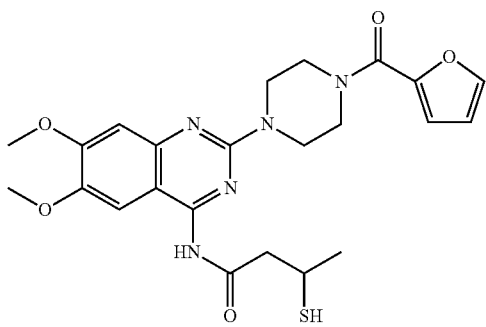

In addition, the compounds described in JP 4911666 B1 and in JP 4917294 B1 may also be suitably used as the thiol group-containing compound.

Above exemplary compounds SH-1 to SH-155, SE-1 to SE-84, and SA-1 to SA-34 can each be synthesized using a known method.

The thiol group-containing compound may also be a silsesquioxane derivative having a thiol group (hereinafter also referred to simply as "silsesquioxane derivative").

The silsesquioxane derivative is not particular limited, but is preferably a compound having a siloxane cage structure represented by general formula (A) given below.

[Chemical Formula 20]

General Formula (A)

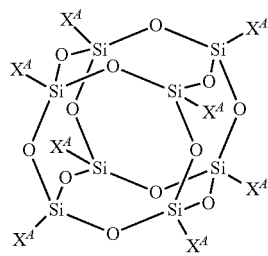

In general formula (A), $X^A$ represents either $X^1$ or $X^2$ given below, where at least one $X^A$ is $X^2$.

[Chemical Formula 21]

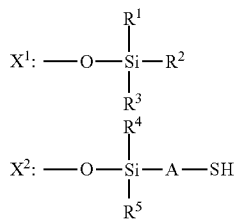

In $X^1$ and $X^2$, $R^1$ to $R^5$ each independently represent an alkyl group having 1 to 8 carbon atoms or an aromatic hydrocarbon ring group; and A represents a divalent hydrocarbon group having 1 to 8 carbon atoms.

The alkyl group having 1 to 8 carbon atoms of $R^1$ to $R^5$ in $X^1$ and $X^2$ may be either linear or branched. Specific examples thereof include methyl, ethyl, n-propyl, isopropyl, n-butyl, isobutyl, sec-butyl, tert-butyl, and n-pentyl groups.

Examples of the aromatic hydrocarbon ring group of $R^1$ to $R^5$ in $X^1$ and $X^2$ include phenyl, 1-naphthyl, and 2-naphthyl groups.

Examples of the divalent hydrocarbon group having 1 to 8 carbon atoms of A in $X^2$ include linear and branched alkylene groups having 1 to 8 carbon atoms. Among these, linear alkylene groups having 2 or 3 carbon atoms, such as —$CH_2CH_2$— and —$CH_2CH_2CH_2$—, are preferred in view of easy synthesis of a silsesquioxane derivative.

Among commercially available silsesquioxane derivatives, Compoceran (registered trademark) SQ100 series produced by Arakawa Chemical Industries, Ltd., and the like may also be used.

Other silsesquioxane derivatives having a thiol group applicable to the present invention and methods for synthesizing such a silsesquioxane derivative can be found in JP 2015-59108 A, JP 2012-180464 A, and the like.

(Poly(Meth)Acrylate and Poly(Meth)Acrylamide Having Aminoethyl Group)

The poly(meth)acrylate and the poly(meth)acrylamide each having an aminoethyl group are not particularly limited as long as the advantageous effects of the present invention are not hindered, but each preferably have a partial structure represented by general formula (II) given below.

[Chemical Formula 22]

General Formula (II)

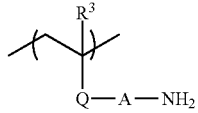

In general formula (II), $R^3$ represents a hydrogen atom or a methyl group; Q represents —C(=O)O— or —C(=O)NRa—, where Ra represents a hydrogen atom or an alkyl group; and A represents a substituted or unsubstituted alkylene group, or —$(CH_2CHRbNH)_x$—$CH_2CHRb$—, where Rb represents a hydrogen atom or an alkyl group, and x represents the average number of repeating units, which is a positive integer.

The alkyl group represented by Ra is, for example, preferably a linear or branched alkyl group having 1 to 5 carbon atoms, and more preferably, a methyl group.

These alkyl groups may be substituted with a substituent. As examples of the substituent, these alkyl groups may be substituted with an alkyl, cycloalkyl, aryl, heterocycloalkyl, heteroaryl, or hydroxy group, a halogen atom, an alkoxy, alkylthio, arylthio, cycloalkoxy, aryloxy, acyl, alkylcarbonamide, arylcarbonamide, alkylsulfonamide, arylsulfonamide, ureide, aralkyl, nitro, alkoxycarbonyl, aryloxycarbonyl, aralkyloxycarbonyl, alkylcarbamoyl, arylcarbamoyl, alkylsulfamoyl, arylsulfamoyl, acyloxy, alkenyl, alkynyl, alkylsulfonyl, arylsulfonyl, alkyloxysulfonyl, aryloxysulfonyl, alkylsulfonyloxy, arylsulfonyloxy, or other functional group. Among these, hydroxy and alkyloxy groups are preferred.

The above alkyl group as the substituent may be branched, and preferably has 1 to 20, more preferably 1 to 12, and still more preferably 1 to 8 carbon atoms. Examples of such alkyl group include methyl, ethyl, propyl, isopropyl, butyl, t-butyl, hexyl, and octyl groups.

The above cycloalkyl group preferably has 3 to 20, more preferably 3 to 12, and still more preferably 3 to 8 carbon atoms. Examples of the cycloalkyl group include cyclopropyl, cyclobutyl, cyclopentyl, and cyclohexyl groups.

The above aryl group preferably has 6 to 20, and more preferably 6 to 12 carbon atoms. Examples of the aryl group include phenyl and naphthyl groups.

The above heterocycloalkyl group preferably has 2 to 10, and more preferably 3 to 5 carbon atoms. Examples of the heterocycloalkyl group include piperidino, dioxanyl, and 2-morpholinyl groups.

The above heteroaryl group preferably has 3 to 20, and more preferably 3 to 10 carbon atoms. Examples of the heteroaryl group include thienyl and pyridyl groups.

Examples of the above halogen atom include a fluorine atom, a chlorine atom, a bromine atom, and an iodine atom.

The above alkoxy group may be branched, and preferably has 1 to 20, more preferably 1 to 12, still more preferably 1 to 6, and most preferably 1 to 4 carbon atoms. Examples of the alkoxy group include methoxy, ethoxy, 2-methoxyethoxy, 2-methoxy-2-ethoxyethoxy, butyloxy, hexyloxy, and octyloxy groups, and preference is given to an ethoxy group.

The above alkylthio group may be branched, and preferably has 1 to 20, more preferably 1 to 12, still more preferably 1 to 6, and most preferably 1 to 4 carbon atoms. Examples of the alkylthio group include methylthio and ethylthio groups.

The above arylthio group preferably has 6 to 20, and more preferably 6 to 12 carbon atoms. Examples of the arylthio group include phenylthio and naphthylthio groups.

The above cycloalkoxy group preferably has 3 to 12, and more preferably 3 to 8 carbon atoms. Examples of the cycloalkoxy group include cyclopropoxy, cyclobutyloxy, cyclopentyloxy, and cyclohexyloxy groups.

The above aryloxy group preferably has 6 to 20, and more preferably 6 to 12 carbon atoms. Examples of the aryloxy group include phenoxy and naphthoxy groups.

The above acyl group preferably has 1 to 20, and more preferably 1 to 12 carbon atoms. Examples of the acyl group include formyl, acetyl, and benzoyl groups.

The above alkylcarbonamide group preferably has 1 to 20, and more preferably 1 to 12 carbon atoms. Examples of the alkylcarbonamide group include acetamide group.

The above arylcarbonamide group preferably has 7 to 20, and more preferably 7 to 12 carbon atoms. Examples of the arylcarbonamide group include benzamide group.

The above alkylsulfonamide group preferably has 1 to 20, and more preferably 1 to 12 carbon atoms. Examples of the sulfonamide group include methanesulfonamide group.

The above arylsulfonamide group preferably has 6 to 20, and more preferably 6 to 12 carbon atoms. Examples of the arylsulfonamide group include benzenesulfonamide and p-toluenesulfonamide groups.

The above aralkyl group preferably has 7 to 20, and more preferably 7 to 12 carbon atoms. Examples of the aralkyl group include benzyl, phenethyl, and naphthylmethyl groups.

The above alkoxycarbonyl group preferably has 1 to 20, and more preferably 2 to 12 carbon atoms. Examples of the alkoxycarbonyl group include methoxycarbonyl group.

The above aryloxycarbonyl group preferably has 7 to 20, and more preferably 7 to 12 carbon atoms. Examples of the aryloxycarbonyl group include phenoxycarbonyl group.

The above aralkyloxycarbonyl group preferably has 8 to 20, and more preferably 8 to 12 carbon atoms. Examples of the aralkyloxycarbonyl group include benzyloxycarbonyl group.

The above acyloxy group preferably has 1 to 20, and more preferably 2 to 12 carbon atoms. Examples of the acyloxy group include acetoxy and benzoyloxy groups.

The above alkenyl group preferably has 2 to 20, and more preferably 2 to 12 carbon atoms. Examples of the alkenyl group include vinyl, allyl, and isopropenyl groups.

The above alkynyl group preferably has 2 to 20, and more preferably 2 to 12 carbon atoms. Examples of the alkynyl group include ethynyl group.

The above alkylsulfonyl group preferably has 1 to 20, and more preferably 1 to 12 carbon atoms. Examples of the alkylsulfonyl group include methylsulfonyl and ethylsulfonyl groups.

The above arylsulfonyl group preferably has 6 to 20, and more preferably 6 to 12 carbon atoms. Examples of the arylsulfonyl group include phenylsulfonyl and naphthylsulfonyl groups.

The above alkyloxysulfonyl group preferably has 1 to 20, and more preferably 1 to 12 carbon atoms. Examples of the alkyloxysulfonyl group include methoxysulfonyl and ethoxysulfonyl groups.

The above aryloxysulfonyl group preferably has 6 to 20, and more preferably 6 to 12 carbon atoms. Examples of the aryloxysulfonyl group include phenoxysulfonyl and naphthoxysulfonyl groups.

The above alkylsulfonyloxy group preferably has 1 to 20, and more preferably 1 to 12 carbon atoms. Examples of the alkylsulfonyloxy group include methylsulfonyloxy and ethylsulfonyloxy groups.

The above arylsulfonyloxy group preferably has 6 to 20, and more preferably 6 to 12 carbon atoms. Examples of the arylsulfonyloxy group include phenylsulfonyloxy and naphthylsulfonyloxy groups.

The substituents may be the same as one another or different from one another, and may also be further substituted.

The alkylene group represented by A preferably has 1 to 5 carbon atoms, and is more preferably an ethylene or propylene group. These alkylene groups may be substituted with one of the substituents described above.

The alkyl group represented by Rb is preferably a linear or branched alkyl group having 1 to 5 carbon atoms, and is more preferably a methyl group. These alkyl groups may be substituted with one of the substituents described above.

The average number of repeating units "x" is not particularly limited as long as the value of x is a positive integer, but is preferably in a range from 1 to 20.

The poly(meth)acrylate and the poly(meth)acrylamide preferably each have a weight average molecular weight (Mw) in a range from 10000 to 500000, and more preferably in a range from 30000 to 200000. A weight average molecular weight (Mw) of 10000 or more results in a hard underlying layer containing the poly(meth)acrylate and the poly(meth)acrylamide, and thus the underlying layer does not undergo a film thickness change or interface degradation with another layer caused by aging or under a forced degradation condition, thereby preventing an electrical or optical defect from occurring. Meanwhile, a weight average molecular weight (Mw) of 500000 or less results in good solubility to the application liquid for forming the underlying layer and in good compatibility with another compound, thereby preventing a problem of peeling from occurring at an interface with another layer having a different hardness in a low or high temperature environment.

(1) Poly(Meth)Acrylate Having Aminoethyl Group

Examples of the poly(meth)acrylate having an aminoethyl group include polymers and copolymers of a (meth)acrylate having an aminoethyl group.

Examples of the (meth)acrylate include monofunctional and difunctional (meth)acrylates having one and two (meth)acryloyl groups, and polyfunctional (meth)acrylates having three or more (meth)acryloyl groups.

Examples of the monofunctional (meth)acrylates include (meth)acrylic acid; $C_1$-$C_{24}$ alkyl (meth)acrylates, such as methyl (meth)acrylate, ethyl (meth)acrylate, propyl (meth)acrylate, butyl (meth)acrylate, isobutyl (meth)acrylate, sec-butyl (meth)acrylate, t-butyl (meth)acrylate, hexyl (meth)acrylate, octyl (meth)acrylate, isooctyl (meth)acrylate, 2-ethylhexyl (meth)acrylate, decyl (meth)acrylate, lauryl (meth)acrylate, and stearyl (meth)acrylate; cycloalkyl (meth)acrylates, such as cyclohexyl (meth)acrylate; bridged cyclic (meth)acrylates, such as dicyclopentanyl (meth)acrylate, dicyclopentenyl (meth)acrylate, dicyclopentenyloxyethyl (meth)acrylate, bornyl (meth)acrylate, isobornyl (meth)acrylate, and tricyclodecanyl (meth)acrylate; aryl (meth)acrylates, such as phenyl (meth)acrylate and nonylphenyl (meth)acrylate; aralkyl (meth)acrylates, such as benzyl (meth)acrylate; hydroxy $C_2$-$C_{10}$ alkyl (meth)acrylates or $C_2$-$C_{10}$ alkanediol mono(meth)acrylates, such as hydroxyethyl (meth)acrylate, hydroxypropyl (meth)acrylate, and hydroxybutyl (meth)acrylate; fluoro $C_1$-$C_{10}$ alkyl (meth)acrylates, such as trifluoroethyl (meth)acrylate, tetrafluoropropyl (meth)acrylate, and hexafluoroisopropyl (meth)acrylate; alkoxyalkyl (meth)acrylates, such as methoxyethyl (meth)acrylate; aryloxyalkyl (meth)acrylates, such as phenoxyethyl (meth)acrylate and phenoxypropyl (meth)acrylate; aryloxy(poly)alkoxyalkyl (meth)acrylates, such as phenyl Carbitol (meth)acrylate, nonylphenyl Carbitol (meth)acrylate, and nonylphenoxypolyethylene glycol (meth)acrylate; polyalkylene glycol mono(meth)acrylates, such as polyethylene glycol mono(meth)acrylate; alkanepolyol mono(meth)acrylates, such as glycerol mono(meth)acrylate; (meth)acrylates having an amino group or substituted amino group, such as 2-dimethylaminoethyl (meth)acrylate, 2-diethylaminoethyl (meth)acrylate, and 2-t-butylaminoethyl (meth)acrylate; and glycidyl (meth)acrylate.

Examples of the difunctional (meth)acrylates include alkanediol di(meth)acrylates, such as allyl (meth)acrylate, ethylene glycol di(meth)acrylate, propylene glycol di(meth)acrylate, 1,3-propanediol di(meth)acrylate, 1,4-butanediol di(meth)acrylate, neopentyl glycol di(meth)acrylate, and 1,6-hexanediol di(meth)acrylate; alkanepolyol di(meth)acrylates, such as glycerol di(meth)acrylate; polyalkylene glycol di(meth)acrylates, such as diethylene glycol di(meth)acrylate, triethylene glycol di(meth)acrylate, polyethylene glycol di(meth)acrylate, dipropylene glycol di(meth)acrylate, and polypropylene glycol di(meth)acrylate; di(meth)acrylates of $C_2$-$C_4$ alkylene oxide adducts of bisphenols (bisphenol A, bisphenol S, etc.), such as 2,2-bis[4-((meth)acryloxyethoxy)phenyl]propane, 2,2-bis[4-((meth)acryloxydiethoxy)phenyl]propane, and 2,2-bis[4-((meth)acryloxypolyethoxy)phenyl]propane; acid-modified alkanepolyol di(meth)acrylates, such as fatty acid-modified pentaerythritol; and bridged cyclic di(meth)acrylates, such as tricyclodecane dimethanol di(meth)acrylate and adamantane di(meth)acrylate.

Examples of the difunctional (meth)acrylates also include oligomers and resins, such as epoxy di(meth)acrylates (bisphenol A epoxy di(meth)acrylates, novolac epoxy di(meth)acrylates, etc.), polyester di(meth)acrylates (e.g., aliphatic polyester di(meth)acrylates, aromatic polyester di(meth)acrylates, etc.), (poly)urethane di(meth)acrylates (polyester-based urethane di(meth)acrylates, polyether-based urethane di(meth)acrylates, etc.), and silicon (meth)acrylate.

Examples of the polyfunctional (meth)acrylates include esterification products of a polyvalent alcohol and a (meth)acrylic acid, such as glycerol tri(meth)acrylate, trimethylolpropane tri(meth)acrylate, trimethylolethane tri(meth)acrylate, pentaerythritol tri(meth)acrylate, di(trimethylol)propane tetra(meth)acrylate, pentaerythritol tetra(meth)acrylate, di-pentaerythritol penta(meth)acrylate, and di-pentaerythritol hexa(meth)acrylate. In these polyfunctional (meth)acrylates, the polyvalent alcohol may be an adduct of an alkylene oxide (e.g., $C_2$-$C_4$ alkylene oxide, such as ethylene oxide or propylene oxide).

Among these polyfunctional (meth)acrylates, preference is given to tri- to hexafunctional (meth)acrylates, such as trimethylolpropane tri(meth)acrylate, pentaerythritol tri(meth)acrylate, and pentaerythritol tetra(meth)acrylate; and more preference is given to tri- and tetrafunctional (meth)acrylates, such as pentaerythritol tri(meth)acrylate.

In addition, the polyfunctional (meth)acrylate is preferably a polyfunctional (meth)acrylate not modified with amine (unmodified polyfunctional (meth)acrylate to which no amines are added by Michael addition or by other reaction).

These (meth)acrylates may be used alone or in combination of two or more.

As specific examples of the poly(meth)acrylate having an aminoethyl group applicable to the underlying layer according to the present invention, exemplary compounds PE-1 to PE-9 will be given below. The symbols x and y for an exemplary compound below together represent a ratio of polymerization in that copolymer (hereinafter referred to as "copolymerization ratio"). The copolymerization ratio may be suitably determined depending on required solubility, electrode performance, and/or the like, and may be, for example, x:y=10:90 etc.

[Chemical Formula 23]

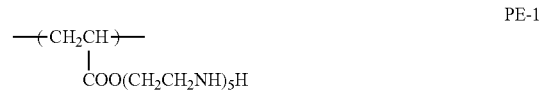

PE-1

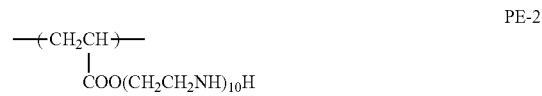

PE-2

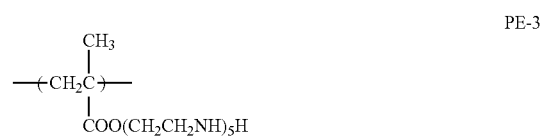

PE-3

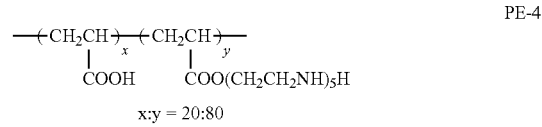

PE-4

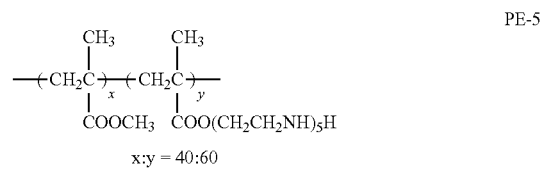

PE-5

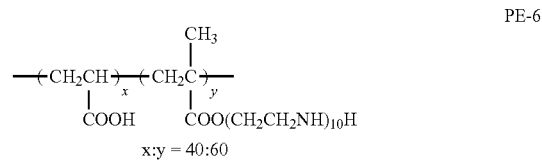

PE-6

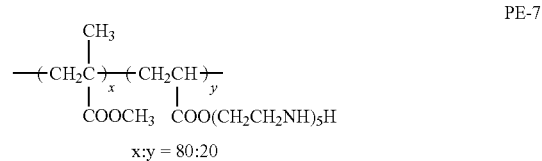

PE-7

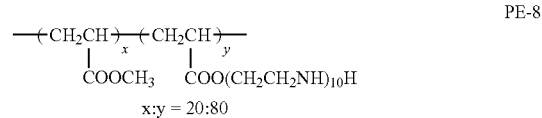

PE-8

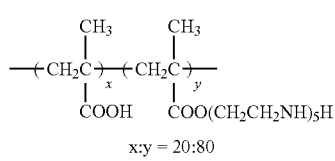

PE-9 x:y = 20:80

The above exemplary compounds PE-1 to PE-9 can each be synthesized using a known method. More specifically, examples of synthesis method include: (i) method including aminoethylation of a (meth)acrylate, and thereafter performing polymerization or copolymerization, and (ii) method including polymerization of a (meth)acrylate, and thereafter performing aminoethylation.

As an example, a method for synthesizing exemplary compound PE-7 will be described below.

[Synthesis Example] Synthesis of Exemplary Compound PE-7

A glass reactor including a thermometer, a stirrer, and a reflux cooler was charged with 80 parts by mass of toluene, and was heated to an internal temperature of 110° C. As an initiator, 1.2 parts by mass of 2,2-azobis-(2-methylbutyronitrile) was added. Then, a mixed solution of 100 parts by mass of methyl methacrylate and 18 parts by mass of acrylic acid was added dropwise for 3 hours, and the resulting mixture was further heated for 4 hours. After completion of the reaction, toluene was added to obtain a carboxy group-containing polymer solution.

A reactor was charged with 120 parts by mass of the above carboxy group-containing polymer solution and 60 parts by mass of toluene. A mixed solution of 53.8 parts by mass of ethylene imine and 30 parts by mass of toluene was added dropwise with stirring at 40° C. for 30 minutes. After the addition, the resulting mixture was maintained at 40° C. for 2 hours to effect the reaction before being heated to an internal temperature of 70° C. Thereafter, the resulting mixture was stirred for 5 hours to further allow the reaction to proceed. Thus, exemplary compound PE-7 was obtained.

According to calculation of the consumed amount of ethylene imine calculated from gas chromatography analysis, the conversion ratio from carboxy group to amino group was 100%.

After this, unreacted ethylene imine was removed by distillation under reduced pressure. Analysis of the polymer solution after the distillation under reduced pressure by gas chromatography having a detection limit of 1 ppm or less showed that no ethylene imine was detected.

In addition, the synthesis methods described in JP 4-356448 A, JP 2003-41000 A, and the like may also be used.

(2) Poly(Meth)Acrylamide Having Aminoethyl Group

Examples of the poly(meth)acrylamide having an aminoethyl group include polymers and copolymers of a (meth)acrylamide having an aminoethyl group.

Examples of the (meth)acrylamide include (meth)acrylamide, N-methyl (meth)acrylamide, N-ethyl (meth)acrylamide, N-propyl (meth)acrylamide, N-butyl (meth)acrylamide, N-benzyl (meth)acrylamide, N-hydroxyethyl (meth)acrylamide, N-phenyl (meth)acrylamide, N-tolyl (meth)acrylamide, N-(hydroxyphenyl) (meth)acrylamide, N-(sulfamoylphenyl) (meth)acrylamide, N-(phenylsulfonyl) (meth)acrylamide, N-(tolylsulfonyl) (meth)acrylamide, N,N-dimethyl (meth)acrylamide, N-methyl-N-phenyl (meth)acrylamide, and N-hydroxyethyl-N-methyl (meth)acrylamide.

As specific examples of the poly(meth)acrylamide having an aminoethyl group applicable to the underlying layer according to the present invention, exemplary compounds PA-1 to PA-12 will be given below. The symbols x and y for an exemplary compound below together represent a copolymerization ratio of that copolymer. The copolymerization ratio may be, for example, x:y=10:90 etc.

[Chemical Formula 24]

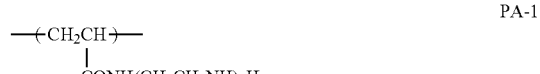

PA-1

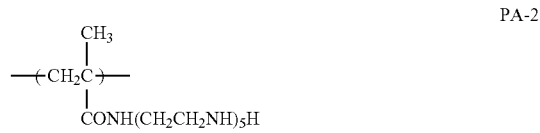

PA-2

PA-3

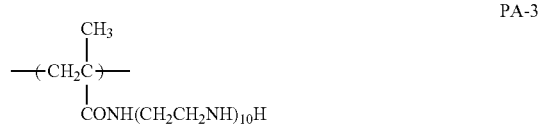

PA-4 x:y = 40:60

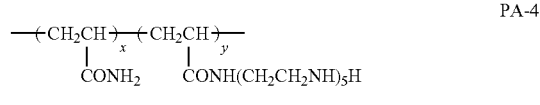

PA-5 x:y = 20:80

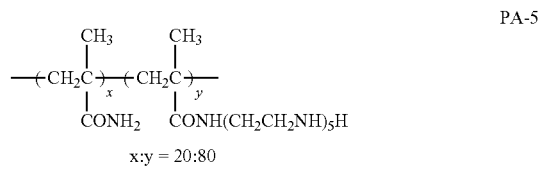

PA-6 x:y = 60:40

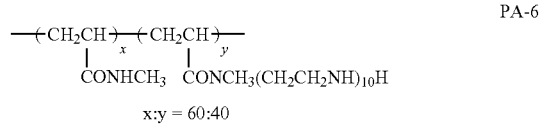

PA-7 x:y = 80:20

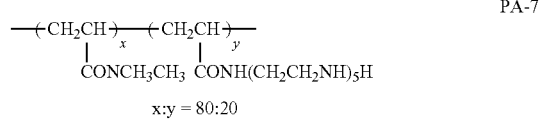

PA-8 x:y = 40:60

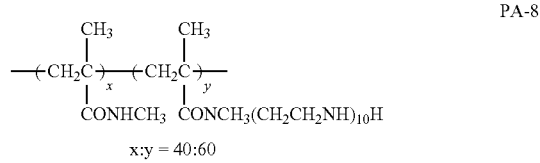

PA-9 x:y = 20:80

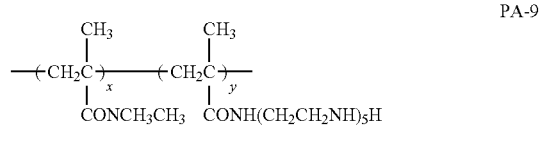

PA-10 x:y = 60:40

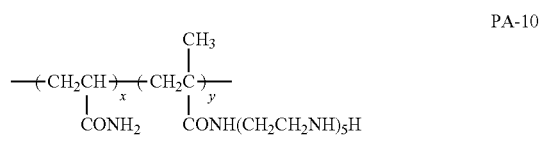

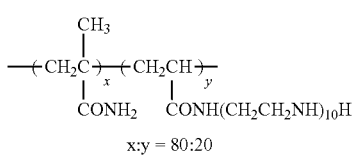

PA-11 x:y = 80:20

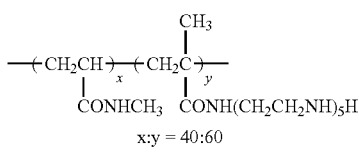

PA-12 x:y = 40:60

The above exemplary compounds PA-1 to PA-12 can each be synthesized using a known method. Aminoethylation of a (meth)acrylamide or aminoethylation of a poly(meth) acrylamide (homopolymer) can be performed similarly to the aminoethylation of a (meth)acrylate or a poly(meth) acrylate as described above.

(Resin)

The resin that mainly constitutes the underlying layer is not particularly limited as long as that resin can form the underlying layer.

For example, a known natural macromolecular material or synthetic macromolecular material having a monomer repeating structure may be used. These resins may be an organic macromolecular material, an inorganic macromolecular material, or an organic-inorganic hybrid macromolecular material, or a mixture thereof. These resins may also be used in combination of two or more thereof.

The resins given above can each be synthesized by a known method. A natural macromolecular material can be obtained by extraction from natural raw material, or produced by a microorganism as in a case of cellulose and/or the like. A synthetic macromolecule can be obtained by, for example, radical polymerization, cationic polymerization, anionic polymerization, coordination polymerization, ring-opening polymerization, polycondensation, addition polymerization, and addition condensation, including living polymerization corresponding thereto.

These resins may each be a homopolymer or a copolymer. If a monomer containing an asymmetric carbon atom is used, the resin can be random, syndiotactic, or isotactic in regularity. In a case of a copolymer, the resin may be a random copolymer, an alternating copolymer, a block copolymer, a graft copolymer, or the like.

The resin itself may be liquid or solid in state. The resin is preferably dissolved in a solvent or homogeneously dispersed in a solvent. In addition, the resin may be a water-soluble resin or a water-dispersible resin.

The resin may be an ionizing radiation-curable resin that is cured by ultraviolet (UV) radiation or by an electron beam, a thermosetting resin that is cured by heat, or a resin produced using a sol-gel process. The resin may also have a cross-linked structure.

In the above resins, the natural macromolecule and the synthetic macromolecule may be, as one example, those described in corresponding sections respectively in pages 1551 and 769 in Kagaku Daijiten (Tokyo Kagaku Dojin, edited by Michinori Ohki, Toshiaki Osawa, Motoharu Tanaka, and Hideaki Chihara, 1989).

Specifically, the natural macromolecular material is preferably a natural organic macromolecular material; and examples thereof include natural fibers, such as cotton, linen, cellulose, silk, and wool; proteins, such as gelatin; and natural rubber. Examples of the synthetic macromolecular material include polyolefin resins, polyacrylic resins, polyvinyl resins, polyether resins, polyester resins, polyamide resins, polyurethane resins, polyphenylene resins, polyimide resins, polyacetal resins, polysulfone resins, fluororesins, epoxy resins, silicon resins, phenolic resins, melamine resins, polyurea resins, polycarbonate resins, and polyketone resins.

Examples of the polyolefin resins include polyethylene, polypropylene, polyisobutylene, poly(1-butene), poly(4-methylpentene), polyvinyl cyclohexane, polystyrene, poly (p-methylstyrene), poly($\alpha$-methylstyrene), polyisoprene, polybutadiene, polycyclopentene, and polynorbornene.

Examples of the polyacrylic resins include polymethacrylate, polyacrylate, polyacrylamide, polymethacrylamide, and polyacrylonitrile.

Examples of the polyvinyl resins include polyvinyl alcohol, polyvinyl chloride, polyvinylidene chloride, poly(vinyl methyl ether), poly(vinyl ethyl ether), and poly(vinyl isobutyl ether).

Examples of the polyether resins include polyalkylene glycols, such as polyethylene oxides and polypropylene oxides.

Examples of the polyester resins include polyalkylene phthalates, such as polyethylene terephthalate and polybutylene terephthalate; and polyalkylene naphthalates, such as polyethylene naphthalate.

Examples of the polyamide resins include polyamide 6, polyamide 6,6, polyamide 12, and polyamide 11. Examples of the fluororesins include polyvinylidene fluoride, polyvinyl fluoride, polytetrafluoroethylene, ethylene-tetrafluoroethylene copolymer, and polychlorotrifluoroethylene.

The above-mentioned term "water-soluble resin" herein means a resin, at least 0.001 grams (g) of which is dissolved in 100 g of water at 25° C. The degree of dissolution can be determined using a hazemeter, a turbidimeter, or the like. The color of the water-soluble resin is not particularly limited, but is preferably transparent. The water-soluble resin preferably has a number average molecular weight in a range from 3000 to 2000000, more preferably in a range from 4000 to 500000, and still more preferably in a range from 5000 to 100000.

The number average molecular weight and the molecular weight distribution of the water-soluble resin can be determined by a gel permeation chromatography (GPC) method generally known. The solvent used therefor is not particularly limited as long as the solvent dissolves the binder, but is preferably tetrahydrofuran (THF), dimethylformamide (DMF), or dichloromethane ($CH_2Cl_2$), more preferably THF or DMF, and still more preferably DMF. The measurement temperature is also not particularly limited, but is preferably 40° C.

Specifically, examples of the water-soluble resin include natural macromolecular materials and synthetic macromolecular materials including acryl-based, polyester-based, polyamide-based, polyurethane-based, and fluorine-based resins; and more specifically, include polymers such as casein, starch, agar, carrageenan, cellulose, hydroxyethyl cellulose, carboxymethyl cellulose, hydroxyethyl cellulose, dextran, dextrin, pullulan, polyvinyl alcohols, gelatin, polyethylene oxides, polyvinyl pyrrolidone, polyacrylates, polymethacrylates, poly(2-hydroxyethyl acrylate), poly(2-hydroxyethyl methacrylate), polyacrylamide, polymethacrylamide, polystyrene sulfonates, and water-soluble polyvinyl butyral.

The above-mentioned term "water-dispersible resin" herein means a resin that is homogeneously dispersible in an aqueous solvent, and is thus dispersed as colloidal particles formed of resin without aggregation in the aqueous solvent. The colloidal particles typically have a size (average particle size) in a range from about 1 to 1000 nm. The average particle size of the colloidal particles described above can be determined by a light scattering photometer.

The above-mentioned term "aqueous solvent" means, not only pure water such as distilled water and deionized water, but also aqueous solutions each containing an acid, an alkali, a salt, or the like; and solvents such as aqueous organic solvents and even hydrophilic organic solvents. Examples thereof include alcoholic solvents such as methanol and ethanol, and mixed solvents of water and alcohols. The water-dispersible resin is preferably transparent. The water-dispersible resin is not particularly limited as long as the water-dispersible resin is a medium to form a film. Examples of the water-dispersible resin include aqueous acrylic resins, aqueous urethane resins, aqueous polyester resins, aqueous polyamide resins, and aqueous polyolefin resins.

Examples of the aqueous acrylic resins include polymers of vinyl acetate, acrylic acid, and acrylic acid-styrene, and copolymers thereof with other monomer. The aqueous acrylic resins are classified into following types: anionic resins whose acid moiety providing the dispersion property into aqueous solvent forms a counter salt with an ion such as a lithium, sodium, potassium, or ammonium ion; cationic resins formed of a copolymer with monomers having a nitrogen atom, in which the nitrogen atom forms a hydrochloride or the like; and non-ionic resins containing a moiety such as a hydroxy group or an ethylene oxide moiety. Among these, an anionic resin is preferred.

Examples of the aqueous urethane resins include water-dispersible urethane resins, ionomer-based aqueous urethane resins (anionic), and the like. Examples of the water-dispersible urethane resins include polyether-based urethane resins and polyester-based urethane resins, and polyester-based urethane resins are preferred. Note that, for optical applications, an isocyanate without yellowing having no aromatic ring is preferably used.

Examples of the ionomer-based aqueous urethane resins include polyester-based urethane resins, polyether-based urethane resins, and polycarbonate-based urethane resins. Among these, polyester-based urethane resins and polyether-based urethane resins are preferred.

An aqueous polyester resin is synthesized from a polybasic acid component and a polyol component.

Examples of the polybasic acid component include terephthalic acid, isophthalic acid, phthalic acid, naphthalene-dicarboxylic acid, adipic acid, succinic acid, sebacic acid, and dodecanedioic acid. These may be used alone or in combination of two or more. In regard to polybasic acid components that can be particularly suitably used, terephthalic acid and isophthalic acid are particularly preferred in view of availability in industrial mass production and low price.

Examples of the polyol component include ethylene glycol, propylene glycol, 1,4-butanediol, 1,6-hexanediol, neopentyl glycol, diethylene glycol, dipropylene glycol, cyclohexanedimethanol, and bisphenols. These may be used alone or in combination of two or more. In regard to polyol components that can be particularly suitably used, ethylene glycol, propylene glycol, or neopentyl glycol is particularly preferred in view of a good balance of characteristics, including availability in industrial mass production, low price, and improvements in solvent resistance and in weather resistance of the resin coating.

Examples of the inorganic macromolecular material include polysiloxanes, polyphosphazenes, polysilanes, polygermanes, polystannanes, borazine-based polymers, polymetaloxanes, polysilazanes, titanium oligomers, and silane-coupling agents. Examples of the polysiloxane specifically include silicon, silsesquioxanes, and silicon resins.

Examples of the organic-inorganic hybrid macromolecular material include polycarbosilanes, poly[(silylene)arylene]s, polysiloles, polyphosphines, polyphosphine oxides, poly(ferrocenylsilane)s, silsesquioxane derivatives containing silsesquioxane as the basic skeleton, and silica-filled resins.

Examples of the silsesquioxane derivatives containing silsesquioxane as the basic skeleton specifically include SQ series photocurable resins (Toagosei Co., Ltd.), Compoceran SQ (Arakawa Chemical Industries, Ltd.), and Sila-DEC (Chisso Corporation). Examples of the silica-filled resins include Compoceran series (Arakawa Chemical Industries, Ltd.).

The resin may be a curable resin, such as an ionizing radiation-curable resin or a thermosetting resin. An ionizing radiation-curable resin is a resin curable by a general method for curing an ionizing radiation-curable resin composition, that is, by irradiation with an electron beam or UV radiation.

For example, electron beam curing uses an electron beam having energy ranging from 10 to 1000 keV, preferably ranging from 30 to 300 keV, emitted from various types of electron beam accelerator, such as a Cockcroft-Walton accelerator, Van de Graaff accelerator, resonance transformer accelerator, insulated-core transformer accelerator, linear accelerator, Dynamitron accelerator, radio frequency accelerator, or other accelerator; or the like.

UV curing can be performed using UV radiation emitted from radiation of an ultrahigh pressure mercury lamp, a high pressure mercury lamp, a low pressure mercury lamp, a carbon arc lamp, a xenon arc lamp, a metal halide lamp, or other light source; or the like. Examples of UV irradiator specifically include a rare gas excimer lamp for emitting vacuum UV radiation having a wavelength ranging from 100 to 230 nm. An excimer lamp has a high light emission efficiency, and can thus emit light with low power input. In addition, an excimer lamp emits no long-wavelength light, which may cause a temperature rise, and emits energy having a single wavelength in the UV region, thereby enabling a temperature rise to be avoided in the irradiation target due to irradiation light itself.

A thermosetting resin is a resin that is cured by heating, and preferably contains a cross-linking agent in the resin. As the method for heating a thermosetting resin, a conventionally known method may be used, and heater heating, oven heating, infrared radiation heating, laser heating, or the like is used.

The resin for use in the underlying layer may contain a surface energy modifying agent. Addition of a surface energy modifying agent enables adjustment of the adhesion between the patterned metal thin wiring and the underlying layer, the wire width of the patterned metal thin wiring, and the like.

(Oxide Particle)

The material of the oxide particles that can be added in the underlying layer is not particularly limited as long as the oxide particles are applicable to the transparent electrode. Addition of the oxide particles in the resin enables adjustment, as appropriate, of physical properties such as film strength, stretchability, and refractive index, of the underlying layer, and also improves adhesion to the patterned metal thin wiring. Examples of the oxide particle material include oxides of metals such as magnesium, aluminum, silicon, titanium, zinc, yttrium, zirconium, molybdenum, tin, barium, and tantalum. In particular, the oxide particle material is preferably one of titanium oxides, aluminum oxides, silicon oxides, and zirconium oxides.

The oxide particles preferably have an average particle size in a range from 5 to 300 nm, and in view of suitable applicability in a transparent electrode, particularly preferably in a range from 5 to 100 nm. Use of oxide particles having the average particle size in the above range enables sufficient irregularities to be generated on the surface of the underlying layer to improve adhesion to the patterned metal thin wiring. An average particle size of 100 nm or less results in a smooth surface, thereby creating only a small effect on the organic electronic device.

The average particle size of oxide particles can be conveniently determined using a commercially available measurement device that employs a light scattering technique. Specifically, a value may be used that is determined using 1 ml of a sample diluent at 25° C. using Zetasizer 1000 (product of Malvern Ltd.) using a laser Doppler method.

The oxide particles are contained in the underlying layer in an amount preferably in a range from 10 to 70% by volume, and more preferably in a range from 20 to 60% by volume.

Titanium oxide fine particles among those as described above can be synthesized using one of the synthesis methods described in JP 59-223231 A, JP 10-265223 A, JP 2009-179497 A, JP 2010-058047 A, JP 2008-303126 A, WO 2001/016027 A, and the like, or with reference to "Titanium Oxide—Properties and practical technology (Sankachitan-Bussei to Ouyougijyutu)" (Manabu Kiyono, Gihodo Shuppan Co., Ltd., pp. 255-258).

In addition, the oxide particles may be surface treated in view of improvement in dispersibility and stability if the oxide particles are used in dispersion liquid. If the oxide particles are surface treated, examples of the specific material for surface treatment include dissimilar inorganic oxides such as silicon oxides and zirconium oxides; metal hydroxides such as aluminum hydroxide; organosiloxane; and organic acids such as stearic acid. These surface treatment materials may be used alone or in combination of multiple ones thereof. Among these, in view of stability of the dispersion liquid, the surface treatment material is preferably at least one of a dissimilar inorganic oxide and a metal hydroxide, and more preferably a metal hydroxide.

The underlying layer may further contain an inorganic compound other than the oxide particle material. The term "inorganic compound" refers to compounds other than organic compounds as is generally understood, and specifically, refers to certain simple carbon compounds, and compounds formed of elements other than carbon. Typical examples of the inorganic compound to be included in the underlying layer include, in addition to the metal oxides described above, metals, carbides, nitrides, and borides.

(Method of Forming Underlying Layer)

The underlying layer is formed by dispersing a resin and a thiol group-containing compound or the like in a solvent to prepare an underlying layer-forming dispersion liquid, and then applying this underlying layer-forming dispersion liquid onto a substrate.

The dispersion solvent used for the underlying layer-forming dispersion liquid is not particularly limited, but a solvent that will not cause precipitation of the resin or aggregation of the thiol group-containing compound and/or the like is preferably selected. If the underlying layer contains oxide particles, it is preferable that, in view of dispersibility, the resin, the thiol group-containing compound or the like, and the oxide particles contained in the mixture liquid be dispersed by a method such as ultrasonic treatment or bead-milling, and the resulting mixture be filtered through a filter or the like in view of avoidance of deposition of aggregates of metal oxide on the substrate after drying after application.

The method of forming the underlying layer may be any appropriate method. Examples of application method include various printing methods such as gravure printing, flexographic printing, offset printing, screen printing, and inkjet printing; and further include various application methods such as roll coating, bar coating, dip coating, spin coating, casting, die coating, blade coating, curtain coating, spray coating, and doctor coating.

If the underlying layer is to be formed in a predetermined pattern, gravure printing, flexographic printing, offset printing, screen printing, or inkjet printing is preferably used.

The underlying layer is formed by forming the application method described above on the substrate, and then drying the underlying layer applied, by a known heat-drying technique such as heated-air drying or infrared drying, or by natural drying. If a heat-drying technique is used, the temperature can be selected as appropriate depending on the substrate used, but is preferably 200° C. or lower.

Moreover, as described above, depending on the resin used, the underlying layer may be treated by curing using optical energy of UV radiation, excimer light, or the like; thermally curing that has only a slight adverse effect on the substrate; or other treatment. Among these, curing by excimer light is a preferred aspect.

Otherwise, if a polar solvent having a hydroxy group, such as water, or a low-boiling point solvent having a boiling point of 200° C. or lower is selected as the dispersion solvent that is used for the underlying layer-forming dispersion liquid, the drying is preferably performed using an infrared heater having a light source whose filament temperature will be in a range from 1600 to 3000° C. The absorption region of the hydroxy group at a specific wavelength of the radiation emitted from such infrared heater enables the solvent to be dried. In contrast, polyethylene terephthalate (PET) and polyethylene naphthalate (PEN) that may form the substrate exhibit only low absorption at the specific wavelength of the radiation emitted from the infrared heater, thereby resulting in only slight thermal damage in the substrate.

Examples of the polar solvent having a hydroxy group include, in addition to water (preferably pure water, such as distilled water and deionized water), alcoholic solvents such as methanol and ethanol, glycols, glycol ethers, and mixed solvent of water and alcohol.

Examples of the glycol ether-based organic solvents specifically include ethyl Carbitol and butyl Carbitol.

Examples of the alcoholic organic solvents specifically include, in addition to methanol and ethanol as described above, 1-propanol, 2-propanol, n-butanol, 2-butanol, diacetone alcohol, and butoxyethanol.

<Conductive Layer (13)>

The conductive layer according to the present invention may consist of a patterned metal thin wiring, but preferably includes a first conductive layer (patterned metal thin wiring) and a second conductive layer (metal oxide layer or organic conductive layer).

(First Conductive Layer: Patterned Metal Thin Wiring (13a))

The patterned metal thin wiring mainly contains metal, and has a metal content ratio sufficient to provide electrical conductivity. The ratio of the metal in the patterned metal thin wiring is preferably 50 percent by mass (mass %) or higher.

The patterned metal thin wiring contains a metallic material, and is formed in a specific pattern having an opening over the underlying layer. As used herein, the term "opening" refers to a portion without the patterned metal thin wiring, i.e., a light transmissive portion through the patterned metal thin wiring in a case in which a transparent substrate is used.

The specific pattern of the patterned metal thin wiring is not particularly limited. Examples of the specific pattern of the patterned metal thin wiring include a stripe (parallel lines), a grid, a honeycomb, and a random mesh pattern. In view of transparency, a stripe pattern is particularly preferred.

In a case in which a transparent substrate is used as the substrate, the ratio of the opening, i.e., the opening ratio is preferably 80% or higher in view of transparency. For example, a stripe pattern having a wire width of 100 μm and a wire-to-wire spacing of 1 mm has an opening ratio of about 90%.

The patterned metal thin wiring preferably has a wire width in a range from 10 to 200 μm, and more preferably in a range from 10 to 100 μm. A wire width of the patterned metal thin wiring of 10 μm or more provides desired electrical conductivity, and a wire width of the patterned metal thin wiring of 200 μm or less improves transparency of the transparent electrode. In a stripe or a grid pattern, the patterned metal thin wiring preferably has a wire-to-wire spacing in a range from 0.5 to 4 mm.

The patterned metal thin wiring preferably has a height (thickness) in a range from 0.1 to 5.0 μm, and more preferably in a range from 0.1 to 2.0 μm. A height of the patterned metal thin wiring of 0.1 μm or more provides desired electrical conductivity, and a height of the patterned metal thin wiring of 5.0 μm or less can reduce the effect of surface irregularities of the patterned metal thin wiring on the layer thickness distribution of the functional layer in a case of being applied to an organic electronic device.

(1) Metallic Ink Composition

As described below, the patterned metal thin wiring is preferably formed by preparing a metallic ink composition containing a metal or a metal source material blended therewith; applying the metallic ink composition; and selecting and performing post-treatment, such as a drying process or a sintering process, as appropriate.

The metal (elemental metal or alloy) blended with the metallic ink composition is preferably in the form of particles or fibers (tubular, wire-shaped, etc.), and more preferably in the form of metal nanoparticles. In addition, the metallic ink composition is preferably formed of a metal source material containing a metal atom (element) to release a metal component upon a structural change such as decomposition. The metallic ink composition may contain only one, or two or more, of metals and metal source materials. If two or more of metals and metal source materials are contained, the combination and the ratio of the materials may be arbitrarily determined.

Examples of the metal used for metal nanoparticles include metals such as gold, silver, copper, and platinum, or alloys mainly containing these metals. Among these, gold and silver are preferred in view of high light reflectance to further improve the efficiency of an organic electronic device produced. These metals or alloys may be used alone or in combination of two or more as appropriate.

The metallic ink composition is preferably a metal colloid or a metal nanoparticle-dispersed liquid each containing the metal nanoparticles having a surface coated with a protective agent, and stably dispersed individually in the solvent.

The metal nanoparticles applied in the metallic ink composition preferably have an average particle size in a range from an atomic scale to 1000 nm or less. In particular, the metal nanoparticles preferably have an average particle size in a range from 3 to 300 nm, and more preferably in a range from 5 to 100 nm. Among these, silver nanoparticles having an average particle size in a range from 3 to 100 nm are preferred. In addition, among metal nanowires, a silver nanowire having a width greater than or equal to 1 nm and less than 1000 nm, preferably in a range from 1 to 100 nm, is preferred.

The average particle size of metal nanoparticles, the average particle size of nanoparticles contained in a metal colloid, and the width of a metal nanowire can be determined by measuring the particle sizes of metal nanoparticles in these dispersion mixtures and the width of the metal nanowire using a transmission electron microscope (TEM). For example, the average particle size can be calculated by measuring the particle sizes of three hundred non-overlapping independent metal nanoparticles among the particles observed in a TEM image.

In a case of a metal colloid, the protective agent to coat the surfaces of the metal nanoparticles is preferably a π-bonded organic ligand material. Pi (π) bonding to a metal nanoparticle by a π-conjugated organic ligand provides electrical conductivity to the metal colloid.

The π-bonded organic ligand material described above is preferably a compound of one or two or more selected from the group consisting of phthalocyanine derivatives, naphthalocyanine derivatives, and porphyrin derivatives.

To improve coordination property to a metal nanoparticle and dispersibility in the dispersion medium, the π-bonded organic ligand preferably has at least one type of substituent selected from: amino, alkylamino, mercapto, hydroxy, carboxy, phosphine, phosphonate, sulfonate, halogen, selenol, sulfide, selenoether, amide, imide, cyano, and nitro groups, and salts thereof, as a substituent.

As the π-bonded organic ligand material, the π-conjugated organic ligand material described in WO 2011/114713 A may be used.

As the specific compound of the π-bonded organic ligand, one or two or more selected from OTAN, OTAP, and OCAN given below are preferably used.

OTAN: 2,3,11,12,20,21,29,30-octakis[(2-N,N-dimethylaminoethyl)thio]naphthalocyanine, OTAP: 2,3,9,10,16,17,23,24-octakis[(2-N,N-dimethylaminoethyl)thio]phthalocyanine, and OCAN: 2,3,11,12,20,21,29,30-naphthalocyanine octacarboxylic acid.

Examples of the method for preparing the metal nanoparticle-dispersed liquid containing the π-bonded organic ligands include a liquid phase reduction method. The π-bonded organic ligand of this embodiment can be produced, and the metal nanoparticle-dispersed liquid containing the π-bonded organic ligand can be prepared, according to the method described in paragraphs 0039 to 0060 of WO 2011/114713 A.

The nanoparticles contained in the metal colloid usually have an average particle size in a range from 3 to 500 nm, and preferably in a range from 5 to 50 nm. An average particle size of the nanoparticles contained in the metal colloid in the above range facilitates bonding between particles, thereby enabling the electrical conductivity of the patterned metal thin wiring produced to be improved.

The protective agent coating the surfaces of the metal nanoparticles in the metal nanoparticle-dispersed liquid is preferably a protective agent that allows ligands to be desorbed at a low temperature of 200° C. or lower. This feature causes the protective agent to be desorbed at a low temperature or at low energy to cause metal nanoparticles to bond together, thereby providing electrical conductivity.

Specifically, the metal nanoparticle-dispersed liquids described in JP 2013-142173 A, JP 2012-162767 A, JP 2014-139343 A, JP 5606439 B1, and the like are exemplified.

Examples of the metal source material include metal salts, metal complexes, and organic metal compounds (compounds having a metal-carbon bond). The metal salts and the metal complexes may each be either a metal compound having an organic group or a metal compound without an organic group. Use of a metal source material in the metallic ink composition enables a metal component to be released from the material to form the patterned metal thin wiring containing that metal.

The source material of metallic silver is preferably an organic silver complex produced by reaction between a silver compound represented by "$Ag_nX$" and an ammonium carbamate-based compound, where n is an integer from 1 to 4 inclusive, and X represents a substituent selected from a group consisting of: oxygen, sulfur, halogens, cyano groups, cyanates, carbonates, nitrates, nitrites, sulfates, phosphates, thiocyanates, chlorates, perchlorates, tetrafluoroborates, acetylacetonates, and carboxylates.

Examples of the above silver compound include silver oxide, silver thiocyanate, silver cyanide, silver cyanate, silver carbonate, silver nitrate, silver nitrite, silver sulfate, silver phosphate, silver perchlorate, silver tetrafluoroborate, silver acetylacetonate, silver acetate, silver lactate, and silver oxalate. The silver compound is preferably silver oxide or silver carbonate in view of reactivity and post-treatment.

Examples of the ammonium carbamate-based compound include ammonium carbamate, ethylammonium ethylcarbamate, isopropylammonium isopropylcarbamate, n-butylammonium n-butylcarbamate, isobutylammonium isobutylcarbamate, t-butylammonium t-butylcarbamate, 2-ethylhexylammonium 2-ethylhexylcarbamate, octadecylammonium octadecylcarbamate, 2-methoxyethylammonium 2-methoxyethylcarbamate, 2-cyanoethylammonium 2-cyanoethylcarbamate, dibutylammonium dibutylcarbamate, dioctadecylammonium dioctadecylcarbamate, methyldecylammonium methyldecylcarbamate, hexamethyleneiminium hexamethyleneiminecarbamate, morpholinium morpholinecarbamate, pyridinium ethylhexylcarbamate, triethylenediaminium isopropylbicarbamate, benzylammonium benzylcarbamate, and triethoxysilylpropylammonium triethoxysilylpropylcarbamate. Among these ammonium carbamate-based compounds, alkylammonium alkylcarbamates containing a primary amine substituent are preferred in view of higher reactivity and higher stability than the reactivity and the stability of secondary and tertiary amines.

The above organic silver complex can be produced by the method described in JP 2011-48795 A. An example of the synthesis method is to effect direct reaction, without using a solvent, between one or more of the silver compounds described above and one or more of the ammonium carbamate-based compounds described above in a nitrogen atmosphere under normal pressure or increased pressure. This synthesis may also be performed by reaction using one of solvents such as alcohols, such as methanol, ethanol, isopropanol, and butanol; glycols, such as ethylene glycol and glycerol; acetates, such as ethyl acetate, butyl acetate, and Carbitol acetate; ethers, such as diethyl ether, tetrahydrofuran, and dioxane; ketones, such as methyl ethyl ketone and acetone; hydrocarbon-based solvents, such as hexane and heptane; aromatic compounds, such as benzene and toluene; and halogen-substituted solvents, such as chloroform, methylene chloride, and carbon tetrachloride.

The structure of an organic silver complex can be represented by "$Ag[A]_m$," where A represents one of the ammonium carbamate-based compounds described above, and m is a value ranging from 0.7 to 2.5.

The above organic silver complexes are highly soluble in various solvents, including solvents that form an organic silver complex, such as alcohols such as methanol, esters such as ethyl acetate, and ethers such as tetrahydrofuran. Therefore, an organic silver complex is easily applicable to application processes and printing processes as a metallic ink composition.

Examples of the metallic silver source material also include silver carboxylates having a group represented by the formula "—COOAg." The silver carboxylate used is not particularly limited as long as the silver carboxylate has a group represented by the formula "—COOAg." For example, the silver carboxylate used may have only one group, or two or more groups, represented by the formula "—COOAg." The silver carboxylate used may have the group(s) represented by the formula "—COOAg" at any position(s).

The silver carboxylate is preferably one or more selected from the group consisting of silver β-ketocarboxylate and silver carboxylate (4) each described in JP 2015-66695 A. Note that the metallic silver source material is not limited to silver β-ketocarboxylate or silver carboxylate (4), but may generally be a silver carboxylate having a group represented by the formula "—COOAg," including these materials.

If the metallic ink composition contains any of the above silver carboxylates as the metal source material, one or more nitrogen-containing compounds are preferably blended, which are selected from the group consisting of amine compounds and quaternary ammonium salts each containing 25 or less carbon atoms; ammonia; and ammonium salts formed by reaction between an amine compound or ammonia and an acid, together with the silver carboxylate.

The amine compound has 1 to 25 carbon atoms, and may be any of primary, secondary and tertiary amines. The quaternary ammonium salt has 4 to 25 carbon atoms. The amine compound and the quaternary ammonium salt may have a chain or ring structure. The number of nitrogen atoms contained in the amine moiety or in the ammonium salt moiety (e.g., the number of nitrogen atoms contained in the amino group "—$NH_2$" of a primary amine) may be one, or two or more.

(2) Method of Forming Patterned Metal Thin Wiring

Next, the method of forming the patterned metal thin wiring will be described. The patterned metal thin wiring is formed using the metallic ink composition. The method of forming the patterned metal thin wiring is not particularly limited, and may be a conventionally known method. Examples of such conventionally known method of forming the patterned metal thin wiring include methods based on a photolithographic method, an application method, and a printing method.

The metallic ink composition contains the above metal nanoparticles and the above solvent, and may also contain additives such as a dispersant, a viscosity modifying agent, and/or a binder. The solvent contained in the metal nanoparticle-containing composition is not particularly limited, but in view of efficient volatilization of the solvent under irradiation with mid-infrared radiation, the solvent is preferably a compound having a hydroxy group, and water, an alcohol, or a glycol ether.

Examples of the solvent for use in the metal nanoparticle-containing composition include water, methanol, ethanol, propanol, butanol, pentanol, hexanol, heptanol, octanol, nonanol, decanol, undecanol, dodecanol, tetradecanol, hexadecanol, hexanediol, heptanediol, octanediol, nonanediol, decanediol, farnesol, dodecadienol, linalool, geraniol, nerol, heptadienol, tetradecenol, hexadeceneol, phytol, oleyl alcohol, dodecenol, decenol, undecylenyl alcohol, nonenol, citronellol, octenol, heptenol, methylcyclohexanol, menthol, dimethylcyclohexanol, methylcyclohexenol, terpineol, dihydrocarveol, isopulegol, cresol, trimethylcyclohexenol, glycerol, ethylene glycol, polyethylene glycol, diethylene glycol, triethylene glycol, tetraethylene glycol, hexylene glycol, propylene glycol, dipropylene glycol, tripropylene glycol, neopentyl glycol, butanediol, pentanediol, heptanediol, propanediol, hexanediol, octanediol, ethylene glycol monoethyl ether, ethylene glycol monobutyl ether, diethylene glycol monomethyl ether, diethylene glycol monoethyl ether, diethylene glycol monobutyl ether, diethylene glycol dimethyl ether, diethylene glycol diethyl ether, triethylene glycol monobutyl ether, dipropylene glycol monomethyl ether, dipropylene glycol monoethyl ether, and tripropylene glycol monomethyl ether.

If the pattern of the metal nanoparticle-containing composition is to be formed using a printing method, a method for forming an electrode pattern is generally applicable. Specific examples thereof include the methods described in JP 2009-295980 A, JP 2009-259826 A, JP 2009-96189 A, JP 2009-90662 A, etc. for gravure printing; the methods described in JP 2004-268319 A, JP 2003-168560 A, etc. for flexographic printing; the methods described in JP 2010-34161 A, JP 2010-10245 A, JP 2009-302345 A, etc. for screen printing; and the methods described in JP 2011-180562 A, JP 2000-127410 A, JP 8-238774 A, etc. for inkjet printing.

If the pattern of the metal nanoparticle-containing composition is to be formed using a photolithographic method, in specific, the metallic ink composition is disposed on the entire surface of the underlying layer by a printing or application method; a drying process and a sintering process described later herein are performed; and then the resulting surface is etched by a known photolithographic method to obtain a desired pattern.

Next, the metal nanoparticle-containing composition applied over the underlying layer is dried. This drying process can be performed using a known drying method. Examples of the drying method include air cooling drying, convection heat transfer drying using warm air or the like, radiation electrothermal drying using infrared radiation or the like, conduction heat transfer drying using a hot plate or the like, vacuum drying, internal heat drying using a microwave, IPA vapor drying, Marangoni drying, Rotagoni drying, and freeze drying.

Heat drying is preferably performed at a temperature in a range from 50 to 200° C. that will not deform the substrate. The heat drying is more preferably performed under a condition in which the substrate will have a surface temperature in a range from 50 to 150° C. If the substrate is a PET substrate, heating is particularly preferably performed at a temperature of 100° C. or lower. The bake time depends on the temperature and the size of the metal nanoparticles used, but is preferably in a range from 10 seconds to 30 minutes, and in view of productivity, more preferably in a range from 10 seconds to 15 minutes, and particularly preferably in a range from 10 seconds to 5 minutes.

The drying process is preferably a drying process using infrared radiation. In particular, it is preferred that infrared radiation in a specific wavelength region be selectively emitted using a wavelength control infrared heater or the like. Selective use of a specific wavelength region enables the radiation to be cut off at wavelengths in the absorption region of the substrate, and/or the radiation to be selectively emitted at a specific wavelength effective on the solvent in the metallic ink composition. Among others, an infrared heater is preferably used that has a light source whose filament temperature will be in a range from 1600 to 3000° C.

Next, the patterned structure of the dried metallic ink composition is sintered. Note that a certain metal composition contained in the metallic ink composition (e.g., silver colloid containing π-bonded organic ligands described above, and the like) exhibits a sufficient level of electrical conductivity after the drying process, and thus needs no sintering process.

The patterned structure of the metallic ink composition is preferably sintered by light irradiation using a flash lamp (flash sintering) in view of improvement in electrical conductivity of the transparent electrode. The discharge tube of the flash lamp for use in flash sintering may be a discharge tube of xenon, helium, neon, argon, or the like, and is preferably a xenon lamp.

The flash lamp preferably has a spectral band in a range from 240 to 2000 nm. Radiation in this spectral band has only a slight adverse effect on the substrate, such as thermal deformation, by flash sintering.

The light irradiation condition of the flash lamp is not particularly limited. However, total light irradiation energy is preferably in a range from 0.1 to 50 J/cm$^2$, and more preferably in a range from 0.5 to 10 J/cm$^2$.

The light irradiation duration is preferably in a range from 10 microseconds (μsec) to 100 milliseconds (msec), and more preferably in a range from 100 μsec to 10 msec. The number of times of the light irradiation may be one, or two or more, and preferably in a range from 1 to 50. Flash light irradiation under these preferred conditions enables the patterned metal thin wiring to be formed without adversely affecting the substrate.

The flash light of the flash lamp is preferably emitted toward the substrate from the side on which the patterned structure of the metallic ink composition is formed, with respect to the substrate. However, if the substrate is transparent, the flash light may be emitted from the substrate side, or emitted from both sides of the substrate.

The surface temperature of the substrate during the flash sintering can be determined in consideration of the heat resistance temperature of the substrate, the boiling point (vapor pressure) of the dispersion medium of the solvent contained in the metallic ink composition, the atmospheric gas and the pressure thereof, thermal behavior, such as dispersibility and oxidation property, of the metallic ink composition, and the like. The flash sintering is preferably performed at a surface temperature in a range from room temperature (25° C.) to 200° C.

The light irradiation device of the flash lamp is not particularly limited as long as the irradiation energy and the irradiation duration described above are satisfied. The flash sintering may be performed in the air, but may be performed in an inert gas atmosphere, as needed, such as nitrogen, argon, or helium.

(Second Conductive Layer: Metal Oxide Layer or Organic Conductive Layer (13b))

The metal oxide layer and the organic conductive layer according to the present invention are disposed over the underlying layer to cover the surface of the patterned metal thin wiring.

The metal oxide layer and the organic conductive layer are preferably formed using a highly electrically conductive metal oxide having a volume resistivity in a range from $1\times10^{-3}$ to $1\times10^{-2}$ Ωcm. The volume resistivity can be determined by measuring the sheet resistance measured according to JIS K 7194-1994 "Testing method for resistivity of conductive plastics with a four-point probe array," and the film thickness. A film thickness can be measured using a contact profiler (e.g., Dektak) or an optical interference profiler (e.g., WYKO).

In view of the function of securing electrical conductivity, the metal oxide layer and the organic conductive layer each preferably have a sheet resistance of 10000 ohms/square (Ω/sq.) or less, and more preferably of 2000 Ω/sq. or less.

(1) Metal Oxide Layer

The metal oxide applicable to the metal oxide layer is not particularly limited as long as the metal oxide has high transparency and high electrical conductivity. Examples of the metal oxide applicable to the metal oxide layer include tin-doped indium oxide (ITO), indium oxide-zinc oxide (IZO), gallium-doped indium oxide (IGO), indium oxide-tin oxide (IWZO), zinc oxide (ZnO), Ga-doped zinc oxide (GZO), and indium gallium zinc oxide (IGZO).

Among these, the metal oxide applicable to the metal oxide layer is preferably IZO, IGO, or IWZO. In particular, as far as IZO is concerned, a composition having a mass ratio of $In_2O_3$:ZnO=80:20 to 95:5 is preferred; as far as IGO is concerned, a composition having a mass ratio of $In_2O_3$:$Ga_2O_3$=70:30 to 95:5 is preferred; and as far as IWZO is concerned, a composition having a mass ratio of $In_2O_3$:$WO_3$:ZnO=95:2.5:2.5 to 99.8:0.1:0.1 is preferred.

Note that the transparent electrode may include multiple metal oxide layers.

(1-1) Method of Forming Metal Oxide Layer

The metal oxide layer can be formed by various sputtering, ion plating, and other methods as in the case of forming a conventional metal oxide layer.

Examples of the sputtering method include DC sputtering, RF sputtering, DC magnetron sputtering, RF magnetron sputtering, ECR plasma sputtering, and ion beam sputtering.

As far as sputtering methods are concerned, taking into consideration various conditions as described below enables the electrical conductivity and the gas barrier property to be adjusted even for materials having a same composition such as IZO.

For example, the metal oxide layer can be formed by direct current magnetron sputtering under the conditions including the target-to-substrate distance for sputtering in a range from 50 to 100 mm, and the sputtering gas pressure in a range from 0.5 to 1.5 Pa.

A target-to-substrate distance less than 50 mm results in high kinetic energy of deposited sputtered particles, thereby adversely affecting the substrate, and also results in a non-uniform film thickness, which results in an unfavorable film thickness distribution. A target-to-substrate distance greater than 100 mm provides an improved film thickness distribution, but results in excessively low kinetic energy of the deposited sputtered particles. This hinders densification resulting from diffusion, thereby reducing the density of the metal oxide layer. Thus, a target-to-substrate distance greater than 100 mm is unfavorable.

A sputtering gas pressure less than 0.5 Pa results in high kinetic energy of deposited sputtered particles, thereby adversely affecting the substrate. A sputtering gas pressure greater than 1.5 Pa results in not only a low deposition rate, but also excessively low kinetic energy of the deposited sputtered particles. This hinders densification resulting from diffusion, thereby reducing the density of the metal oxide layer. Thus, a sputtering gas pressure greater than 1.5 Pa is unfavorable.

(2) Organic Conductive Layer

The organic conductive layer mainly contains a conductive macromolecular material and a binder. The conductive macromolecular material and the binder may be the compounds described in JP 5750908 B1 and JP 5782855 B1. In addition, preparation (method) of the organic conductive composition contained in the organic conductive layer, formation (method) of the organic conductive layer, etc. can be performed according to the methods described in JP 5750908 B1 and JP 5782855 B1.

<Substrate (11)>

The substrate is not particularly limited as long as the substrate has high light permeability. Suitable examples of the substrate include a resin substrate and a resin film. In view of productivity, and performance such as light weight and flexibility, a transparent resin film is preferably used.

The resin usable as the substrate is not particularly limited. Examples of the resin include polyester-based resins, such as polyethylene terephthalate (PET), polyethylene naphthalate (PEN), and modified polyesters; polyolefin resins, such as a polyethylene (PE) resin, a polypropylene (PP) resin, a polystyrene resin, and cyclic olefin-based resins; vinyl-based resins, such as polyvinyl chloride and polyvinylidene chloride; polyether ether ketone (PEEK) resins, polysulfone (PSF) resins, polyether sulfone (PES) resins, polycarbonate (PC) resins, polyamide resins, polyimide resins, acrylic resins, and a triacetylcellulose (TAC) resin. These resins may be used alone or in combination.

The substrate may be an unstretched film or a stretched film.

A substrate having a high transparency is preferred since the transparent electrode can be used as the transparent electrode of an organic electronic device. As used herein, the term "high transparency" means that a total light transmittance in a visible light wavelength region determined by a method according to JIS K 7361-1: 1997 (Plastics—Determination of the total luminous transmittance of transparent materials) is 50% or higher. A total light transmittance of 80% or higher is more preferred.

To improve adhesion to the underlying layer disposed over the substrate, the gas barrier layer described later herein, and the like, the substrate may be subjected to surface activation treatment. In addition, a clear hard coat layer may be disposed to improve impact resistance. Examples of the surface activation treatment include corona discharge treatment, flame treatment, UV treatment, radio frequency treatment, glow discharge treatment, active plasma treatment, and laser treatment.

Examples of material of the clear hard coat layer include polyesters, polyamides, polyurethanes, vinyl-based copolymers, butadiene-based copolymers, acryl-based copolymers, vinylidene-based copolymers, and epoxy-based copolymers. Among others, a UV-curable resin can be preferably used.

<Gas Barrier Layer (14)>

An organic electronic device, such as an organic EL device, including the transparent electrode of the present invention easily undergo performance degradation in the presence of a trace of moisture and/or a trace of oxygen inside the device. Thus, to prevent moisture and oxygen from penetrating into the interior of the device through the substrate, a gas barrier layer having a high blocking capability against moisture and oxygen is preferably formed. Alternatively, a gas impermeable film having a gas barrier layer previously disposed on the substrate may be used as the substrate of the transparent electrode.

The composition and the structure of the gas barrier layer, and the method of forming the gas barrier layer, are not particularly limited. A layer of an inorganic compound, such as silica, can be formed by vacuum deposition or a CVD technique. For example, the silicon-containing polymer-modified layers, the silicon compound layers, and the transition metal oxide layers described below can be used alone or in combination to form the gas barrier layer.

(Silicon-Containing Polymer-Modified Layer)

The silicon-containing polymer-modified layer applied in the gas barrier layer is formed by modification of a silicon-containing polymer having, in the repeating structure, a bond such as a silicon-oxygen (Si—O) bond and/or a silicon-nitrogen (Si—N) bond. Although the modification treatment causes the silicon-containing polymer to be converted to silica or the like, there is no need to convert the entire amount of the silicon-containing polymer, and thus conversion of at least a part thereof, e.g., a portion on the UV-irradiated surface side, is sufficient.

The thickness of the silicon-containing polymer-modified layer may be determined depending on the usage as appropriate, and may typically be in a range from 10 nm to 10 μm.

Specific examples of the silicon-containing polymer include polysiloxanes (including polysilsesquioxanes) having a Si—O bond in the repeating structure, polysilazanes having a Si—N bond, and polysiloxazanes having both a Si—O bond and a Si—N bond. These materials may be used in combination of two or more. In addition, layers respectively formed of different silicon-containing polymers may be stacked one on another.

Polysiloxanes contain —[RaSiO$_{1/2}$]—, —[RbSiO]—, —[RcSiO$_{3/2}$]—, —[SiO$_2$]—, and/or other unit in the repeating structure, where Ra, Rb, and Rc each independently represent a hydrogen atom or a substituent, such as an alkyl group having 1 to 20 carbon atoms (e.g., methyl group, ethyl group, propyl group, etc.) or an aryl group (e.g., phenyl group, unsaturated alkyl group, etc.).

Polysilsesquioxanes are compounds that constitute a part of the polysiloxanes described above, and contain the same structure as the structure of a silsesquioxane in the repeating structure. Silsesquioxane is a compound having a structure represented by —[RcSiO$_{3/2}$]—described above.

Polysilazanes have a structure that can be represented by general formula (B) given below:

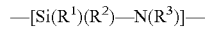   General Formula (B)

where $R^1$, $R^2$, and $R^3$ each independently represent a hydrogen atom, or an alkyl, alkenyl, cycloalkyl, aryl, alkylsilyl, alkylamino, or alkoxy group.

Polysilazane whose $R^1$, $R^2$, and $R^3$ in general formula (B) given above are all a hydrogen atom is perhydropolysilazane. Perhydropolysilazane is preferred in view of providing a dense film.

Perhydropolysilazane presumably has a structure containing both a linear chain structure and a ring structure formed mainly of 6-member rings and 8-member rings. The molecular weight thereof is in a range from about 600 to about 2000 (relative to polystyrene standard) in terms of the number average molecular weight (Mn). Perhydropolysilazane is liquid or solid depending on the molecular weight thereof.

Polysilazane in which a part of hydrogen atoms bonded to Si is substituted with an alkyl group or the like in general formula (B) given above is organopolysilazane. Organopolysilazane is advantageous in that the alkyl group such as methyl group improves adhesion to the underlying substrate, and also provides toughness to rigid and brittle polysilazane, thereby reducing cracks even for a large film thickness. Thus, either perhydropolysilazane or organopolysilazane is selected and used, or both thereof are used in combination as appropriate depending on the usage.

Polysiloxazanes each have structures represented by —[(SiH$_2$)$_n$(NH)$_r$]— and —[(SiH$_2$)$_m$O]— in the repeating structure, where n, m, and r are each independently from 1 to 3.

Other examples of polysilazane ceramicized at a low temperature include a silicon alkoxide-added polysilazane produced by reacting a silicon alkoxide (see, e.g., JP 5-238827 A); a glycidol-added polysilazane produced by reacting a glycidol (see, e.g., JP 6-122852 A); an alcohol-added polysilazane produced by reacting an alcohol (see, e.g., JP 6-240208 A); a metal carboxylate-added polysilazane produced by reacting a metal carboxylate (see, e.g., JP 6-299118 A); an acetylacetonate complex-added polysilazane produced by reacting an acetylacetonate complex containing a metal (see, e.g., JP 6-306329 A); and metal fine particle-added polysilazane produced by adding metal fine particles (see, e.g., JP 7-196986 A), each with a polysilazane having a main skeleton of a unit represented by general formula (B) given above.

The silicon-containing polymer-modified layer can be formed by forming a coating film using an application liquid containing the silicon-containing polymer described above, and modifying that coating film.

Examples of the method of forming the coating film include roll coating, flow coating, spray coating, printing, dip coating, bar coating, film formation by casting, inkjet printing, and gravure printing.

In preparation of the application liquid, use of an organic solvent containing alcoholic organic solvent or moisture, which readily reacts with polysilazane, is preferably avoided. Thus, examples of the organic solvent that can be used in preparation of the application liquid include hydrocarbon solvents, such as aliphatic hydrocarbons, cycloaliphatic hydrocarbons, and aromatic hydrocarbons; halogenated hydrocarbon solvents; and ethers, such as aliphatic ethers and cycloaliphatic ethers. More specifically, examples thereof include hydrocarbons such as pentane, hexane, cyclohexane, toluene, xylene, Solvesso, and terpene; halogen hydrocarbon such as methylene chloride and trichloroethane; and ethers such as dibutyl ether, dioxane, and tetrahydrofuran. The organic solvent used is selected from these organic solvents in consideration of properties such as solubility of the polysilazane and/or evaporation rate of the organic solvent. Multiple organic solvents may be used in combination.

The application liquid may be a commercial product containing polysilazane dissolved in an organic solvent. Examples of usable commercial product include Aquamica NAX120-20, NN110, NN310, NN320, NL110A, NL120A, NL150A, NP110, NP140, and SP140 produced by AZ Electronic Materials, etc.

The application liquid may contain a catalyst for accelerating the modification treatment.

The catalyst is preferably a basic catalyst. Examples of the catalyst include amine catalysts, such as N,N-diethylethanol amine, N,N-dimethylethanol amine, triethanol amine, triethylamine, 3-morpholinopropylamine, N,N,N',N'-tetramethyl-1,3-diaminopropane, and N,N,N',N'-tetramethyl-1,6-diaminohexane; metal catalysts, such as platinum (Pt) compounds such as Pt acetylacetonate, palladium (Pd) compounds such as Pd propionate, and rhodium (Rh) compounds such as Rh acetylacetonate; and N-heterocyclic compounds.

In dependence on the thickness of the silicon-containing polymer-modified layer to be formed and/or on the pot life of the application liquid, the application liquid contains the silicon-containing polymer in an amount preferably in a range from 0.2 to 35.0 mass %.

The coating film that has been formed may be subjected to a drying process by heating to remove the organic solvent in the coating film.

The temperature during heating may be in a range from 50 to 200° C. The heating period is preferably a short time period to avoid deformation of the substrate and/or the like. For example, in a case in which a polyethylene terephthalate having a glass transition temperature of 70° C. is used for the substrate, the temperature during the drying process may be 150° C. or lower to avoid deformation of the resin film.

The coating film that has been formed may also be subjected to a drying process of maintaining low humidity environment for dehumidification to remove moisture in the coating film.

Since the humidity in low humidity environment depends on the temperature, the relationship between temperature and humidity can be determined by specifying the dew point temperature. The dew point temperature is preferably 4° C. (temperature 25° C./humidity 25%) or lower, more preferably −8° C. (temperature 25° C./humidity 10%) or lower, and still more preferably −31° C. (temperature 25° C./humidity 1%) or lower. Reduced-pressure drying may be used to enhance removal of moisture. The pressure for the reduced-pressure drying can be selected within a range from normal pressure to 0.1 MPa.

The method of the modification treatment of the coating film may be a known method that has only a slight adverse effect on the substrate, and may be plasma treatment, ozone treatment, irradiation treatment using UV radiation or vacuum UV radiation, which can be performed at a low temperature, or the like. Among these, irradiation treatment using vacuum UV radiation is unlikely to cause a degradation in gas barrier property due to an environmental effect during a period between formation of the silicon-containing polymer-modified layer and formation of the transition metal oxide layer, and is therefore preferred.

Vacuum UV irradiation treatment uses optical energy of vacuum UV light having a wavelength in a range from 100 to 200 nm, the optical energy being greater than interatomic bonding force of atoms that constitute the silicon-containing polymer, and thus directly breaks interatomic bonds by means of an action involving only photons, which is referred to as light quantum process, and promotes oxidation reaction provided by active oxygen and/or ozone. The silicon-containing polymer is thus converted to silica or the like in an environment at a relatively low temperature of about 200° C. or lower.

The light source for vacuum UV light is not particularly limited as long as the light source emits light at a wavelength in a range from 100 to 200 nm. Examples thereof include a rare gas excimer lamp having a radiation wavelength of about 172 nm (e.g., xenon (Xe) excimer lamp Model: MECL-M-1-200 manufactured by M. D. Com. Inc.), a low pressure mercury vapor lamp having a radiation wavelength of about 185 nm, and a medium and high pressure mercury vapor lamp having a radiation wavelength of 200 nm or less.

An excimer lamp is characterized in emitting single wavelength light and thus having a very high emission efficiency; emitting short wavelength light that allows the temperature of the irradiation target to be maintained at a low temperature; instant starting of lighting and blinking; and the like. Thus, an excimer lamp is readily applicable to a substrate that is sensitive to heat.

In particular, vacuum UV light having a short single wavelength of 172 nm emitted by a Xe excimer lamp is absorbed by oxygen at a high absorption coefficient, thereby causing a high concentration of active oxygen or ozone to be generated from a trace of oxygen. This provides a high capability of breaking a bond in an organic material, thereby enabling the modification treatment to be completed in a short time period.

Irradiation conditions of the vacuum UV radiation is not particularly limited as long as the vacuum UV radiation causes no degradation in the substrate and/or the like under the silicon-containing polymer-modified layer.

For example, although there is a dependence on the composition, the concentration, and/or the like of the substrate, the application liquid, and/or the like, UV radiation is irradiated for a duration typically in a range from 0.1 seconds to 10 minutes, and preferably in a range from 0.5 seconds to 3 minutes.

For uniform UV irradiation, UV radiation from the light source is preferably reflected at a reflector to allow the reflected light to be incident upon the coating film of the silicon-containing polymer-modified layer.

The vacuum UV radiation can have an irradiance in a range from 1 mW/cm$^2$ to 10 W/cm$^2$. An irradiance of 1 mW/cm$^2$ or more improves modification efficiency, and an irradiance of 10 W/cm$^2$ or less can reduce abrasion possibly caused on the coating film, an adverse effect on the substrate, and the like.

The vacuum UV radiation can have irradiation energy (amount of irradiation) in an amount in a range from 0.1 to 10.0 J/cm$^2$. Irradiation energy in this range enables cracks due to excessive modification, thermal deformation of the substrate, and the like to be prevented, and also improves productivity.

The vacuum UV irradiation treatment may be carried out as a batch process or a continuous process. In a case of a batch process, the vacuum UV irradiation treatment can be performed in a UV baking furnace including a light source of vacuum UV radiation (e.g., UV baking furnace manufactured by Eye Graphics Co., Ltd.). In a case of a continuous process, the vacuum UV irradiation treatment can be performed by conveying the substrate and continuously irradiating the irradiation target with UV radiation in a zone including the light source of vacuum UV radiation.

Although the reaction caused by the vacuum UV irradiation requires oxygen, vacuum UV radiation is absorbed by oxygen, and this absorption readily reduces the modification efficiency. Therefore, the vacuum UV radiation is preferably irradiated in an atmosphere of oxygen concentration and water vapor concentration as low as practically possible. For example, the oxygen concentration during the vacuum UV irradiation can be in a range from 10 to 20000 ppm by volume (0.001 to 2% by volume), and the water vapor concentration, preferably in a range from 1000 to 4000 ppm by volume.

The atmosphere is adjusted preferably using dry inert gas, particularly, dry nitrogen gas considering the cost. The oxygen concentration can be adjusted by adjusting the flow rate ratio between oxygen gas and inert gas introduced into the chamber.

(Silicon Compound Layer)

To further improve the gas barrier property, the gas barrier layer may include, under the silicon-containing polymer-modified layer, a silicon compound layer containing a silicon compound such as silicon oxide, silicon nitride, silicon oxynitride, and silicon carbide.

If the transition metal oxide layer is disposed directly adjacent to the silicon-containing polymer-modified layer, a multilayer structure of a silicon compound layer and a silicon-containing polymer-modified layer can be disposed under this silicon-containing polymer-modified layer. Use of such multilayer structure further improves the gas barrier property against gas penetration into the transparent electrode, thereby further improving the stability of electrical conduction performance.

The silicon compound layer can be formed by a method such as vacuum deposition using silicon oxide as the source material, magnetron sputtering using a target containing silicon, or ion plating, or alternatively, a plasma-enhanced chemical vapor deposition (CVD) technique using, as the source material, a silicon-containing polymer used for the silicon-containing polymer-modified layer, such as a polysilazane (e.g., hexamethyldisiloxane, perhydropolysilazane), silicon dioxide, or the like.

(Transition Metal Oxide Layer)

The transition metal oxide layer is formed over the silicon-containing polymer-modified layer, using a transition metal oxide. The use of the transition metal oxide layer directly adjacent to the silicon-containing polymer-modified layer hinders or prevents oxidation of the silicon-containing polymer-modified layer, and can thus provide very high gas barrier property in cooperation with the silicon-containing polymer-modified layer.

The transition metal oxide used in the transition metal oxide layer is an oxide of a metal of group III to group XII of the periodic table of the elements. These transition metal elements may be used alone or in combination.

To provide higher stability, the transition metal oxide is preferably an oxide of a group V metal of the periodic table of the elements. Examples of group V metal include vanadium (V), niobium (Nb), and tantalum (Ta).

Among these, the transition metal oxide is preferably a niobium oxide. A transparent electrode including a transition metal oxide layer containing a niobium oxide and the silicon-containing polymer-modified layer in combination exhibits an improved stability of electrical conduction performance, and furthermore, reduces angle dependence of the transmittance of incident light. This is presumably because a stack of a low refractive index layer and a high refractive index layer causes multiple interference of light to reduce reflectance, because optical behavior changes due to a refractive index difference, and/or because of other cause.

The transition metal oxide layer contains the transition metal oxide preferably in a range from 50 to 100 mass %. A content in this range enables a sufficient level of gas barrier property to be provided by interaction between the transition metal in the transition metal oxide layer and the silicon-containing polymer-modified layer.

In view of easy adjustment of composition ratio between transition metal and oxygen, examples of the method of forming the transition metal oxide layer include physical vapor deposition (PVD) techniques, such as vapor deposition, sputtering, and ion plating, CVD techniques, such as plasma-enhanced CVD, and an atomic layer deposition (ALD) technique. Among these techniques, a sputtering technique is preferred due to having no adverse effect on the underlying layers and providing high productivity.

Examples of applicable sputtering technique include bipolar sputtering, magnetron sputtering, dual magnetron (DM) sputtering, reactive sputtering, ion beam sputtering, and electron cyclotron resonance (ECR) sputtering. These sputtering techniques may be used alone or in combination of two or more.

The application conditions for the target can be suitably selected depending on the type of the target. If a direct current (DC) or a DM sputtering technique is used, transition metal is used in the target, and oxygen is introduced as the source gas, to form a thin film of transition metal oxide. If a radio frequency (RF) sputtering technique is used, a target of a transition metal oxide can be used. The inert gas used can be He, Ne, Ar, Kr, Xe, or the like, and among these, Ar is preferred.

The transition metal oxide layer may either be a single layer or a multilayer including two or more layers. In a case of a multilayer, the transition metal oxide used in each layer may be the same or different. To provide uniform gas barrier property at all points on the layer, the transition metal oxide layer has a thickness preferably in a range from 1 to 200 nm.

(Process of Forming Gas Barrier Layer)

The production process of a transparent electrode of the present invention may include formation of the gas barrier layer over the substrate as needed. The formation of the gas barrier layer is performed prior to the formation of the conductive layer and of the underlying layer described above.

The gas barrier layer is formed preferably by vacuum vapor deposition or CVD of one or a combination of the silicon-containing polymer-modified layer, the silicon compound layer, and the transition metal oxide layer described above. The silicon-containing polymer-modified layer, the silicon compound layer, and the transition metal oxide layer can each be formed using the methods and conditions described above.

<Particle-Containing Layer (15)>

The particle-containing layer is disposed on a surface (rear surface) opposite the surface (front surface) on which the conductive layer is formed, across the substrate. Use of the particle-containing layer in the transparent electrode can reduce or prevent carrying of an electrical charge, adhesion between transparent electrodes, and the like when transparent electrodes come into contact with each other, such as when transparent electrodes are stacked one on another, or a long-length transparent electrode is wound into a roll configuration.

The particle-containing layer is formed of particles and a binder resin. The particle-containing layer contains the particles preferably at a ratio in a range from 1 to 900 parts by mass per 100 parts by mass of the binder resin.

(Particle)

The particles contained in the particle-containing layer are preferably inorganic fine particles, inorganic oxide particles, conductive polymer particles, conductive carbon particulates, or the like. Among these, oxide particles of materials such as $ZnO$, $TiO_2$, $SnO_2$, $Al_2O_3$, $In_2O_3$, $MgO$, $BaO$, $MoO_2$, and $V_2O_5$; and inorganic oxide particles of materials such as $SiO_2$ are preferred. Among these, $SnO_2$ and $SiO_2$ are preferred.

(Binder Resin)

Examples of applicable binder resin contained in the particle-containing layer include cellulose derivatives, such as cellulose diacetate, cellulose triacetate, cellulose acetate butylate, cellulose acetate phthalate, and cellulose nitrate; polyesters, such as polyvinyl acetate, polystyrene, polycarbonate, polybutylene terephthalate, and polybutylene terephthalate-isophthalate copolymer; polyvinyl alcohol derivatives, such as polyvinyl alcohol, polyvinyl formal, polyvinyl acetal, polyvinyl butyral, and polyvinyl benzal; norbornene-based polymers containing a norbornene compound; and acrylic resins and copolymers of acrylic resin and another resin, such as polymethyl methacrylate, polyethyl methacrylate, polypropyltyl methacrylate, polybutyl methacrylate, and polymethyl acrylate. Note that applicable binder resins are not limited to these example resin materials. Among these, cellulose derivatives and acrylic resins are preferred, and acrylic resins are most preferred.

Preferred materials for the binder resin are a thermoplastic resins described above having a weight average molecular weight (Mw) of four hundred thousand or more, and having a glass transition temperature in a range from 80 to 110° C. in view of optical characteristics and quality of the particle-containing layer to be formed.

The glass transition temperature can be determined using a method provided in JIS K 7121. The binder resin used herein accounts for 60 mass % or higher, preferably 80 mass % or higher, of the total resin mass contained in the particle-containing layer. An actinic radiation-curable resin or a thermosetting resin may also be applied as needed.

(Method of Forming Particle-Containing Layer)

The production process of the transparent electrode may include formation of the particle-containing layer over the substrate (over the rear surface thereof) as needed. The formation of the particle-containing layer is performed prior to the formation of the conductive layer, the underlying layer, and the gas barrier layer described above.

The particle-containing layer is formed as follows. The particles and the binder resin described above are dissolved in an appropriate organic solvent to prepare a particle-containing layer-forming application liquid in a solution state. The resulting application liquid is applied on the substrate by these wet application methods, and then dried, to form the particle-containing layer.

In preparation of the particle-containing layer-forming application liquid, the organic solvent used may be a mixture of an appropriate combination of hydrocarbons, alcohols, ketones, esters, and/or glycol ethers, but is not particularly limited thereto.

Examples of the hydrocarbons include benzene, toluene, xylene, hexane, and cyclohexane; examples of the alcohols include methanol, ethanol, n-propyl alcohol, isopropyl alcohol, n-butanol, 2-butanol, tert-butanol, pentanol, 2-methyl-2-butanol, and cyclohexanol; examples of the ketones include acetone, methyl ethyl ketone, methyl isobutyl ketone, and cyclohexanone; examples of the esters include methyl formate, ethyl formate, methyl acetate, ethyl acetate, isopropyl acetate, amyl acetate, ethyl lactate, and methyl lactate; examples of the glycol ethers (1 to 4 carbon atoms) include methyl cellosolve, ethyl cellosolve, propylene glycol monomethyl ether (acronym: PGME), propylene glycol monoethyl ether, propylene glycol mono-n-propyl ether, propylene glycol monoisopropyl ether, propylene glycol monobutyl ether; examples of propylene glycol mono (1 to 4 carbon atoms) alkyl ether esters include propylene glycol monomethyl ether acetate and propylene glycol monoethyl ether acetate; and other examples of a solvent include N-methylpyrrolidone. The above hydrocarbon is not limited to these hydrocarbons, and a solvent produced as a mixture of these hydrocarbons may also be preferably used as appropriate.

Examples of the method of applying the particle-containing layer-forming application liquid on the substrate include doctor coating, extrusion coating, slide coating, roll coating, gravure coating, wire-bar coating, reverse roll coating, curtain coating, extrusion coating, and extrusion coating that uses a hopper described in U.S. Pat. No. 2,681,294. Use of these wet application methods as appropriate enables the particle-containing layer having a dry film thickness in a range from 0.1 to 20 µm, preferably in a range from 0.2 to 5 µm, to be formed on the substrate.

<<Organic Electronic Device (Organic EL Device)>>

An organic electroluminescent device (organic EL device) according to an embodiment will next be described as an example of organic electronic device using the transparent electrode described above.

The organic EL device is configured to include the above-described transparent electrode as one electrode (transparent electrode), and a light emitting unit and another electrode (counter electrode) disposed on this transparent electrode. Thus, detailed description will be omitted, of the portion having the same configuration as the configuration of the above-described transparent electrode in the description of the organic EL device given below.

<Configuration of Organic EL Device>

Figure 2:
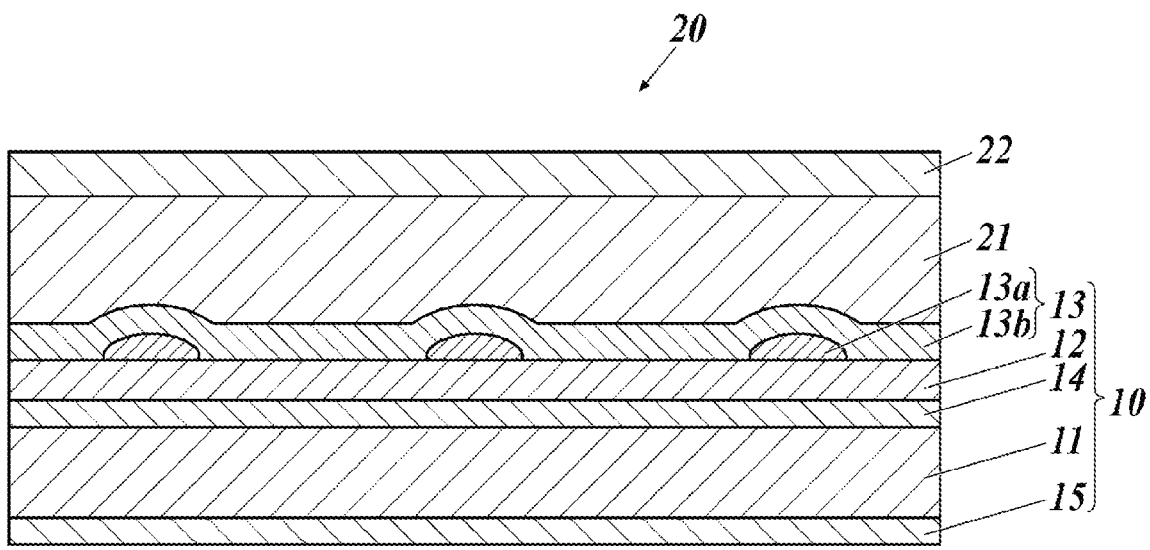
FIG. 2 is a cross-sectional view illustrating an example schematic configuration of an organic EL device.

The configuration of the organic EL device is illustrated in FIG. 2. An organic EL device 20 illustrated in FIG. 2 includes the transparent electrode 10 and a counter electrode 22, and also includes a light emitting unit 21 interposed between these electrodes as an organic functional layer. The transparent electrode 10 is similarly configured to the transparent electrode 10 of FIG. 1 described above.

As used herein, the term "light emitting unit" refers, at least, to an illuminant (unit) mainly formed of organic functional layers containing various organic compounds, such as an emission layer, a hole transport layer, and an electron transport layer. The illuminant is interposed between a pair of electrodes, which are a positive electrode and a negative electrode. A hole supplied from the positive electrode and an electron supplied from the negative electrode recombine in the illuminant, thereby causing light to be emitted. The organic EL device may include multiple ones of the light emitting unit depending on a desired emission color.

In the organic EL device 20, only the portion of the light emitting unit 21 sandwiched between the conductive layer 13 and the counter electrode 22 of the transparent electrode 10 acts as the emission region in the organic EL device 20. The organic EL device 20 is configured to output emitted light (hereinafter also referred to as "emission light") at least from the substrate 11 side of the transparent electrode 10. This configuration is known as a bottom emission type. As used herein, the term "transparent (light permeable)" refers to having an optical transmittance of 50% or higher at a wavelength of 550 nm. The term "main component" refers to a component having the highest content in the entire structure.

The organic EL device 20 also includes extraction electrodes (not shown) in end portions of the conductive layer 13 and of the counter electrode 22 of the transparent electrode 10. The conductive layer 13 and the counter electrode 22 of the transparent electrode 10 are electrically connected to an external power supply (not shown) via the extraction electrodes.

The layer configuration of the organic EL device 20 is not limited, and may be an ordinary layer configuration. For example, if the conductive layer 13 of the transparent electrode 10 acts as the anode (i.e., positive electrode), and the counter electrode 22 of the transparent electrode 10 acts as the cathode (i.e., negative electrode), the light emitting unit 21 may have, by way of example, a structure including a hole injection layer, a hole transport layer, an emission layer, an electron transport layer, and an electron injection layer stacked sequentially from the conductive layer 13 side of the transparent electrode 10. In this structure, use of the emission layer formed at least of an organic material is essential. The hole injection layer and the hole transport layer may be formed as a hole injection-transport layer. The electron transport layer and the electron injection layer may be formed as an electron injection-transport layer. Among these layers in the light emitting unit 21, the electron injection layer, for example, may be formed of an inorganic material.

The light emitting unit 21 may also include, in addition to these layers, a hole blocking layer, an electron blocking layer, and/or the like stacked in a necessary place as needed. The emission layer may further include multiple color emission sublayers for emitting emission light having respective wavelengths, where the multiple color emission sublayers are stacked interposing a non-light emitting auxiliary layer between each pair of the multiple color emission sublayers. The auxiliary layer may act as a hole blocking layer or as an electron blocking layer. Moreover, the counter electrode 22 acting as the cathode may also have a stacked configuration as needed.

Alternatively, the organic EL device 20 may be a so-called tandem structure device that includes a stack of multiple ones of the light emitting unit 21 including at least one emission layer. A typical structure of a tandem structure device may be, for example, the structure as follows.

Positive electrode/First light emitting unit/Intermediate connection layer/Second light emitting unit/Intermediate connection layer/Third light emitting unit/Negative electrode Herein, the first light emitting unit, the second light emitting unit, and the third light emitting unit may all be identical to, or different from, one another. Alternatively, these three light emitting units may be configured such that two of the light emitting units are identical to each other, and one is different from the others. The multiple light emitting units 21 may be stacked directly one on top of another, or stacked with an intermediate connection layer interposed between a pair of light emitting units 21.

The intermediate connection layer is also referred to generally as an intermediate electrode, intermediate conductive layer, charge generation layer, electron extraction layer, connecting layer, and intermediate insulation layer. The intermediate connection layer may be formed using a composition of known materials as long as the layer has a function to supply an electron to the adjacent layer closer to the positive electrode, and a hole to the adjacent layer closer to the negative electrode. Examples of materials used for the intermediate connection layers include conductive inorganic compound layers formed of materials such as ITO, indium zinc oxide (IZO), $ZnO_2$, TiN, ZrN, HfN, $TiO_x$, $VO_x$, CuI, InN, GaN, $CuAlO_2$, $CuGaO_2$, $SrCu_2O_2$, $LaB_6$, $RuO_2$, and Al; two-layer films formed of materials such as $Au/Bi_2O_3$; multilayer films formed of materials such as $SnO_2/Ag/SnO_2$, ZnO/Ag/ZnO, $Bi_2O_3/Au/Bi_2O_3$, $TiO_2/TiN/TiO_2$, and $TiO_2/ZrN/TiO_2$; conductive organic material layers formed of materials such as fullerenes such as $C_{60}$, and oligothiophenes; and conductive organic compound layers formed of materials such as metal phthalocyanines, metal-free phthalocyanines, metal porphyrins, and metal-free porphyrins. However, the materials applicable to the intermediate connection layers are not limited to the materials described above.

Examples of preferred structure within the light emitting unit 21 include a structure similar to the typical device structure described above but without the positive electrode and the negative electrode. However, the device structure within the light emitting unit 21 is not limited thereto.

Specific examples of the tandem organic EL device include those having the device structures and constituent materials described in: U.S. Pat. Nos. 6,337,492, 7,420,203, 7,473,923, 6,872,472, 6,107,734, 6,337,492, WO 2005/009087 A, JP 2006-228712 A, JP 2006-24791 A, JP 2006-49393 A, JP 2006-49394 A, JP 2006-49396 A, JP 2011-96679 A, JP 2005-340187 A, JP 4711424 B1, JP 3496681 B1, JP 3884564 B1, JP 4213169 B1, JP 2010-192719 A, JP 2009-076929 A, JP 2008-078414 A, JP 2007-059848 A, JP 2003-272860 A, JP 2003-045676 A, WO 2005/094130 A, and other documents.

(Electrode)

The organic EL device includes a light emitting unit interposed between a pair of electrodes, which is the conductive layer and the counter electrode of the transparent electrode. Either one of the conductive layer and the counter electrode of the transparent electrode acts as the positive electrode of the organic EL device, and the other acts as the negative electrode of the organic EL device.

In the organic EL device 20 illustrated in FIG. 2, the conductive layer 13 of the transparent electrode 10 is formed of a transparent conductive material, while the counter electrode 22 is formed of a highly reflective material. If the organic EL device 20 emits light from both surfaces, the counter electrode 22 is also formed of a transparent conductive material.

(Counter Electrode)

If the counter electrode is used as the positive electrode in the organic EL device, the electrode material used for the counter electrode is preferably a metal, an alloy, or an electrically conductive compound having a high work function (4 eV or more), or a mixture thereof. Specific examples of electrode material applicable to the positive electrode include metals such as Au and Ag; and transparent conductive materials such as CuI, ITO, $SnO_2$, and ZnO. In addition, an amorphous material usable for forming a transparent conductive film, such as IDIXO ($In_2O_3$—ZnO), may also be used.

The positive electrode may be formed as follows. An electrode material among those described above is used to form a thin film using a method such as vapor deposition or sputtering. A pattern of a desired shape may be formed using a photolithographic method, or alternatively, if a high accuracy pattern is not required (about 100 μm or more), the pattern may be formed using a mask having a desired shape during the process of vapor deposition or sputtering of the electrode material described above.

If a material that can be applied to a surface, such as an organic conductive compound, is used, a wet film formation technique such as printing or coating may also be used. If light is to be emitted from the positive electrode side, the optical transmittance is preferably greater than 10%. The positive electrode has a sheet resistance of preferably up to several hundred ohms/square. The thickness depends on the material, but is typically selected within a range from 10 to 1000 nm, and preferably from a range from 10 to 200 nm.

Otherwise, if the counter electrode is used as the negative electrode in the organic EL device, the electrode material used for the counter electrode is a metal (referred to as electron injecting metal), an alloy, or an electrically conductive compound having a low work function (4 eV or less), or a mixture thereof.

The negative electrode is an electrode film that serves as a negative electrode (cathode) for supplying an electron to the light emitting unit. The negative electrode can be formed by forming a thin film using a method such as vapor deposition or sputtering for an electrode material among those described above.

Specific examples of the electrode material include sodium, sodium-potassium alloy, magnesium, lithium, magnesium/copper mixture, magnesium/silver mixture, magnesium/aluminum mixture, magnesium/indium mixture, aluminum/aluminum oxide ($Al_2O_3$) mixture, indium, lithium/aluminum mixture, and rare earth metals.

Among these, in view of electron injection property and endurance such as endurance to oxidation, preference is given to a mixture of an electron injecting metal and a second metal that has a higher work function than the electron injecting metal, and is stable. Examples thereof include magnesium/silver mixture, magnesium/aluminum mixture, magnesium/indium mixture, aluminum/aluminum oxide ($Al_2O_3$) mixture, lithium/aluminum mixture, and aluminum.

The negative electrode has a sheet resistance of preferably up to several hundred ohms/square. The thickness is typically selected from a range from 10 nm to 5 µm, and preferably from a range from 50 to 200 nm. In addition, disposing a metal among those described above in a thickness of from 1 to 20 nm as the negative electrode before disposing thereon a transparent conductive material among those listed in the description of the positive electrode enables a transparent or translucent negative electrode to be produced. This process can be applied to produce a device including a light-permeable positive electrode and a light-permeable negative electrode.

(Extraction Electrode)

The extraction electrode electrically connects the conductive layer of the transparent electrode with an external power supply. The material of the extraction electrode is not particularly limited, and a known material can be suitably used. For example, a metal film such as a three-layer Mo/Al—Nd alloy/Mo electrode (MAM) can be used.

(Sealing Member)

To prevent degradation of the light emitting unit formed of an organic material and/or the like, the organic EL device may be sealed using a sealing member (not shown). The sealing member is a plate-shaped (film-shaped) member for covering the upper surface of the organic EL device. The sealing member is fixedly attached on the substrate side by an adhesion portion. The sealing member may alternatively be a sealing film. The sealing member is disposed to expose the electrode terminal portion of the organic EL device, and to cover at least the light emitting unit. The sealing member may include an electrode to conduct electricity between the electrode terminal portion of the organic EL device and the electrode of the sealing member.

Examples of the plate-shaped (film-shaped) sealing member specifically include a glass substrate, a polymer substrate, and a metal substrate, and a thin film produced from any of these substrates. Specific examples of the material of the glass substrate include soda lime glass, barium-strontium-containing glass, lead glass, aluminosilicate glass, borosilicate glass, barium borosilicate glass, and quartz. Specific examples of the material of the polymer substrate include polycarbonate, acrylic polymers, polyethylene terephthalate, polyether sulfide, and polysulfone. Specific examples of the material of the metal substrate include one or more metals selected from the group consisting of stainless steel, iron, copper, aluminum, magnesium, nickel, zinc, chromium, titanium, molybdenum, silicon, germanium, and tantalum, and alloys thereof.

Among these, in view of manufacturability of a device having a thin film form, a polymer substrate or a metal substrate having a thin film form is preferably used as the sealing member.

The substrate material may be formed into a form of a recessed plate to be used as the sealing member. In this case, the substrate material described above is sandblasted, chemically etched, or otherwise treated to form a recessed form.

The film-shaped polymer substrate preferably has an oxygen permeability of $1 \times 10^{-3}$ ml/(m$^2$·24 h·atm) or less determined by a method according to JIS K 7126-1987, and a water vapor permeability (25±0.5° C., relative humidity of (90±2)% RH) of $1 \times 10^{-3}$ g/(m$^2$·24 h) or less determined by a method according to JIS K 7129-1992.

The adhesion portion for fixedly attaching the sealing member on the substrate side of the organic EL device is used as a sealant to seal the organic EL device. Specific examples of the adhesion portion include adhesives such as photocurable and thermosetting adhesives, that is, acrylate-based oligomers and methacrylate-based oligomers having a reactive vinyl group, and moisture-curable adhesives such as 2-cyanoacrylate ester.

Examples of the adhesion portion also include epoxy-based or other thermosetting and chemically curable (two-component) adhesives; polyamide-, polyester-, and polyolefin-based hot-melt adhesives; and cationic curable, UV-curable epoxy resin adhesives.

The adhesion portion may be applied to the portion where the sealing member is to be bonded to the transparent electrode, using a commercially available dispenser or by printing such as screen printing.

Note that heat treatment may deteriorate the organic material contained in the organic EL device. Therefore, the adhesion portion preferably has a property of adhering and curing at a temperature in a range from room temperature (25° C.) to 80° C. A desiccant may be dispersed in the adhesion portion.

If a gap is formed between the plate-shaped sealing member and the transparent electrode, the gap is preferably filled with inert gas such as nitrogen or argon, or inert liquid such as hydrocarbon fluoride or silicon oil if a gas or liquid phase is to be used. Alternatively, the gap may also be vacuum, or be filled with a hydroscopic compound and then sealed.

Examples of the hydroscopic compound include metal oxides (e.g., sodium oxide, potassium oxide, calcium oxide, barium oxide, magnesium oxide, aluminum oxide, etc.), sulfates (e.g., sodium sulfate, calcium sulfate, magnesium sulfate, cobalt sulfate, etc.), metal halides (e.g., calcium chloride, magnesium chloride, cesium fluoride, tantalum fluoride, cerium bromide, magnesium bromide, barium iodide, magnesium iodide, etc.), and perchlorates (e.g., barium perchlorate, magnesium perchlorate, etc.). In a case of a sulfate, a metal halide, or a perchlorate, an anhydrous salt is suitably used.

Meanwhile, in a case in which the sealing member is a sealing film, the sealing film is disposed over the transparent electrode to completely cover the light emitting unit in the organic EL device, in a state of exposing e electrode terminal portion of the organic EL device.

This sealing film is formed using an inorganic or organic material, particularly, a material having a capability of preventing penetration of substances, such as moisture and oxygen, that may degrade the light emitting unit in the organic EL device. As such material, an inorganic material such as silicon oxide, silicon dioxide, or silicon nitride is used. To reduce vulnerability of the sealing film, the sealing film may be formed in a stack configuration including a film formed of such inorganic material and a film formed of an organic material.

The method of forming the film is not particularly limited. Examples thereof for use include vacuum deposition, sputtering, reactivity sputtering, molecular beam epitaxy, cluster ion beam impact, ion plating, plasma polymerization, atmospheric pressure plasma polymerization, plasma-enhanced CVD, laser CVD, thermal CVD, and coating.

(Protective Member)

To physically protect the organic EL device, a protective member (not shown) such as a protective film or a protective plate may be used. The protective member is disposed at a position to interpose, together with the transparent electrode, the organic EL device and the sealing member. In particular, in a case in which the sealing member is a sealing film, use of such protective member is preferred considering insufficient physical protection for the organic EL device.

The protective member as described above may be a glass plate or a polymer plate; a polymer film thinner than the polymer plate: a metal plate; a metal film thinner than the metal plate, a polymer material film, or a metallic material film even thinner than these. Among these, use of a polymer film is preferred due to producibility in light weight and in thin thickness.

The description given above has described an organic EL device in which a transparent electrode of the present invention is applied as its transparent electrode, as an example of organic electronic device in which a transparent electrode is applied. However, a transparent electrode of the present invention may also be applied in an organic photoelectric conversion device or in other organic electronic device as its transparent electrode.

<Method of Manufacturing Organic Electronic Device>

An example method of manufacturing an organic EL device will next be described.

First, a transparent electrode is produced using the manufacturing method described above.

Next, a hole injection layer, a hole transport layer, an emission layer, an electron transport layer, and an electron injection layer are sequentially formed over the conductive layer of the transparent electrode to form a light emitting unit. The method of forming these layers may be spin coating, casting, inkjet printing, vapor deposition, printing, or the like, and is particularly preferably vacuum deposition or spin coating for reasons of easy formation of a uniform film, a low probability of pinhole formation, and the like. In addition, different film formation techniques may be applied to different layers. If a vapor deposition technique is used for forming these layers, the vapor deposition conditions typically include a boat heating temperature in a range from 50 to 450° C., a vacuum level, in a range from $1\times10^{-6}$ to $1\times10^{-2}$ Pa, a vapor deposition rate, in a range from 0.01 to 50 nm/sec, a substrate temperature, in a range from −50 to 300° C., and a layer thickness, in a range from 0.1 to 5 µm selected as appropriate though these conditions depend on the used compounds and the like.

After formation of the light emitting unit, a counter electrode is formed over the light emitting unit using a suitable film formation technique, such as vapor deposition or sputtering. In this process, the counter electrode is patterned so that a terminal portion is drawn out from a portion above the light emitting unit to a periphery of the substrate while the counter electrode is maintained electrically insulated from the conductive layer of the transparent electrode by means of the light emitting unit. This process produces the organic EL device. Thereafter, a sealing member is disposed to cover at least the light emitting unit, in a state of exposing the terminal portions of the extraction electrode and of the counter electrode in the organic EL device.

Thus, a desired organic EL device is obtained. In such organic EL device production, the process from light emitting unit formation to counter electrode formation is preferably performed continuously using only one vacuuming operation, but the substrate may be removed from the vacuum atmosphere at a certain stage of the process to apply another film formation technique. In such case, the operation requires special consideration such as performing the operation in a dry inert gas atmosphere.

EXAMPLES

The present invention will be described below in detail using examples. However, the present invention is not limited to these examples. In these examples, all figures in percent (%) represent percent by mass (mass %) unless otherwise indicated.

Example 1

<<Production of Transparent Electrode>>

Transparent electrodes 101 to 141 were produced as follows.

<Production of Transparent Electrode 101>

(1) Preparation of Substrate

A polyethylene terephthalate film with a clear hard coat layer (PET/CHC) manufactured by Kimoto Co., Ltd. (G1SBF, thickness: 125 µm, refractive index: 1.59) was prepared as the resin substrate.

(2) Formation of Gas Barrier Layer

Next, a gas barrier layer was formed over a surface (the surface on which the conductive layer is to be formed) of the above resin substrate.

Specifically, the resin substrate was placed in a discharge plasma-enhanced CVD apparatus (plasma-enhanced CVD apparatus Precision 5000 manufactured by Applied Materials, Inc.), and was conveyed in a continuous roll-to-roll process. A magnetic field was applied to the space between the deposition rollers, and electrical power was supplied to each of the deposition rollers to generate plasma in the space between the deposition rollers. Thus, a discharge region was established. A mixture gas of source gas, which was hexamethyldisiloxane (HMDSO), and reactant gas, which was oxygen gas (also acting as discharge gas), was then supplied from a gas supply pipe into the established discharge region as the deposition gas. Thus, a gas barrier layer having a thickness of 120 nm was formed under the following conditions.

(Deposition Condition)

Supply rate of source gas (hexamethyldisiloxane, HMDSO): 50 standard cubic centimeters per minute (sccm)

Supply rate of reactant gas ($O_2$): 500 sccm

Vacuum level in vacuum chamber: 3 Pa

Power applied from plasma generation power supply: 0.8 kW

Frequency of plasma generation power supply: 70 kHz

Film feed rate: 0.8 m/min (3) Formation of Underlying Layer

Onto the surface on which the gas barrier layer had been formed over the resin substrate, Karenz MTBD1 (product of Showa Denko K. K.; exemplary compound SE-20) and one equivalent weight of A-TMM-3LM-N (pentaerythritol triacrylate (triester 57%), product of Shin Nakamura Chemical Co., Ltd.) were mixed together; polymerization initiator Irgacure 184 (product of BASF SE) was blended in an amount resulting in a solid content of 0.2 mass %; and methyl isobutyl ketone (MIBK) was then used to prepare a diluent having a solid content of 3 mass %. The resulting mixture was formed into a film using a spin coater at 2000 rpm, followed by drying the resulting film using the infrared radiator described above. Then, residue on an outer edge portion was wiped off to allow the underlying layer to fit into the sealing area in the production process of the organic EL device as described below. Thereafter, a curing process was performed using an excimer lamp (apparatus: excimer radiator Model MECL-M-1-200 manufactured by M. D. Com. Inc.; radiation wavelength: 172 nm, lamp filler gas: Xe, excimer lamp light intensity: 130 mW/cm² (172 nm), distance between sample and light source: 2 mm, stage heating temperature: 70° C., oxygen concentration within radiator: 20.0%, irradiation energy: 1 J/cm²) to form an underlying layer having a thickness of 100 nm.

(4) Formation of Patterned Metal Thin Wiring

A silver nanoparticle-dispersed liquid (FlowMetal SR6000 produced by Bando Chemical Industries, Ltd.) was applied onto the underlying layer as the metallic ink composition using an inkjet printing method in a grid configuration of 50 μm width and of 1 mm pitch to form a patterned structure. Inkjet printing was performed using an inkjet head that ejects an ink droplet of 4 pl with adjustment of application rate and of ejection frequency to print a pattern. The inkjet printing device used was desktop application robot Shotmaster-300 (product of Musashi Engineering, Inc.) having an inkjet head (product of Konica Minolta, Inc.) attached. This inkjet printing device was controlled by inkjet evaluation system EB150 (product of Konica Minolta, Inc.).

Next, two quartz glass plates for absorbing infrared radiation having a wavelength of 3.5 μm or higher were attached to an infrared radiator (ultimate heater/carbon, product of MEI Mei Industries Inc.) to prepare a wavelength-controlled infrared heater that allows coolant air to flow between the glass plates, and then the resulting patterned structure of the metallic ink composition prepared was dried using this heater.

Next, xenon flash lamp 2400WS (product of Comet Corp.) having a short wavelength cutoff filter for wavelengths of 250 nm and less attached was used to irradiate the patterned structure of the metallic ink composition with one flash of light having a total light irradiation energy of 3.5 J/cm² and an irradiation duration of 2 msec to sinter the dried patterned structure of the metallic ink composition. Thus, the patterned metal thin wiring was formed.

(5) Formation of Second Conductive Layer

An IZO (mass ratio $In_2O_3$:ZnO=90:10) film having a thickness of 200 nm was formed over the patterned metal thin wiring as the metal oxide layer to produce the transparent electrode 101.

The IZO film was formed by an RF sputtering technique using sputtering apparatus L-430S-FHS manufactured by Anelva Corporation under conditions of Ar: 20 sccm, $O_2$: 3 sccm, sputtering pressure: 0.25 Pa, under room temperature (25° C.), power for target: 1000 W, and target-to-substrate distance: 86 mm.

<Production of Transparent Electrode 102>

The transparent electrode 102 was produced as in the production of the transparent electrode 101 except that, in place of the metal oxide layer, an organic conductive layer was formed over the patterned metal thin wiring as follows.

(Formation of Second Conductive Layer)

Application liquid A described below was applied over the patterned metal thin wiring using an extrusion technique after adjustment of the slit spacing of the extrusion head to obtain a dry film thickness of 300 nm. Then, application liquid A applied was heated to dry at 110° C. for 5 minutes to form a second conductive layer consisting of a conductive polymer and a water-soluble polymer P-1 (poly(2-hydroxyethyl acrylate)). The water-soluble polymer P-1 was synthesized using the method described in paragraph 0156 of JP 5750908 B1.

The application liquid A was produced by mixing together solution A and solution B each previously prepared.

[Solution A]

Polythiophene: PEDOT-PSS CLEVIOS PH510 (solid content concentration 1.89%, product of H. C. Starck GmbH) 1.59 g P-1 (aqueous solution of solid content at 20%) 0.35 g

[Solution B]

Dimethyl sulfoxide (DMSO, amount equivalent to one tenth of the mass of the conductive polymer solution) 0.16 g Compound 1 (amount in moles equivalent to one twentieth of the number of hydroxy groups of P-1) 0.008 g

[Chemical Formula 25]

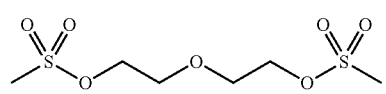

Compound 1

The electrode produced as described above was cut out into an 8 cm×8 cm square shape, and the resulting piece was then heated using an oven at 110° C. for 30 minutes to produce the transparent electrode 102.

<Production of Transparent Electrode 103>

The transparent electrode 103 was produced as in the production of the transparent electrode 102 except that the application liquid A for forming the second conductive layer was changed to the application liquid B described below.

[Application Liquid B]

Conductive polymer: PEDOT-PSS CLEVIOS PH510 (solid content concentration 1.89%, product of H. C. Starck GmbH) 1.59 g Binder: Plas Coat RZ570 (aqueous solution of solid content at 25%, product of Goo Chemical Co., Ltd.) 0.28 g Dimethyl sulfoxide (DMSO, amount equivalent to one tenth of the mass of the conductive polymer solution) 0.16 g <Production of Transparent Electrodes 104 to 123>

The transparent electrodes 104 to 123 were produced as in the production of the transparent electrode 101 except that, in place of Karenz MTBD1 added to the underlying layer material, the compounds listed in Table 1 were added. Note that in Tables 1 and 2, Karenz MTPE1 is a product of Showa Denko K. K. (exemplary compound SE-50); Karenz MTNR1 is a product of Showa Denko K. K. (exemplary compound SE-71); and Polyment NK-350 is a product of Nippon Shokubai Co., Ltd. (weight average molecular weight (Mw)=100000).

[Chemical Formula 26]

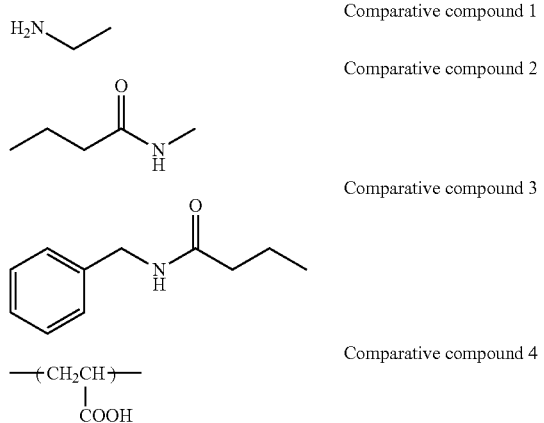

<Production of Transparent Electrodes 124 to 126>

The transparent electrodes 124 to 126 were produced as in the production of the transparent electrode 105 except that the solid content concentration was adjusted to change the thickness of the underlying layer as illustrated in Table 2.

<Production of Transparent Electrode 127>

The transparent electrode 127 was produced as in the production of the transparent electrode 124 except that the underlying layer was produced as follows.

(Formation of Underlying Layer)

Onto the surface on which the gas barrier layer had been formed over the resin substrate, Karenz MTNR1 (product of Showa Denko K. K.; exemplary compound SE-71) having a solid content of 1 mass %, A-TMM-3LM-N (pentaerythritol triacrylate (triester 57%), product of Shin Nakamura Chemical Co., Ltd.) having a solid content of 1 mass %, and $TiO_2$ particle material (A-15, average particle size 10 nm, product of Taki Chemical Co., Ltd.) having a solid content of 0.8 mass % were mixed together; polymerization initiator Irgacure 184 (product of BASF SE) was blended in an amount to provide a solid content of 0.2 mass %; and methyl isobutyl ketone (MIBK) was then used to prepare a diluent having a solid content of 3 mass %. The resulting mixture was formed into a film using a spin coater at 2000 rpm, followed by drying of the resulting film using the infrared radiator described above. Then, residue on an outer edge portion was wiped off to allow the underlying layer to fit into the sealing area in production of the organic EL device as described below. Thereafter, a curing process was performed using an excimer lamp (apparatus: excimer radiator Model MECL-M-1-200 manufactured by M. D. Com. Inc.; radiation wavelength: 172 nm, lamp filler gas: Xe, excimer lamp light intensity: 130 mW/cm² (172 nm), distance between sample and light source: 2 mm, stage heating temperature: 70° C.,oxygen concentration within radiator: 20.0%, irradiation energy: 1 J/cm²) to form an underlying layer having a thickness of 50 nm.

<Production of Transparent Electrodes 128 and 129>

The transparent electrodes 128 and 129 were produced as in the production of the transparent electrode 127 except that the $TiO_2$ particle material (particle size 10 nm) added to the underlying layer material was changed respectively to a $TiO_2$ particle material (MT-700B, particle size 80 nm, product of Tayca Corporation) and to $ZrO_2$ particle material (Zircostar, particle size 100 nm, product of Nippon Shokubai Co., Ltd.), and in addition, that the solid content concentration was adjusted to change the thickness of the underlying layer to 100 nm.

<Production of Transparent Electrodes 130 and 131>

The transparent electrodes 130 and 131 were produced as in the production of the transparent electrode 127 except that, in place of the metal oxide layer, organic conductive layers were respectively formed in the same procedures as those of the transparent electrode 102 and the transparent electrode 103.

<Production of Transparent Electrode 132>

The transparent electrode 132 was produced as in the production of the transparent electrode 105 except that the resin material of the underlying layer was changed from A-TMM-3LM-N to Lioduras TYT 80-01 ($TiO_2$ with acrylic resin binder, product of Toyo Ink Co., Ltd.), which was a UV-curable hard coating material, and that the thickness of the underlying layer was 50 nm.

<Production of Transparent Electrode 133>

The transparent electrode 133 was produced as in the production of the transparent electrode 106 except that the resin material of the underlying layer was changed from A-TMM-3LM-N to UV-RH-38 (product of KSN Co., Ltd.), which was an organic-inorganic hybrid resin, and that the solid content concentration was adjusted to change the thickness of the underlying layer to 50 nm.

<Production of Transparent Electrode 134>

The transparent electrode 134 was produced as in the production of the transparent electrode 105 except that the solid content concentration was adjusted to change the thickness of the underlying layer to 300 nm.

<Production of Transparent Electrode 135>

The transparent electrode 135 was produced as in the production of the transparent electrode 127 except that the $TiO_2$ particle material (particle size 10 nm) added to the underlying layer was changed to another $TiO_2$ particle material (JR-403, particle size 250 nm, product of Tayca Corporation), and that the solid content concentration was adjusted to change the thickness of the underlying layer to 300 nm.

<Production of Transparent Electrode 136>

The transparent electrode 136 was produced as in the production of the transparent electrode 101 except that no underlying layer was formed.

<Production of Transparent Electrode 137>

The transparent electrode 137 was produced as in the production of the transparent electrode 101 except that Karenz MTBD1 was not added when the underlying layer was formed.

<Production of Transparent Electrode 138>

The transparent electrode 138 was produced as in the production of the transparent electrode 127 except that Karenz MTNR1 was not added when the underlying layer was formed, and that the solid content concentration was adjusted to change the thickness of the underlying layer to 100 nm.

<Production of Transparent Electrode 139>

The transparent electrode 139 was produced as in the production of the transparent electrode 102 except that no underlying layer was formed.

<Production of Transparent Electrode 140>

The transparent electrode 140 was produced as in the production of the transparent electrode 102 except that Karenz MTBD1 was not added when the underlying layer was formed.

<Production of Transparent Electrode 141>

The transparent electrode 141 was produced as in the production of the transparent electrode 131 except that Karenz MTNR1 was not added when the underlying layer was formed, and that the solid content concentration was adjusted to change the thickness of the underlying layer to 100 nm.

<<Production of Organic EL Device>> organic EL devices 101 to 141 for evaluation were produced as follows.

<Production of Organic EL Device 101>

(1) Formation of Light Emitting Unit and Counter Electrode

First, the materials described below for forming the layers of the organic functional layer were placed in vapor deposition crucibles in a vacuum vapor deposition apparatus in the optimum amounts for forming the organic EL device. The vapor deposition crucibles used were produced from resistance heating material formed of molybdenum or tungsten.

A pressure reduction process was performed to achieve a vacuum level of $1\times10^{-4}$ Pa, under which condition the vapor deposition crucible containing compound M-2 was energized and heated to vapor deposit the compound M-2 over the transparent electrode 101 (on the metal oxide layer side) at a vapor deposition rate of 0.1 nm/sec to form a hole injection-transport layer having a thickness of 40 nm.

Next, compound BD-1 and compound H-1 were vapor co-deposited at a vapor deposition rate of 0.1 nm/sec to allow the compound BD-1 to have a concentration of 5 mass %. Thus, a fluorescent emission layer having a thickness of 15 nm that exhibits blue fluorescence was formed.

Next, compound GD-1, compound RD-1, and compound H-2 were vapor co-deposited at a vapor deposition rate of 0.1 nm/sec to allow the compounds GD-1 and RD-1 to respectively have concentrations of 17 mass % and 0.8 mass %. Thus, a phosphorescent emission layer having a thickness of 15 nm that exhibits a yellow color was formed.

Then, compound E-1 was vapor deposited at a vapor deposition rate of 0.1 nm/sec to form an electron transport layer having a thickness of 30 nm.

Thus, the organic functional layer was formed.

Thereafter, a LiF layer was formed in a thickness of 1.5 nm, followed by vapor deposition of aluminum to a thickness of 110 nm, thereby forming the counter electrode and the extraction electrode thereof. Thus, the organic EL device 101 was produced.

[Chemical Formula 27]

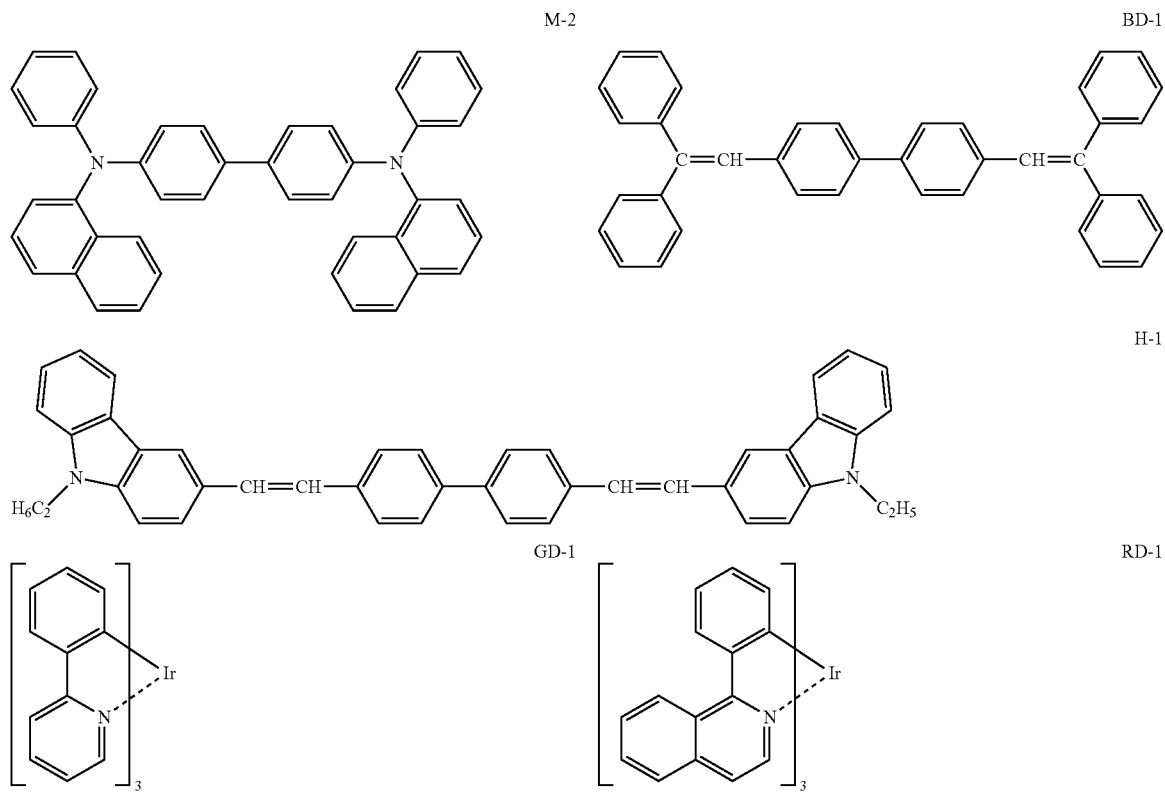

H-2

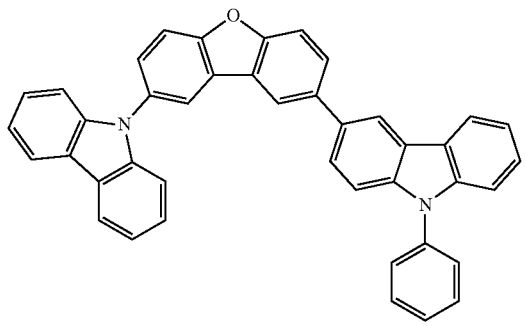

E-1

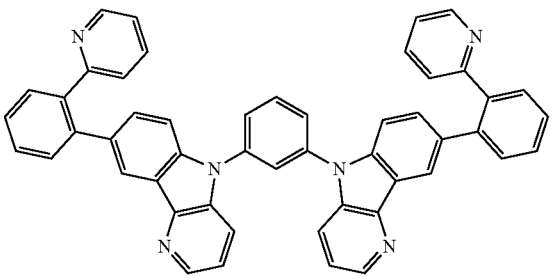

(2) Sealing (2.1) Preparation of Adhesive Composition

In toluene, 100 parts by mass of "Oppanol B50 (product of BASF SE, weight average molecular weight (Mw) =340000)" as a polyisobutylene-based resin (A), 30 parts by mass of "Nisseki Polybutene GradeHV-1900 (product of Nippon Oil Corporation, weight average molecular weight (Mw)=1900)" as a polybutene resin (B), 0.5 parts by mass of "Tinuvin 765 (product of BASF Japan Ltd., characterized in having a tertiary hindered amine group)" as a hindered amine light stabilizer (C), 0.5 parts by mass of Irganox 1010 (product of BASF Japan Ltd., tertiary butyl group attached to each of two β-position of the hindered phenol group) as a hindered phenolic antioxidant (D), and 50 parts by mass of "Eastotac H-100L Resin (Product of Eastman Chemical Company)" as a cyclic olefin-based polymer (E) were dissolved to prepare an adhesive composition having a solid content concentration of about 25 mass %.

(2.2) Production of Sealing Member

First, a polyethylene terephthalate film having a thickness of 50 μm was prepared to which an aluminum (Al) foil having a thickness of 100 μm was bonded, to be used as a sealing member. Next, the adhesive composition solution prepared as described above was applied on the aluminum foil surface (surface closer to the gas barrier layer) of the sealing member so that an adhesion layer to be formed after drying would have a thickness of 20 μm. The applied solution was then dried at 120° C. for 2 minutes to form the adhesion layer.

Next, a polyethylene terephthalate film having a thickness of 38 μm that had been treated by surface release treatment was prepared, and the release-treated surface of that polyethylene terephthalate film was attached, as a release sheet, to the adhesion layer formed, thus to produce a sealing member.

The sealing member produced in the above-described procedure was left to stand in a nitrogen atmosphere for 24 hours or more.

Thereafter, the release sheet was removed, and the resulting sealing member was laminated to the organic EL device 101 to cover the counter electrode of the organic EL device 101 using a vacuum laminator heated to 80° C. The laminated organic EL device was further heated at 120° C. for 30 minutes to complete the sealing of the organic EL device 101 by the sealing member.

<Production of Organic EL Devices 102 to 141>

The organic EL devices 102 to 141 were produced as in the production of the organic EL device 101 except that the transparent electrode 101 was replaced with the transparent electrodes 102 to 141, respectively.

<<Evaluation>>

The transparent electrodes 101 to 141 and the organic EL devices 101 to 141 produced were evaluated as follows.

Tables 1 and 2 show the evaluation results.

In Tables 1 and 2, "organic conductive layer 1" denotes an organic conductive layer formed in the same procedure as that used for the transparent electrode 102, and "organic conductive layer 2" denotes an organic conductive layer formed in the same procedure as that used for the transparent electrode 103.

<Evaluation of Adhesion Property>

The transparent electrodes in which the patterned metal thin wiring and the layers under the patterned metal thin wiring had been formed, but the second conductive layer had not yet been formed, were evaluated in terms of the strength of the patterned metal thin wiring using a tape peel test.

Specifically, pressing and removing an ST film (product of Panac, 0.1 N/25 mm) to and from the patterned metal thin wiring were repeated ten times, followed by visual inspection for release of the patterned metal thin wiring. The results were rated based on the evaluation criteria given below.

⊙: No change was observed after 5 cycles of pressing and removing.

○: No change was observed after 3 cycles of pressing and removing.

Δ: Release was observed after 1 cycle of pressing and removing, but 80% or more of the metal thin wiring remained.

X: Release was observed after 1 cycle of pressing and removing, and only less than 80% of the metal thin wiring remained.

The transparent electrodes in which the second conductive layer and the layers thereunder had been formed were also evaluated in terms of adhesion, and similar results were observed.

<Evaluation of Electrical Conductivity>

Surface resistance was measured for each of the transparent electrodes produced, using a resistivity meter (Loresta GP (model MCP-T610): product of Dialnstruments) according to JIS K 7194: 1994 to evaluate electrical conductivity. Preferred sheet resistance is 10 Ω/sq. or below, and if an organic electronic device having a large area is to be produced, a sheet resistance of 5 Ω/sq. or less is preferred.

<Evaluation of Luminescence Lifetime>

The organic EL devices produced were caused to continuously emit light at an initial luminance of 5000 cd/m² under a constant voltage condition, and the times for the luminance to reduce to half (half-time) were determined. The half-times of the organic EL devices 102 to 141 were represented in relative values with the value 100 denoting the half-time of the organic EL device 101. The results were rated based on the evaluation criteria given below.

A half-time (relative value) of 70 or higher is preferred, and a half-time of 90 or higher is more preferred.

⊙: greater than or equal to 90 and less than 200
◯: greater than or equal to 70 and less than 90
X: greater than or equal to 0 and less than 70

<Evaluation of Durability>

The organic EL devices produced were placed in a constant temperature bath at 80° C., and taken out from the constant temperature bath every 12 hours to apply a same voltage as the voltage initially applied at the time of 1000 cd/m² emission. The luminance at the time was measured and the time for the luminance to reduce to half was recorded as durability period for evaluation. The half-times of the organic EL devices 102 to 141 were represented in relative values with the value 100 denoting the half-time of the organic EL device 101. The results were rated based on the evaluation criteria given below.

A half-time (relative value) of 70 or higher is preferred, and a half-time of 90 or higher is more preferred.

⊙: greater than or equal to 90 and less than 200
◯: greater than or equal to 70 and less than 90
X: greater than or equal to 0 and less than 70

TABLE 1

| Transparent Electrode No. | Resin | Additive Material | Weight Average Molecular Weight (Mw) | Oxide Particle (Particle Size [nm]) | Thickness [nm] | Second Conductive Layer |
|---|---|---|---|---|---|---|
| 101 | A-TMM-3LM-N | Karenz MTBD 1 | — | — | 100 | Metal oxide layer |
| 102 | A-TMM-3LM-N | Karenz MTBD 1 | — | — | 100 | Organic conductive layer 1 |
| 103 | A-TMM-3LM-N | Karenz MTBD 1 | — | — | 100 | Organic conductive layer 2 |
| 104 | A-TMM-3LM-N | Karenz MTPE 1 | — | — | 100 | Metal oxide layer |
| 105 | A-TMM-3LM-N | Karenz MTNR 1 | — | — | 100 | Metal oxide layer |
| 106 | A-TMM-3LM-N | Polyment NK-350 | 100000 | — | 100 | Metal oxide layer |
| 107 | A-TMM-3LM-N | Exemplary compound SH-3 | — | — | 100 | Metal oxide layer |
| 108 | A-TMM-3LM-N | Exemplary compound SH-60 | — | — | 100 | Metal oxide layer |
| 109 | A-TMM-3LM-N | Exemplary compound SE-2 | — | — | 100 | Metal oxide layer |
| 110 | A-TMM-3LM-N | Exemplary compound SE-10 | — | — | 100 | Metal oxide layer |
| 111 | A-TMM-3LM-N | Exemplary compound PE-1 | 68000 | — | 100 | Metal oxide layer |
| 112 | A-TMM-3LM-N | Exemplary compound PE-3 | 76000 | — | 100 | Metal oxide layer |
| 113 | A-TMM-3LM-N | Exemplary compound PA-1 | 59000 | — | 100 | Metal oxide layer |
| 114 | A-TMM-3LM-N | Exemplary compound PA-2 | 52000 | — | 100 | Metal oxide layer |
| 115 | A-TMM-3LM-N | Exemplary compound PE-4 | 61000 | — | 100 | Metal oxide layer |
| 116 | A-TMM-3LM-N | Exemplary compound PE-7 | 95000 | — | 100 | Metal oxide layer |
| 117 | A-TMM-3LM-N | Exemplary compound PA-4 | 56000 | — | 100 | Metal oxide layer |
| 118 | A-TMM-3LM-N | Exemplary compound PA-10 | 57000 | — | 100 | Metal oxide layer |
| 119 | A-TMM-3LM-N | Exemplary compound PA-12 | 62000 | — | 100 | Metal oxide layer |
| 120 | A-TMM-3LM-N | Comparative compound 1 | — | — | 100 | Metal oxide layer |
| 121 | A-TMM-3LM-N | Comparative compound 2 | — | — | 100 | Metal oxide layer |
| 122 | A-TMM-3LM-N | Comparative compound 3 | — | — | 100 | Metal oxide layer |
| 123 | A-TMM-3LM-N | Comparative compound 4 | 52000 | — | 100 | Metal oxide layer |

| Transparent Electrode No. | Adhesion Property | Conductivity [Ω/sq.] | Luminescence Lifetime | Durability | Remarks |
|---|---|---|---|---|---|
| 101 | ◯ | 5 | ⊙ | ◯ | Inventive |
| 102 | ◯ | 5 | ◯ | ◯ | Inventive |
| 103 | ◯ | 4 | ◯ | ◯ | Inventive |
| 104 | ⊙ | 3 | ⊙ | ◯ | Inventive |
| 105 | ⊙ | 3 | ⊙ | ◯ | Inventive |
| 106 | ⊙ | 4 | ⊙ | ◯ | Inventive |
| 107 | ◯ | 5 | ⊙ | ◯ | Inventive |
| 108 | ◯ | 4 | ⊙ | ◯ | Inventive |
| 109 | ◯ | 5 | ⊙ | ◯ | Inventive |
| 110 | ◯ | 4 | ⊙ | ◯ | Inventive |
| 111 | ◯ | 4 | ⊙ | ◯ | Inventive |
| 112 | ◯ | 4 | ⊙ | ◯ | Inventive |
| 113 | ◯ | 4 | ⊙ | ◯ | Inventive |
| 114 | ◯ | 4 | ⊙ | ◯ | Inventive |
| 115 | ◯ | 4 | ⊙ | ◯ | Inventive |
| 116 | ◯ | 4 | ⊙ | ◯ | Inventive |
| 117 | ◯ | 4 | ⊙ | ◯ | Inventive |
| 118 | ◯ | 4 | ⊙ | ◯ | Inventive |
| 119 | ◯ | 4 | ⊙ | ◯ | Inventive |

TABLE 1-continued

| | | | | | |
|---|---|---|---|---|---|
| 120 | X | 10 | X | X | Comparative |
| 121 | X | 20 | X | X | Comparative |
| 122 | X | 13 | X | X | Comparative |
| 123 | X | 18 | X | X | Comparative |

TABLE 2

| Transparent Electrode No. | Underlying Layer | | | | | |
|---|---|---|---|---|---|---|
| | Resin | Additive Material | Weight Average Molecular Weight (Mw) | Oxide Particle (Particle Size [nm]) | Thickness [nm] | Second Conductive Layer |
| 124 | A-TMM-3LM-N | Karenz MTNR 1 | — | — | 50 | Metal oxide layer |
| 125 | A-TMM-3LM-N | Karenz MTNR 1 | — | — | 20 | Metal oxide layer |
| 126 | A-TMM-3LM-N | Karenz MTNR 1 | — | — | 10 | Metal oxide layer |
| 127 | A-TMM-3LM-N | Karenz MTNR 1 | — | $T_iO_2$ (10) | 50 | Metal oxide layer |
| 128 | A-TMM-3LM-N | Karenz MTNR 1 | — | $T_iO_2$ (80) | 100 | Metal oxide layer |
| 129 | A-TMM-3LM-N | Karenz MTNR 1 | — | $Z_nO_2$ (100) | 100 | Metal oxide layer |
| 130 | A-TMM-3LM-N | Karenz MTNR 1 | — | $T_iO_2$ (10) | 50 | Organic conductive layer 1 |
| 131 | A-TMM-3LM-N | Karenz MTNR 1 | — | $T_iO_2$ (10) | 50 | Organic conductive layer 2 |
| 132 | TYT series | Karenz MTNR 1 | — | $T_iO_2$ | 50 | Metal oxide layer |
| 133 | UV-RH-38 | Polyment NK-350 | 100000 | — | 50 | Metal oxide layer |
| 134 | A-TMM-3LM-N | Karenz MTNR 1 | — | — | 300 | Metal oxide layer |
| 135 | A-TMM-3LM-N | Karenz MTNR 1 | — | $T_iO_2$ (250) | 300 | Metal oxide layer |
| 136 | — | — | — | — | — | Metal oxide layer |
| 137 | A-TMM-3LM-N | — | — | — | 100 | Metal oxide layer |
| 138 | A-TMM-3LM-N | — | — | $T_iO_2$ (10) | 100 | Metal oxide layer |
| 139 | — | — | — | — | — | Organic conductive layer 1 |
| 140 | A-TMM-3LM-N | — | — | — | 100 | Organic conductive layer 1 |
| 141 | A-TMM-3LM-N | — | — | $T_iO_2$ (10) | 100 | Organic conductive layer 2 |

| Transparent Electrode No. | Adhesion Property | Conductivity [Ω/sq.] | Luminescence Lifetime | Durability | Remarks |
|---|---|---|---|---|---|
| 124 | ○ | 3 | ◎ | ◎ | Inventive |
| 125 | ○ | 3 | ◎ | ◎ | Inventive |
| 126 | ○ | 3 | ◎ | ◎ | Inventive |
| 127 | ◎ | 3 | ◎ | ◎ | Inventive |
| 128 | ◎ | 3 | ◎ | ◎ | Inventive |
| 129 | ◎ | 3 | ◎ | ◎ | Inventive |
| 130 | ○ | 5 | ○ | ○ | Inventive |
| 131 | ○ | 4 | ○ | ○ | Inventive |
| 132 | ○ | 3 | ◎ | ◎ | Inventive |
| 133 | ○ | 3 | ◎ | ◎ | Inventive |
| 134 | ○ | 5 | ◎ | ○ | Inventive |
| 135 | ○ | 8 | ◎ | ○ | Inventive |
| 136 | X | 10 | ○ | ○ | Comparative |
| 137 | X | 11 | ○ | ○ | Comparative |
| 138 | X | 8 | ○ | ○ | Comparative |
| 139 | X | 10 | ○ | X | Comparative |
| 140 | X | 11 | ○ | X | Comparative |
| 141 | X | 8 | ○ | X | Comparative |

<Summary>

As can be seen from Tables 1 and 2, the transparent electrodes and the organic EL devices including the transparent electrodes of the present invention provide higher adhesion to the substrate and to the patterned metal thin wiring (conductive layer) as well as higher electrical conductivity, longer luminescence lifetime, and longer durability than the transparent electrodes and the organic EL devices including the transparent electrodes of Comparative Examples.

The results described above demonstrate that an underlying layer containing at least one selected from a compound having a thiol group and a poly(meth)acrylate and a poly(meth)acrylamide each having an aminoethyl group is effective in improving adhesion between the substrate and the conductive layer.

Example 2

A particle-containing layer was formed over the surface opposite the gas barrier layer-formed surface before the formation of the gas barrier layer as follows in the process of production of the transparent electrodes 101 to 141 of Example 1.

Evaluation of adhesion property, electrical conductivity, luminescence lifetime, and durability, similar to the evaluation in Example 1, has produced similar results to Example 1.

(Formation of Particle-Containing Layer)

(1) Preparation of Colloidal Silica-Containing Monomer

A quantity of 30 parts by mass of 2-methacryloyloxyethyl isocyanate (MOI, molecular weight: 155, product of Showa Denko K. K.) and a quantity of 0.1 parts by mass of di-n-butyltin dilaurate (DBTDL) as a catalyst were added to 130 parts by mass of colloidal silica ($SiO_2$ component: 30 mass %, average particle size: 20 nm, product of Nissan Chemical Industries, Ltd.) made dispersed using ethyl acetate as a solvent. The resulting mixture was then stirred at room temperature (25° C.) for 24 hours. Infrared spectroscopy (IR) was used to confirm reaction situation of the isocyanate group, followed by removal of ethyl acetate serving as a solvent by an evaporator to obtain colloidal silica-containing monomer.

(2) Preparation of Particle-Containing Layer Preparation Liquid

A quantity of 5 parts by mass of methyl ethyl ketone solution of $Li^+/CF_3SO_3^-$ (non-volatile component: 50 mass %, product of Sanko Chemical Industry Co., Ltd.) was blended with 100 parts by mass of the colloidal silica-containing monomer produced above (non-volatile component: 36 mass %), and the resulting mixture was stirred. As an initiator, 1 part by mass of Irgacure 907 (product of BASF Japan Ltd.) was added to prepare a particle-containing layer preparation liquid.

(3) Formation of Particle-Containing Layer

Next, the particle-containing layer preparation liquid prepared was applied over the resin substrate to have a thickness after curing of 10 μm, and was dried. After this, UV irradiation treatment was performed using an 80 W/cm mercury lamp under a condition of 300 mJ to form a particle-containing layer.

INDUSTRIAL APPLICABILITY

The present invention can be particularly suitably applied to a transparent electrode having excellent adhesion between the substrate and the conductive layer, and to an organic electronic device including such transparent electrode.

REFERENCE SIGNS LIST

- 10 Transparent electrode
- 11 Substrate
- 12 Underlying layer
- 13 Conductive layer
  - 13*a* Patterned metal thin wiring (first conductive layer)
  - 13*b* Metal oxide layer or organic conductive layer (second conductive layer)
- 14 Gas barrier layer
- 15 Particle-containing layer
- 20 organic EL device
- 21 Light emitting unit
- 22 Counter electrode

The invention claimed is:

1. A transparent electrode comprising, in a sequentially stacked manner: a substrate; an underlying layer; and an electrically conductive layer, wherein the underlying layer contains at least one selected from the group consisting of a compound having a thiol group, a poly(meth)acrylate having an aminoethyl group, and a poly(meth)acrylamide having an aminoethyl group, the electrically conductive layer includes a first electrically conductive layer formed of a metal thin wire having a specific pattern, and a second electrically conductive layer formed of a metal oxide, the compound having the thiol group is substituted with an amine, ester, carboxylic acid, halogen or an extra thiol group, and the transparent electrode has a sheet resistance of 5 Ω/sq. or less.

2. The transparent electrode according to claim 1, wherein the compound having the thiol group is a condensation product of a compound having a structure represented by general formula (I) reacted with a monovalent or polyvalent alcohol, or reacted with an amine,

[Chemical Formula 1]

General Formula (I)

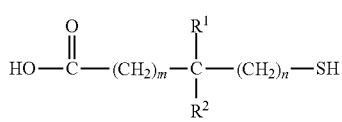

wherein, $R^1$ and $R^2$ each independently represent a hydrogen atom or an alkyl group having 1 to 10 carbon atoms, where at least one of $R^1$ and $R^2$ is an alkyl group having 1 to 10 carbon atoms, m is an integer from 0 to 2 inclusive, and n is 0 or 1.

3. The transparent electrode according to claim 1, wherein the poly(meth)acrylate having an aminoethyl group and the poly(meth)acrylamide having an aminoethyl group, each have a partial structure represented by general formula (II),

[Chemical Formula 2]

General Formula (II)

wherein, $R^3$ represents a hydrogen atom or a methyl group, Q represents —C(=O)O— or —C(=O)NRa—, where Ra represents a hydrogen atom or an alkyl group, and A represents a substituted or unsubstituted alkylene group, or —(CH$_2$CHRbNH)$_x$—CH$_2$CHRb—, where Rb represents a hydrogen atom or an alkyl group, and x represents an average number of repeating units, being a positive integer.

4. The transparent electrode according to claim 1, wherein the underlying layer contains a particle having a particle size in a range from 5 to 100 nm, the particle being formed of a titanium oxide or a zirconium oxide.

5. The transparent electrode according to claim 1, wherein the underlying layer has a thickness in a range from 10 to 100 nm.

6. An organic electronic device comprising the transparent electrode according to claim 1.

7. The organic electronic device according to claim 6, wherein the organic electronic device is an organic electroluminescent device.

8. The transparent electrode according to claim 2, wherein the underlying layer contains a particle having a particle size in a range from 5 to 100 nm, the particle being formed of a titanium oxide or a zirconium oxide.

9. The transparent electrode according to claim 2, wherein the underlying layer has a thickness in a range from 10 to 100 nm.

10. An organic electronic device comprising the transparent electrode according to claim 2.

11. The transparent electrode according to claim 3, wherein the underlying layer contains a particle having a particle size in a range from 5 to 100 nm, the particle being formed of a titanium oxide or a zirconium oxide.

12. The transparent electrode according to claim 3, wherein the underlying layer has a thickness in a range from 10 to 100 nm.

13. An organic electronic device comprising the transparent electrode according to claim 3.

14. The transparent electrode according to claim 4, wherein the underlying layer has a thickness in a range from 10 to 100 nm.

* * * * *